US012575104B2

(12) United States Patent
Ohaga et al.

(10) Patent No.: US 12,575,104 B2
(45) Date of Patent: Mar. 10, 2026

(54) THREE-DIMENSIONAL MEMORY DEVICE CONTAINING DOPED SOURCE-CHANNEL INTERFACE STRUCTURE AND METHOD OF MAKING THE SAME

(71) Applicant: SANDISK TECHNOLOGIES LLC, Addison, TX (US)

(72) Inventors: Motoo Ohaga, Yokkaichi (JP); Tadashi Nakamura, Yokkaichi (JP); Takashi Yuda, Yokkaichi (JP); Nobuyuki Fujimura, Yokkaichi (JP); Hiroyuki Ogawa, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 364 days.

(21) Appl. No.: 18/351,181

(22) Filed: Jul. 12, 2023

(65) Prior Publication Data

US 2024/0147723 A1 May 2, 2024

Related U.S. Application Data

(60) Provisional application No. 63/381,354, filed on Oct. 28, 2022.

(51) Int. Cl.
H10B 43/27 (2023.01)
G11C 16/04 (2006.01)
(Continued)

(52) U.S. Cl.
CPC ......... H10B 43/27 (2023.02); G11C 16/0483 (2013.01); H01L 23/5226 (2013.01);
(Continued)

(58) Field of Classification Search
CPC ........ H10B 43/27; H10B 41/10; H10B 41/27; H10B 41/35; H10B 43/10; H10B 43/35;
(Continued)

(56) References Cited

U.S. PATENT DOCUMENTS 9,799,670 B2 10/2017 Nishikawa et al.
9,831,266 B2 11/2017 Kai et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.
(Continued)

*Primary Examiner* — Allison Bernstein
(74) *Attorney, Agent, or Firm* — THE MARBURY LAW GROUP PLLC

(57) ABSTRACT

A memory device includes source-level material layers including a source contact layer, an alternating stack of insulating layers and electrically conductive layers located over the source-level material layers, a memory opening vertically extending through the alternating stack and the source contact layer, and a memory opening fill structure located in the memory opening and including a vertical semiconductor channel including an intrinsic or first conductivity type semiconductor material, a memory film surrounding the vertical semiconductor channel, and a conical source pedestal in contact with the source contact layer and in contact with a bottom surface of the vertical semiconductor channel, such that at least portion of the conical source pedestal includes a second conductivity type semiconductor material.

20 Claims, 55 Drawing Sheets

(51) Int. Cl.

| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.

CPC ......... *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search

CPC . H10B 43/50; G11C 16/0483; H01L 23/5226; H01L 23/5283

See application file for complete search history.

(56) References Cited

U.S. PATENT DOCUMENTS

| | | | |
|---|---|---|---|
| 9,876,031 B1 | 1/2018 | Shimizu et al. |
| 9,917,100 B2 | 3/2018 | Zhang et al. |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 10,199,359 B1 | 2/2019 | Sakakibara et al. |
| 10,224,340 B2 | 3/2019 | Hada et al. |
| 10,224,373 B2 | 3/2019 | Sel et al. |
| 10,290,645 B2 | 5/2019 | Nakatsuji et al. |
| 10,290,650 B1 | 5/2019 | Iwai |
| 10,354,956 B1 | 7/2019 | Yu et al. |
| 10,381,373 B2 | 8/2019 | Okizumi et al. |
| 10,381,443 B2 | 8/2019 | Matsumoto et al. |
| 10,438,964 B2 | 10/2019 | Makala et al. |
| 10,559,582 B2 | 2/2020 | Nishikawa et al. |
| 10,629,613 B1 | 4/2020 | Shimizu et al. |
| 10,720,445 B1 | 7/2020 | Shimizu et al. |
| 10,748,925 B1 | 8/2020 | Tsutsumi et al. |
| 10,797,070 B2 | 10/2020 | Mushiga et al. |
| 10,804,291 B1 | 10/2020 | Rajashekhar et al. |
| 10,854,627 B1 | 12/2020 | Moriyama et al. |
| 10,861,869 B2 | 12/2020 | Nakamura et al. |
| 10,868,025 B2 | 12/2020 | Zhou et al. |
| 10,903,222 B2 | 1/2021 | Sakakibara et al. |
| 10,916,556 B1 | 2/2021 | Sakakibara et al. |
| 10,923,496 B2 | 2/2021 | Mushiga et al. |
| 10,923,498 B2 | 2/2021 | Otsu et al. |
| 10,950,700 B2 * | 3/2021 | Choi .................... H10D 64/252 |
| 10,957,648 B2 | 3/2021 | Hsu et al. |
| 10,964,715 B2 | 3/2021 | Kakazu et al. |
| 11,121,153 B1 | 9/2021 | Obu et al. |
| 11,127,759 B2 | 9/2021 | Obu et al. |
| 11,195,781 B2 | 12/2021 | Okina et al. |
| 11,201,107 B2 | 12/2021 | Okina et al. |
| 11,239,253 B2 | 2/2022 | Rajashekhar et al. |
| 11,244,953 B2 | 2/2022 | Kanakamedala et al. |
| 11,302,713 B2 | 4/2022 | Baraskar et al. |
| 11,322,509 B2 | 5/2022 | Baraskar et al. |
| 11,342,347 B2 | 5/2022 | Hinoue |
| 11,521,984 B2 | 12/2022 | Sharangpani et al. |
| 11,552,100 B2 | 1/2023 | Cui et al. |
| 11,600,634 B2 | 3/2023 | Cui et al. |
| 2018/0122904 A1 | 5/2018 | Matsumoto et al. |
| 2018/0261671 A1 | 9/2018 | Matsumoto et al. |
| 2018/0366486 A1 | 12/2018 | Hada et al. |
| 2018/0366487 A1 | 12/2018 | Okizumi et al. |
| 2020/0335487 A1 | 10/2020 | Rajashekhar et al. |
| 2020/0357815 A1 | 11/2020 | Iwai et al. |
| 2020/0388688 A1 | 12/2020 | Baraskar et al. |
| 2021/0265372 A1 | 8/2021 | Kanakamedala et al. |
| 2021/0375910 A1 | 12/2021 | Baraskar et al. |
| 2021/0408035 A1 | 12/2021 | Sato et al. |
| 2022/0045091 A1 | 2/2022 | Cui et al. |
| 2022/0336484 A1 | 10/2022 | Iwai et al. |
| 2022/0352093 A1 * | 11/2022 | Yamada ................ H10B 51/20 |

OTHER PUBLICATIONS

U.S. Appl. No. 17/355,955, filed Jun. 23, 2021, SanDisk Technologies LLC.

U.S. Appl. No. 17/462,446, filed Aug. 31, 2021, SanDisk Technologies LLC.

U.S. Appl. No. 17/583,456, filed Jan. 25, 2022, SanDisk Technologies LLC.

U.S. Appl. No. 17/655,272, filed Mar. 17, 2022, SanDisk Technologies LLC.

U.S. Appl. No. 17/715,549, filed Apr. 7, 2022, SanDisk Technologies LLC.

U.S. Appl. No. 17/715,662, filed Apr. 7, 2022, SanDisk Technologies LLC.

U.S. Appl. No. 17/934,676, filed Sep. 23, 2022, SanDisk Technologies LLC.

U.S. Appl. No. 17/934,685, filed Sep. 23, 2022, SanDisk Technologies LLC.

U.S. Appl. No. 18/348,727, filed Jul. 7, 2023, SanDisk Technologies LLC.

* cited by examiner

THREE-DIMENSIONAL MEMORY DEVICE CONTAINING DOPED SOURCE-CHANNEL INTERFACE STRUCTURE AND METHOD OF MAKING THE SAME

FIELD

The present disclosure relates generally to the field of semiconductor devices, and particularly to a three-dimensional memory device including doped source-channel interface structures and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device comprises source-level material layers located over a substrate and comprising a lower source-level semiconductor layer comprising a second conductivity type semiconductor material, an upper source-level semiconductor layer comprising the second conductivity type semiconductor material, and a source contact layer located between the upper and lower source-level semiconductor layers and comprising the second conductivity type semiconductor material, an alternating stack of insulating layers and electrically conductive layers located over the source-level material layers, a memory opening vertically extending through the alternating stack, the upper source-level semiconductor layer, and the source contact layer and into an upper portion of the lower source-level semiconductor layer, and a memory opening fill structure located in the memory opening. The memory opening fill structure comprises a vertical semiconductor channel comprising an intrinsic or first conductivity type semiconductor material, a memory film surrounding the vertical semiconductor channel, and a conical source pedestal in contact with the source contact layer and in contact with a bottom surface of the vertical semiconductor channel, wherein at least portion of the conical source pedestal comprises the second conductivity type semiconductor material.

According to another aspect of the present disclosure, a method of forming a memory device comprises forming in-process source-level material layers located over a substrate, the in-process source-level material layers comprising a lower source-level semiconductor layer comprising a second conductivity type semiconductor material, an upper source-level semiconductor layer comprising the second conductivity type semiconductor material, and a source-level sacrificial layer, forming an alternating stack of insulating layers and spacer material layers over the in-process source-level material layers, wherein the spacer material layers are formed as, or are subsequently replaced with, electrically conductive layers, forming a memory opening vertically extending through the alternating stack, the upper source-level semiconductor layer, and the source contact layer and into an upper portion of the lower source-level semiconductor layer, forming a memory opening fill structure in the memory opening, wherein the memory opening fill structure comprises a vertical semiconductor channel comprising an intrinsic or first conductivity type semiconductor material, a memory film surrounding the vertical semiconductor channel, and a conical source pedestal in contact with the source contact layer and in contact with a bottom surface of the vertical semiconductor channel, wherein at least portion of the conical source pedestal comprises the second conductivity type semiconductor material, and replacing the sacrificial source-level layer and a portion of the memory film with a source layer comprising the second conductivity type semiconductor material such that the source contact layer contacts the conical source pedestal.

22A. The hinged vertical plane A-A' corresponds to the plane of the vertical cross-sectional view of FIG. 22A.

Figure 23A:
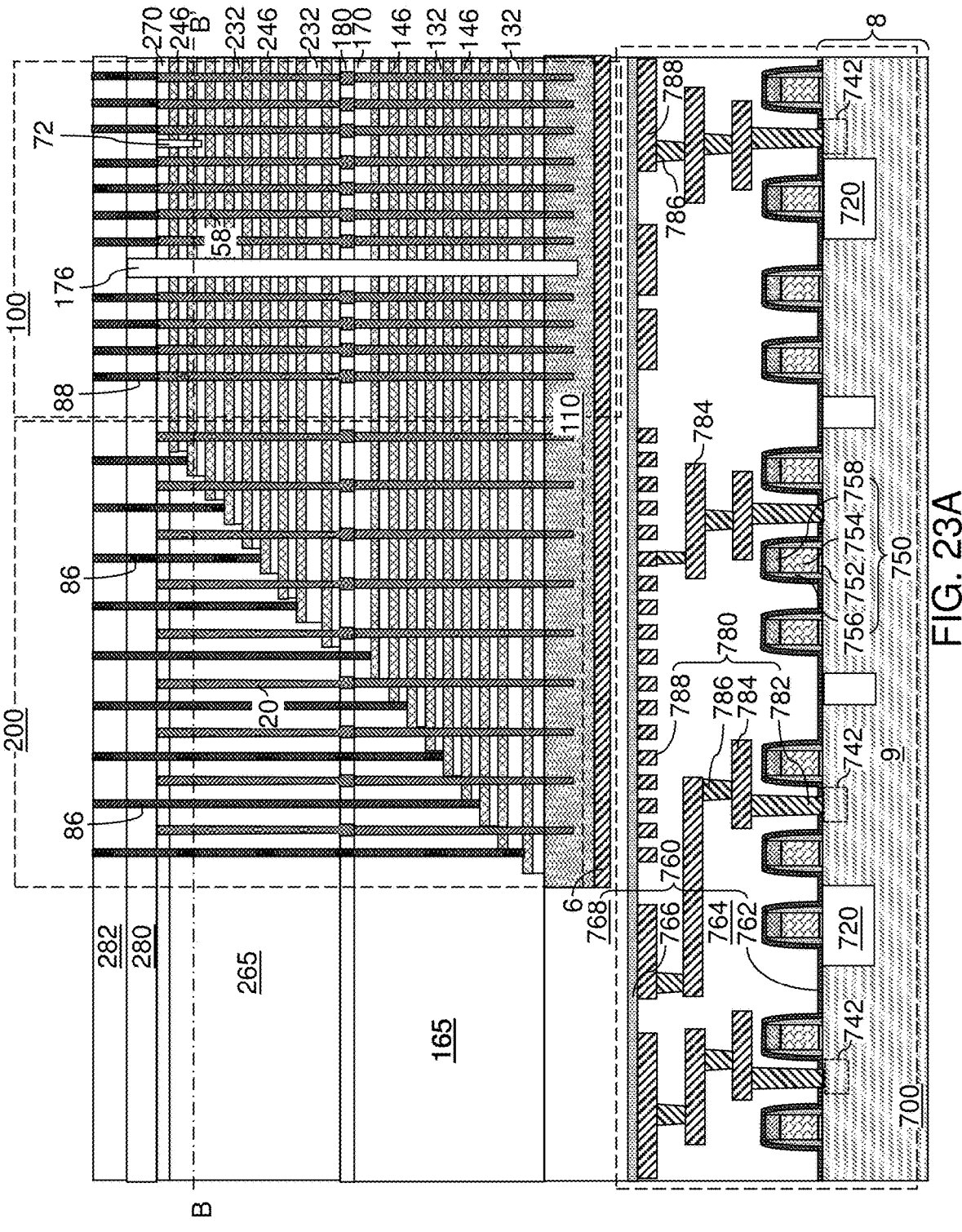

FIG. 23A is a vertical cross-sectional view of the exemplary structure after formation of a second contact-level dielectric layer and various contact via structures according to an embodiment of the present disclosure.

Figure 23B:
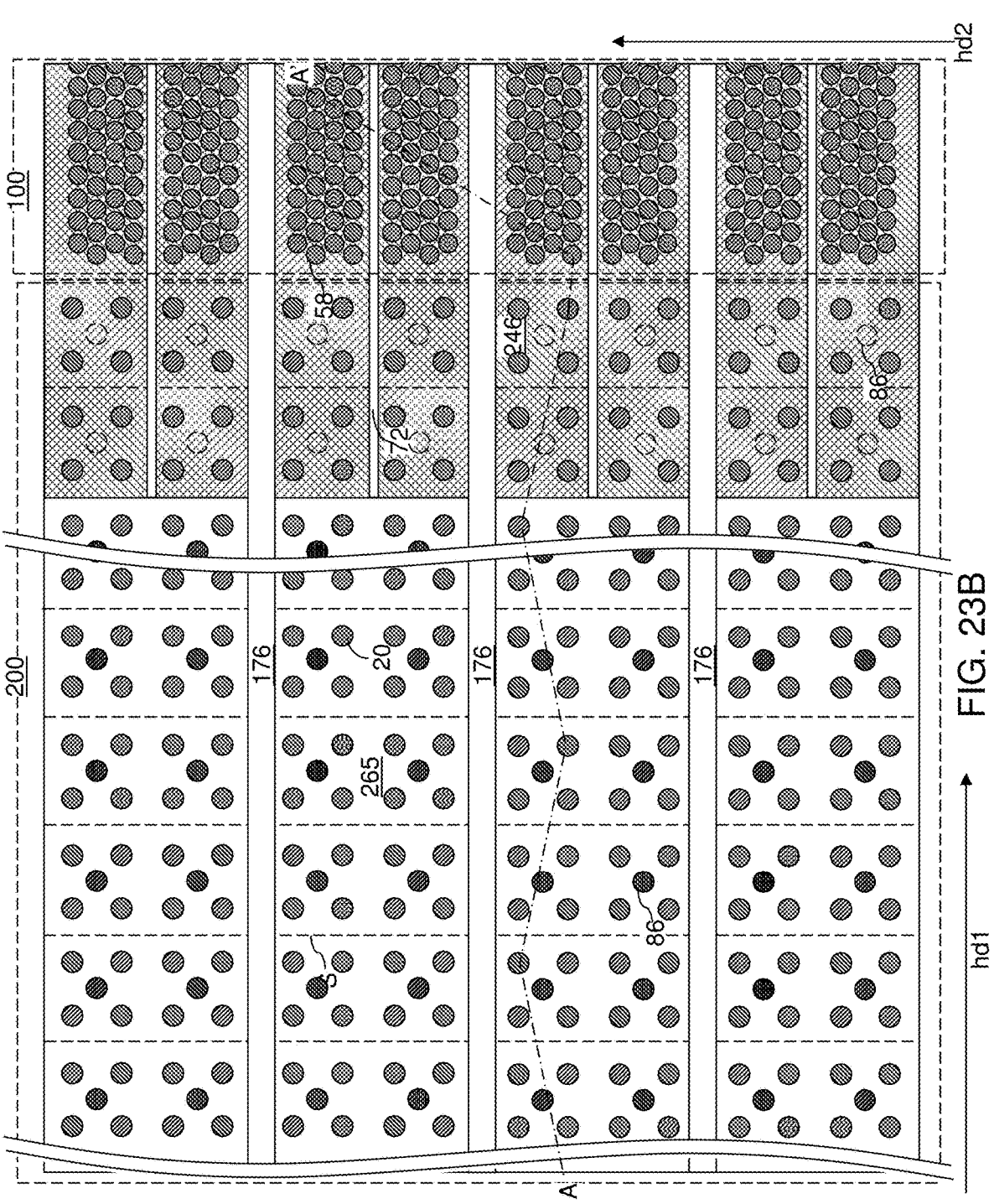

FIG. 23B is a horizontal cross-sectional view of the exemplary structure along the vertical plane B-B' of FIG. 23A. The hinged vertical plane A-A' corresponds to the plane of the vertical cross-sectional view of FIG. 23A.

Figure 24:
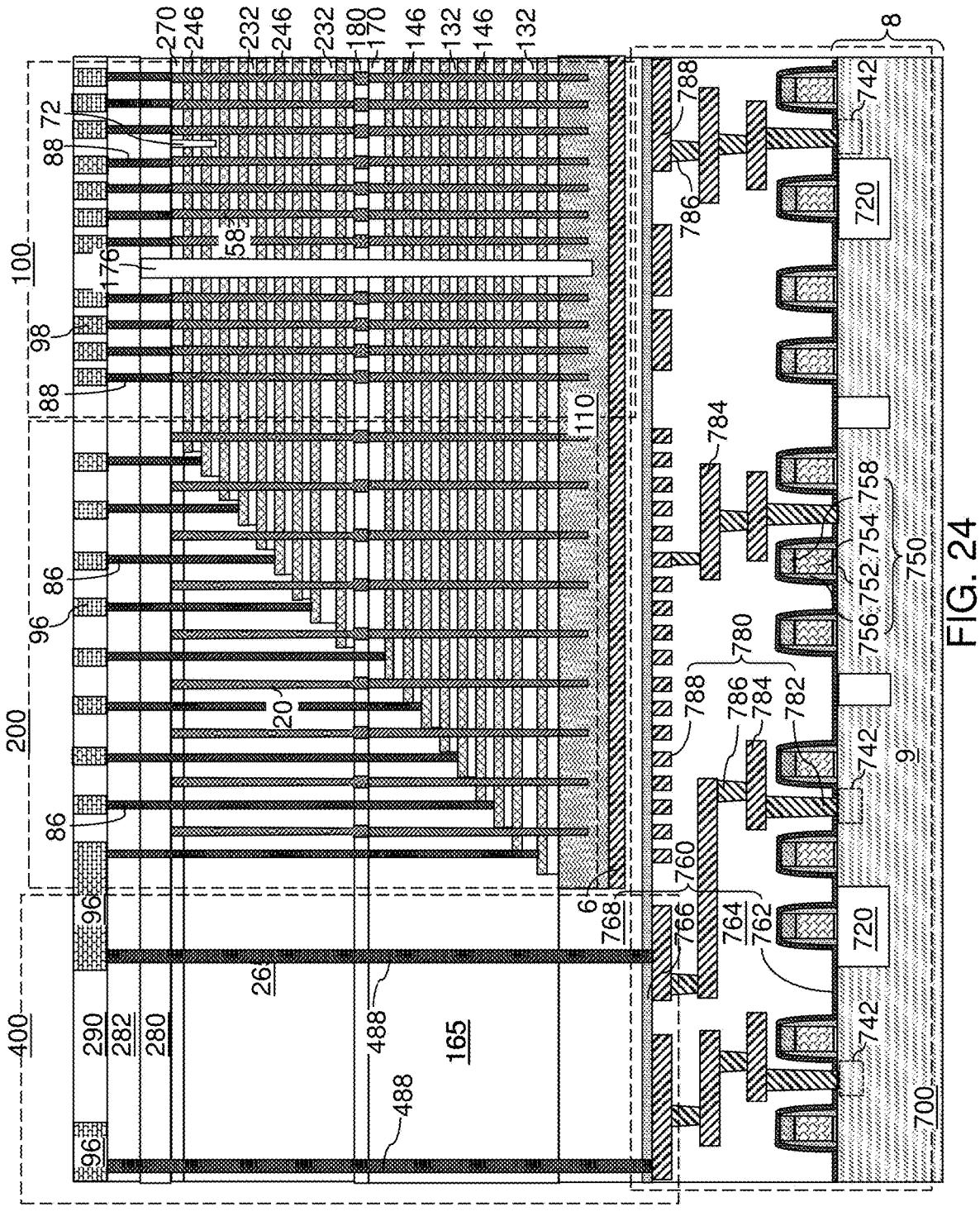

FIG. 24 is a vertical cross-sectional view of the exemplary structure after formation of through-memory-level via structures and upper metal line structures according to an embodiment of the present disclosure.

FIGS. 25A-25G are vertical cross-sectional views of various configuration of the memory opening fill structure at the processing steps of FIG. 24.

DETAILED DESCRIPTION

Embodiments of the present disclosure provide a three-dimensional memory device including doped semiconductor source-channel interface structures and methods of manufacturing the same, the various aspects of which are described herein in detail. The embodiments of the present disclosure may be used to form three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1A:
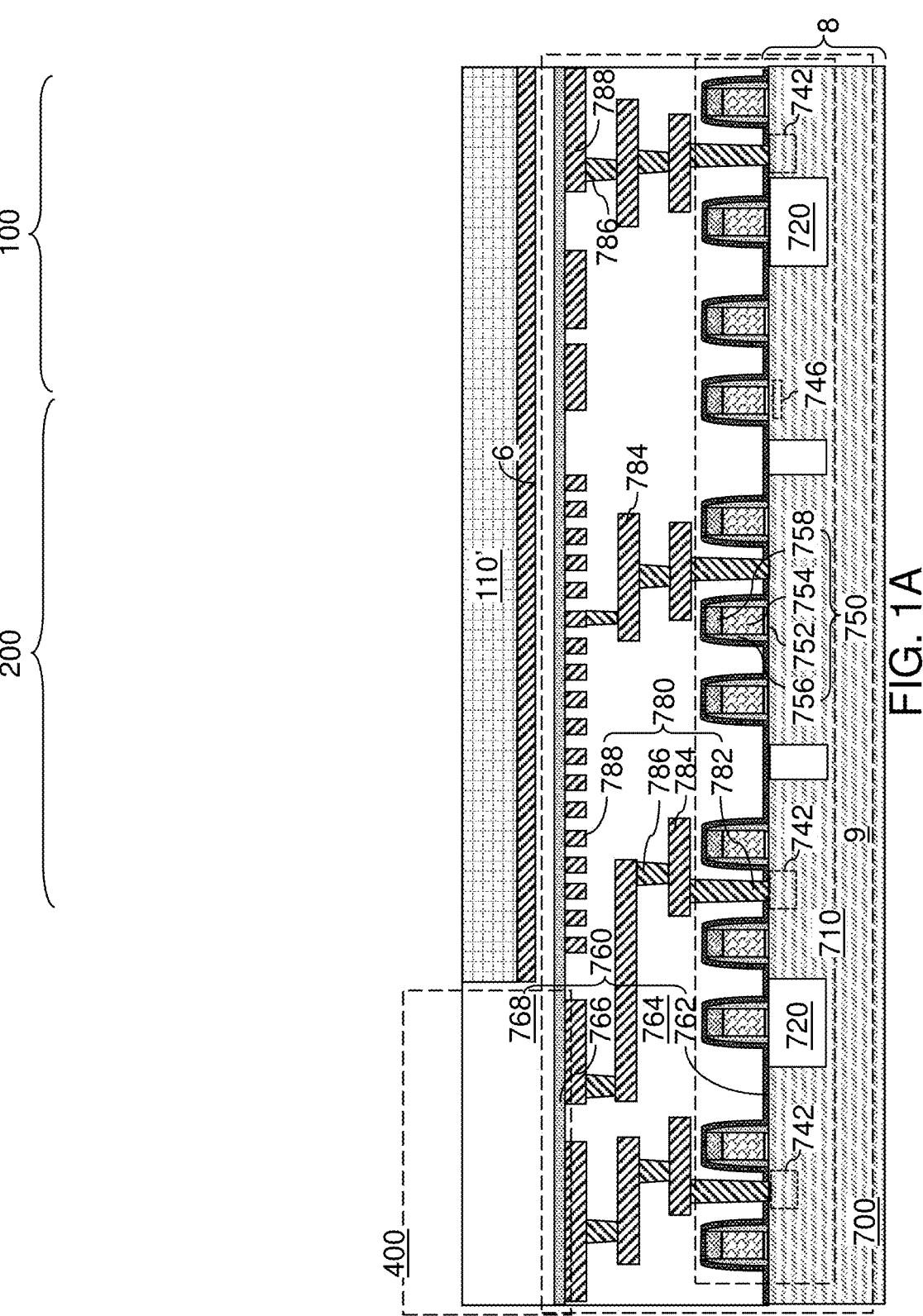
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.
Figure 1B:
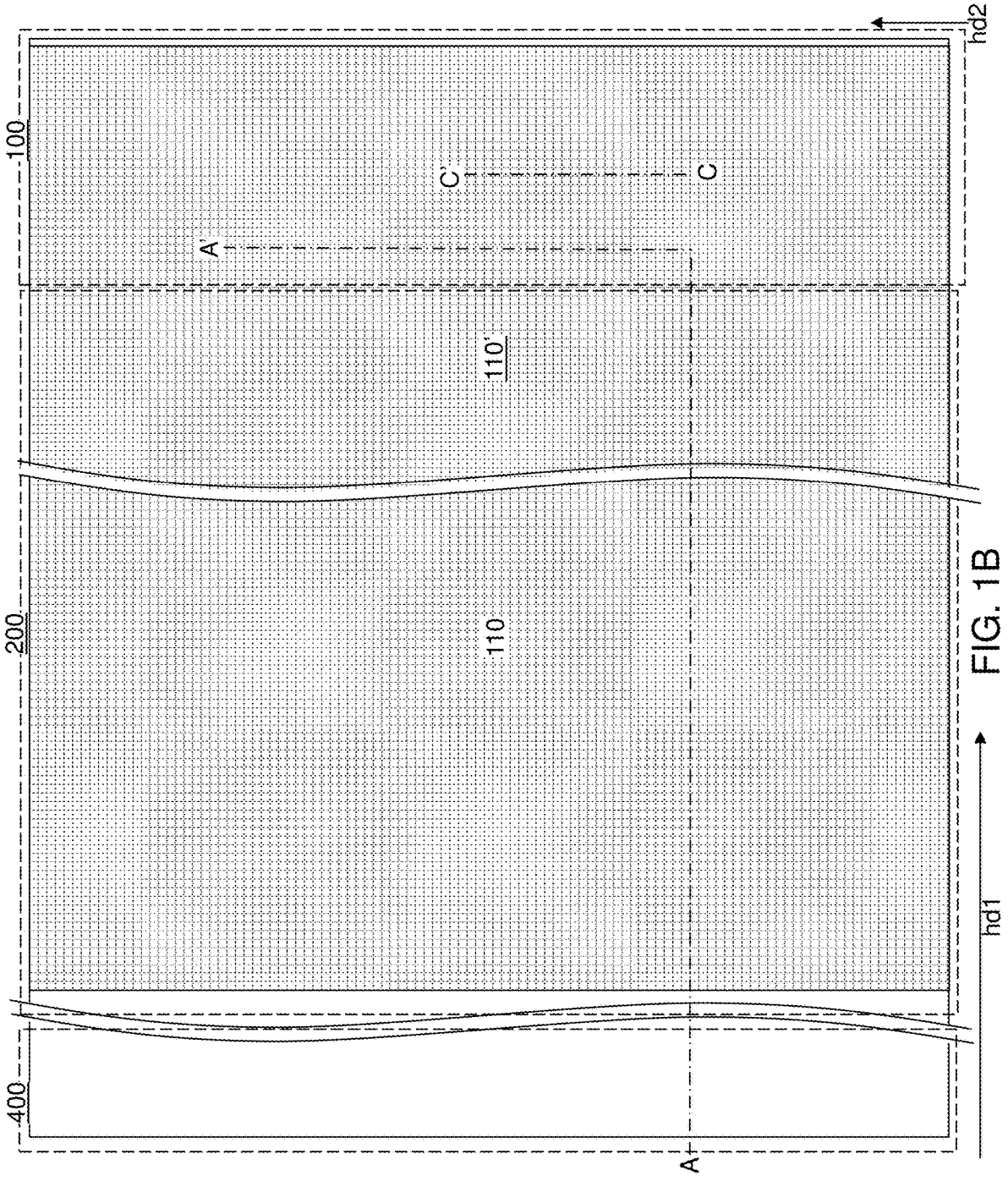
FIG. 1B is a top-down view of the exemplary structure of FIG. 1A. The hinged vertical plane A-A' is the plane of the vertical cross-sectional view of FIG. 1A.
Figure 1C:
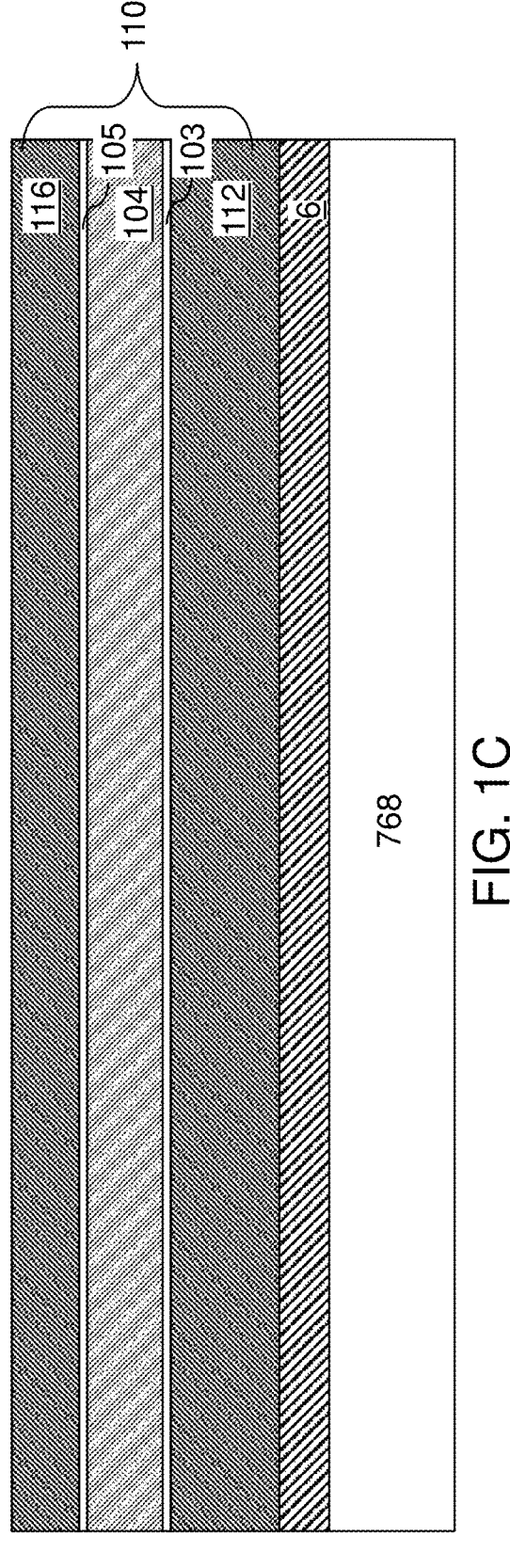
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The lower source-level semiconductor layer 112 comprises a first semiconductor material, and the upper source-level semiconductor layer 116 comprises a second semiconductor material. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer

104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures (50, 60) are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures (50, 60) is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
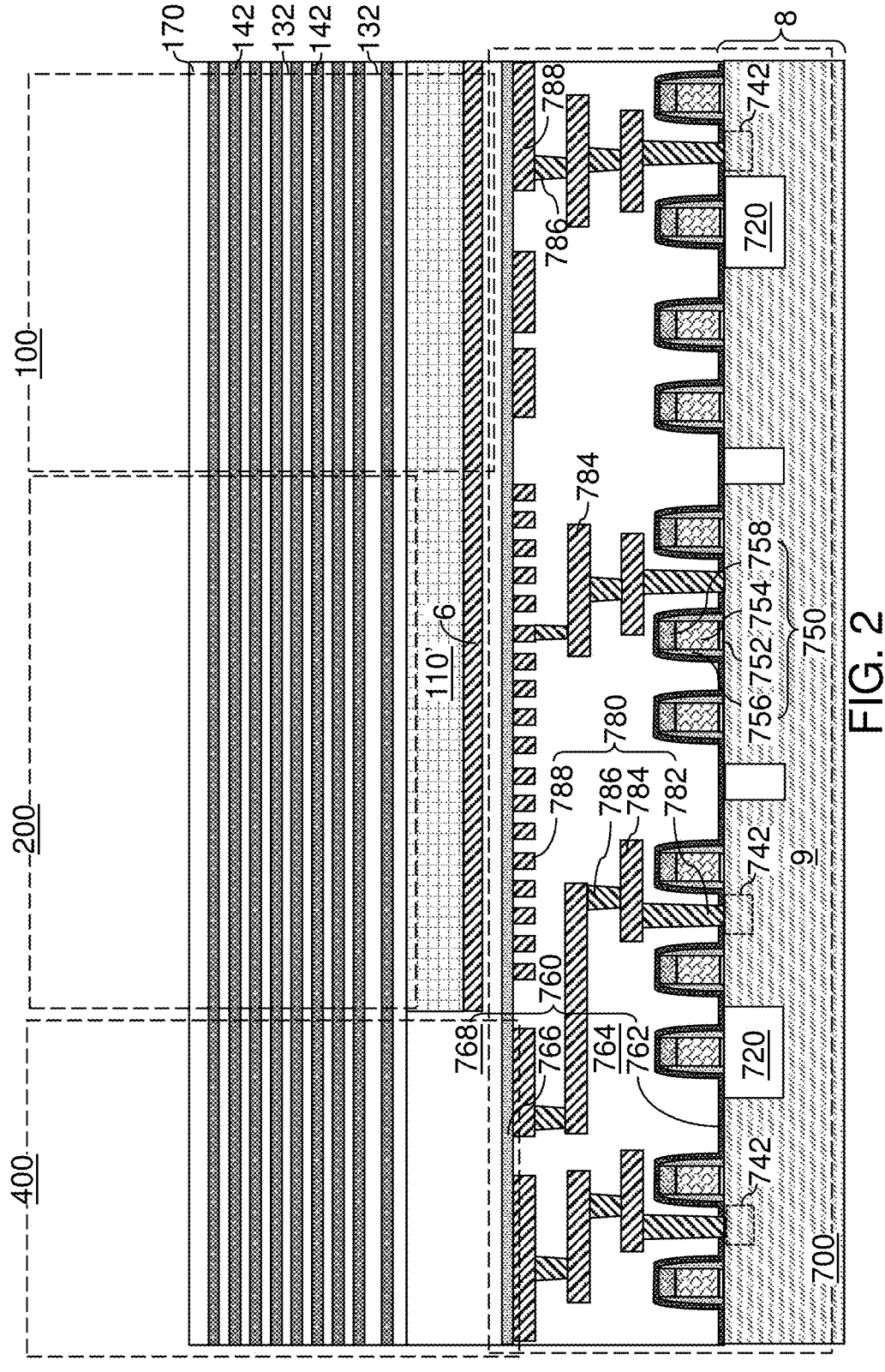
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
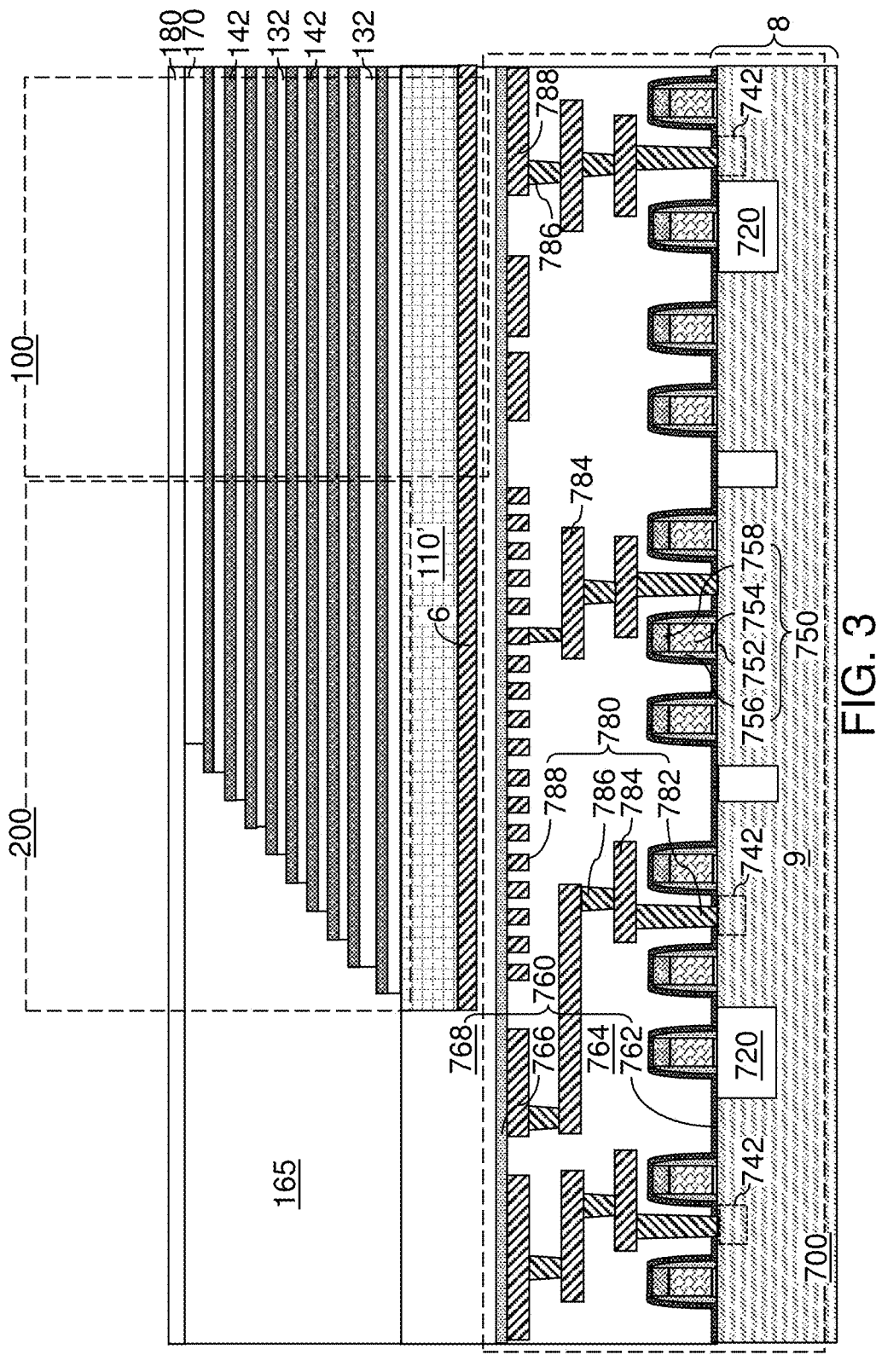
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
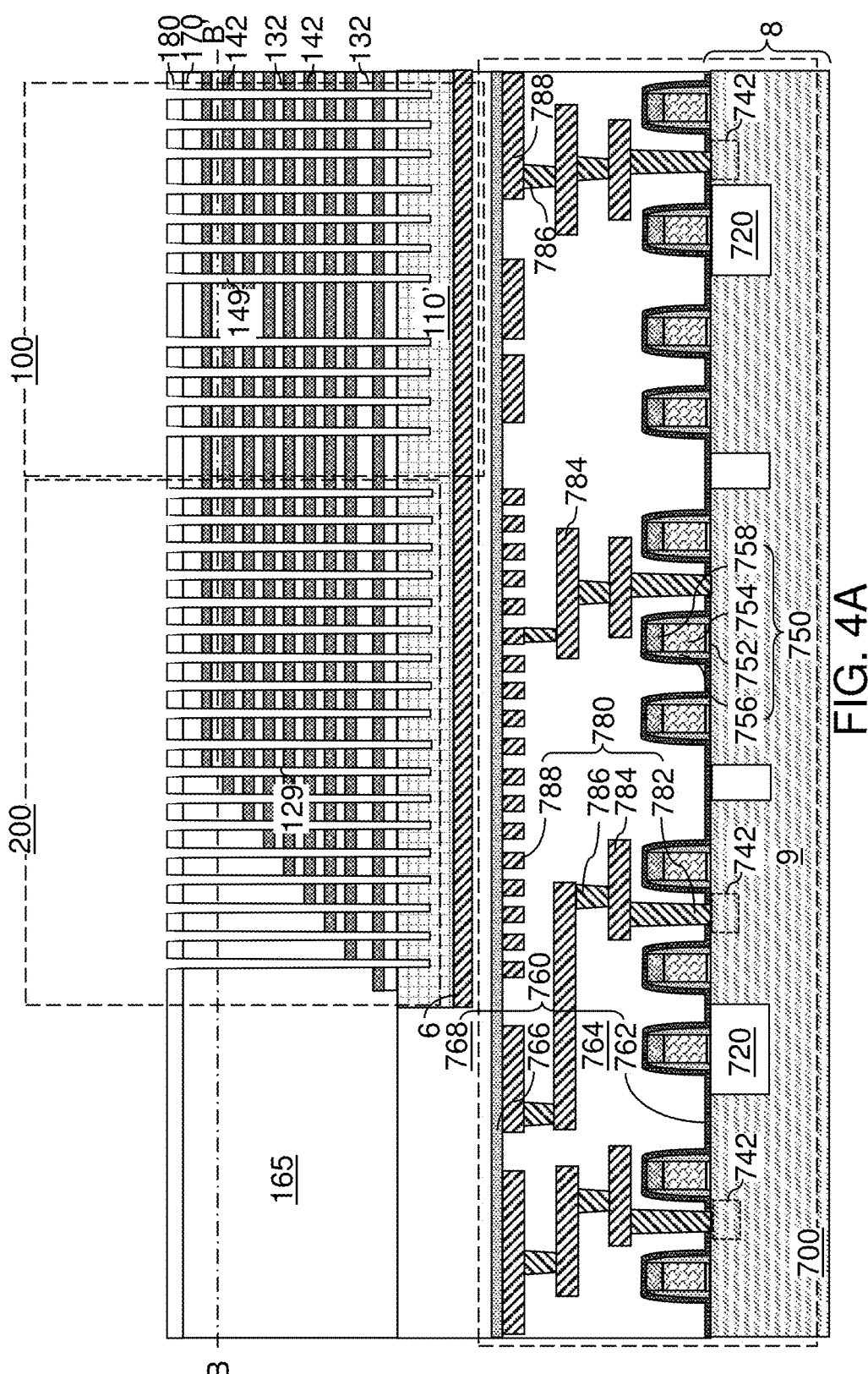
FIG. 4A is a vertical cross-sectional view of the exemplary structure after formation of first-tier memory openings and first-tier support openings according to an embodiment of the present disclosure.
Figure 4B:
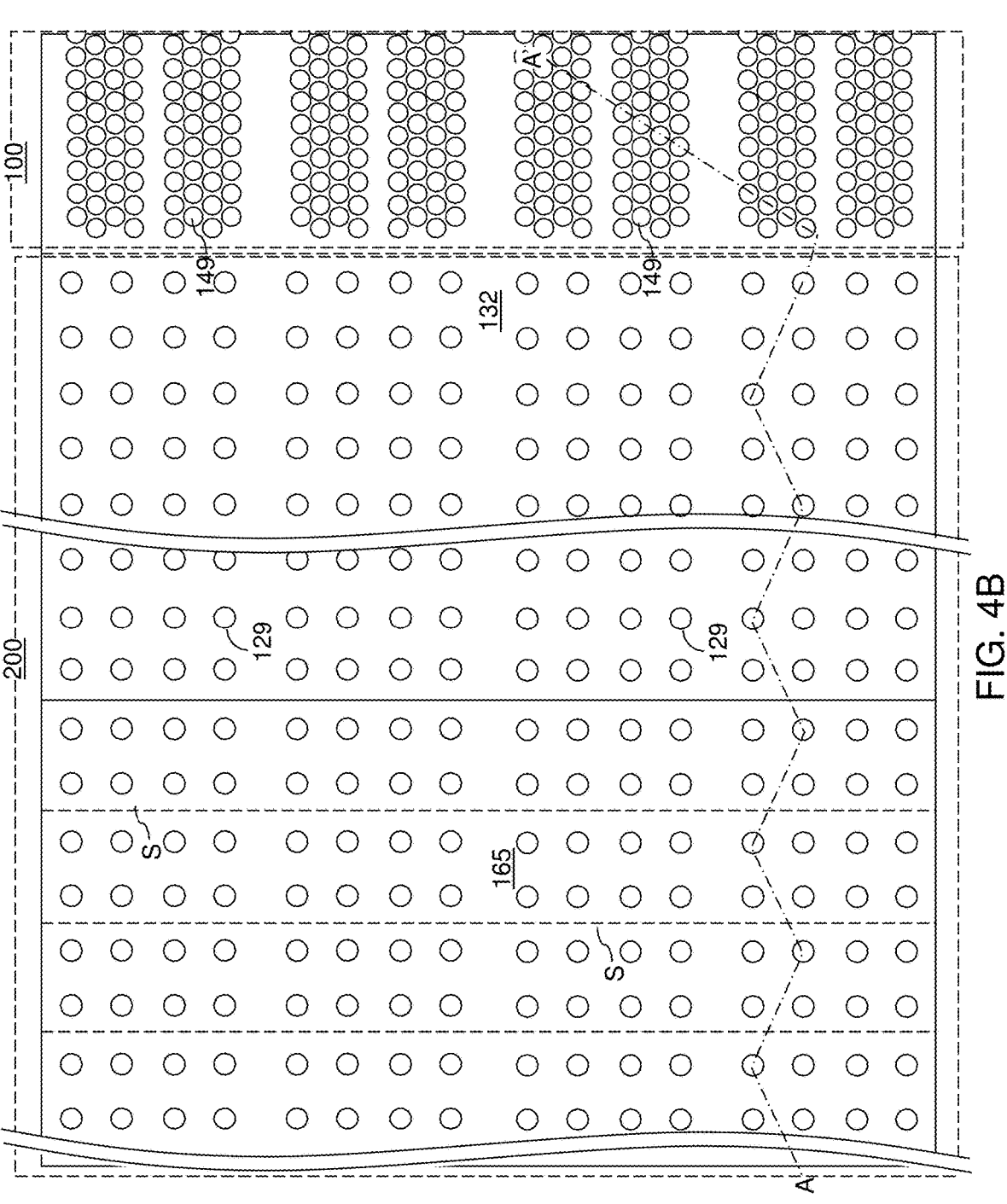
FIG. 4B is a horizontal cross-sectional view of the exemplary structure of FIG. 4A. The hinged vertical plane A-A' corresponds to the plane of the vertical cross-sectional view of FIG. 4A.
Figure 4C:
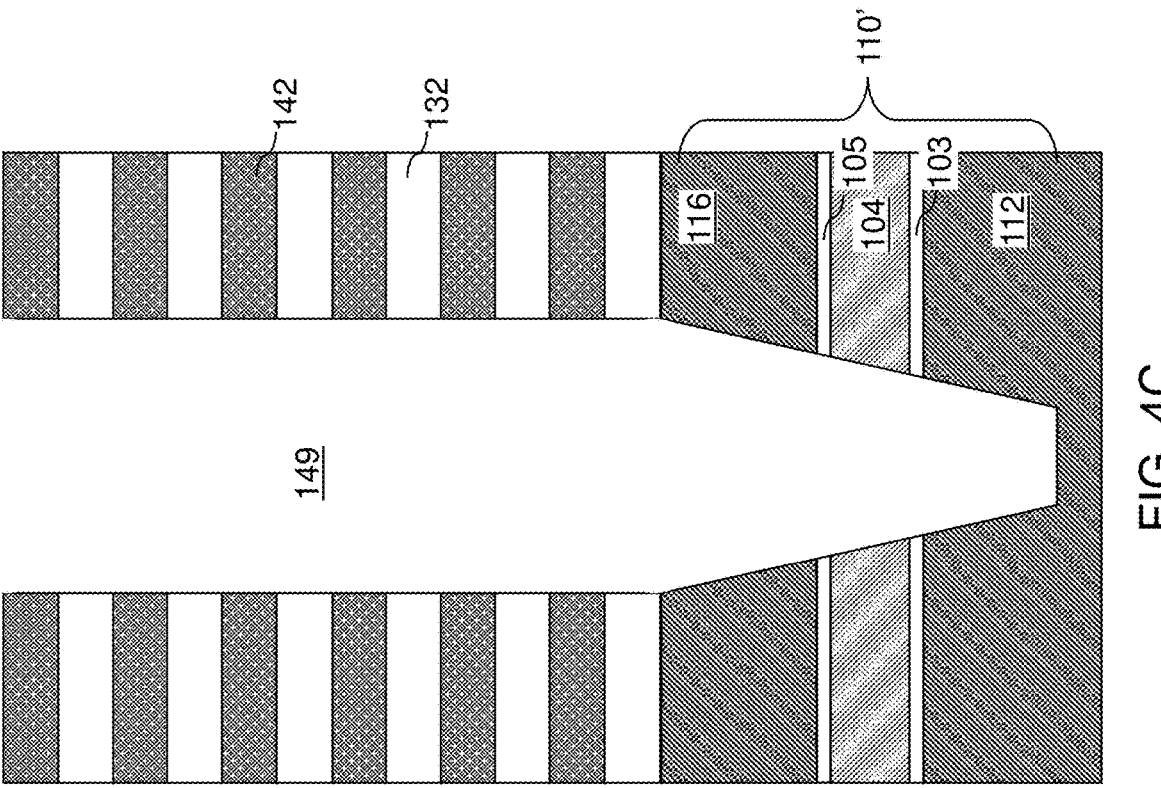
FIG. 4C is a vertical cross-sectional view of a bottom portion of a first-tier memory opening at the processing steps of FIGS. 4A and 4B.

Referring to FIGS. 4A-4C, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures (50, 60) therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the first-tier alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

According to an aspect of the present disclosure shown in FIG. 4C, the etch chemistry of the first anisotropic etch process can be selected such that the lateral dimension of each first-tier memory openings 149 decreases gradually in the in-process source-level material layers 110' relative to the lateral dimension within the portion laterally surrounded by the first-tier alternating stack (132, 142). For example, the etch chemistry of the first anisotropic etch process can employ at least one fluorine-based etch gas, such as $CF_4$, $CHF_3$, $C_4F_8$, etc. The physically exposed sidewalls of the layers within the first-tier alternating stack (132, 142) can be vertical or substantially around each first-tier memory opening 149, and the physically exposed sidewalls of the layers in the in-process source-level material layers 110' may have a taper angle. The taper angle, as measured relative to the vertical direction, may be in a range from 2 degrees to 30 degrees, such as from 3 degrees to 20 degrees, and/or from 5 degrees to 12 degrees, although lesser and greater taper angles may also be employed. In one embodiment, a first-tier memory opening 149 may have a flat or substantially flat bottommost surface that is adjoined to a tapered sidewall of the in-process source-level material layers 110'.

Figure 5A:
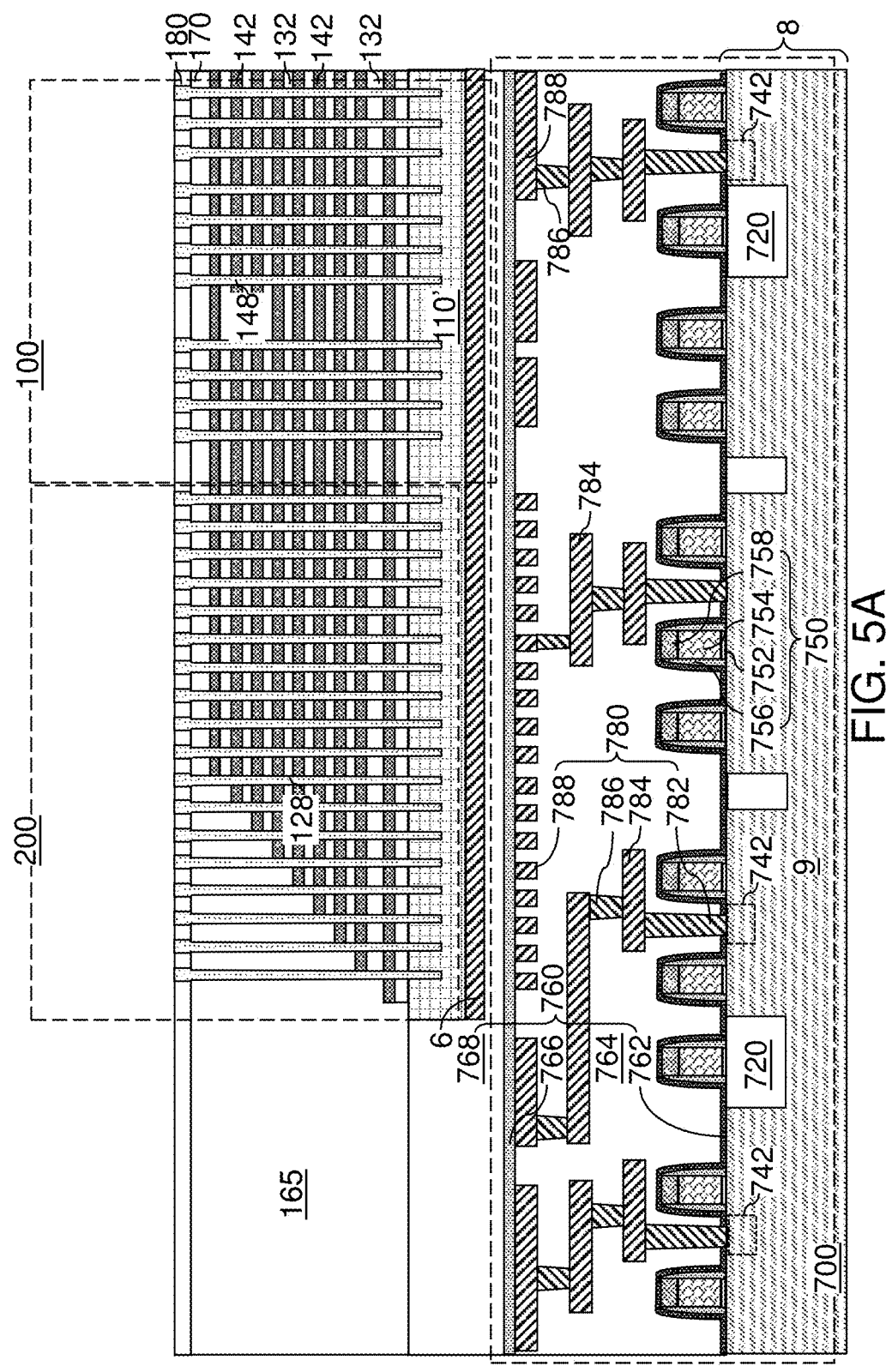
FIG. 5A is a vertical cross-sectional view of the exemplary structure after formation of various sacrificial fill structures according to an embodiment of the present disclosure.
Figure 5B:
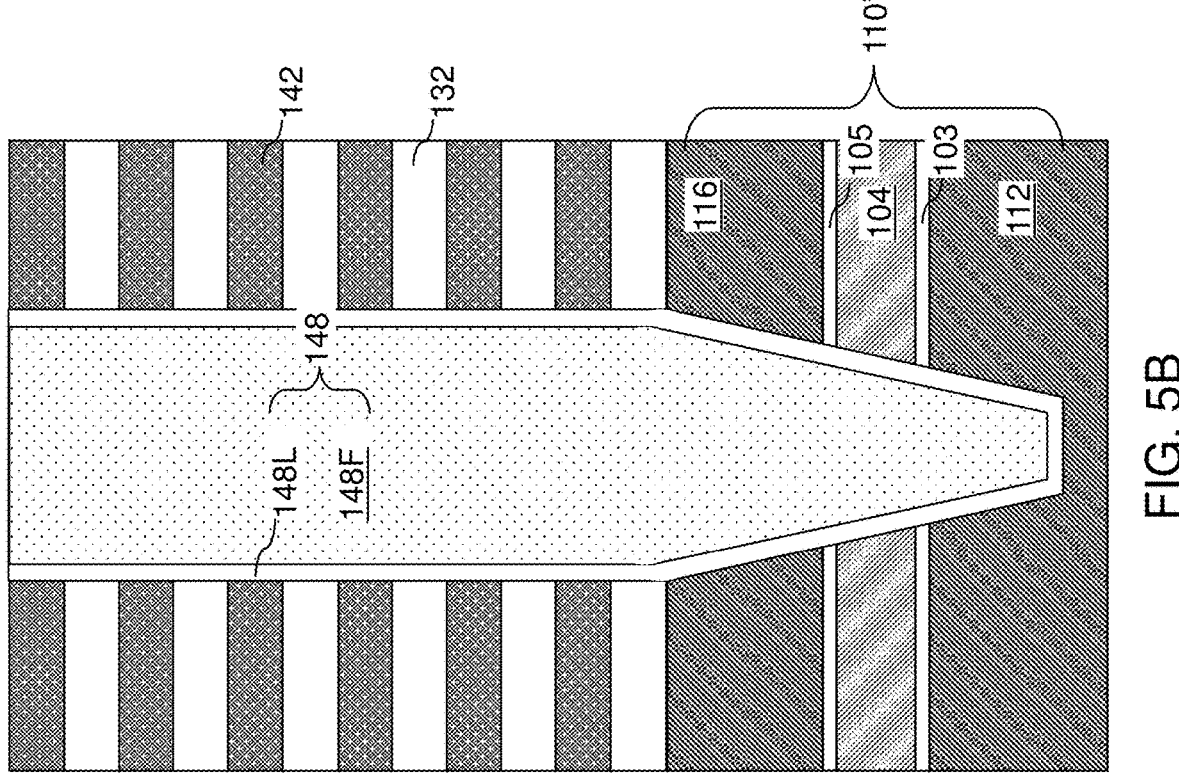
FIG. 5B is a vertical cross-sectional view of a bottom region of a first-tier memory opening at the processing step of FIG. 5A.

Referring to FIGS. 5A and 5B, sacrificial first-tier opening fill structures (148, 128) may be formed in the various first-tier openings (149, 129). For example, a sacrificial first-tier liner 148L can be conformally deposited in each of the first-tier openings (149, 129), and a sacrificial first-tier fill material can be subsequently deposited in each of the first-tier openings (149, 129). The sacrificial first-tier liner 148L may comprise a dielectric material, such as silicon oxide, and may have a thickness in a range from 2 nm to 10 nm, although lesser and greater thicknesses may also be employed. The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the sacrificial first-tier fill material and the sacrificial first-tier liner 148L may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill structures (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each of the sacrificial first-tier memory opening fill portions 148 and the sacrificial first-tier support opening fill portions 128 may comprise a combination of a respective sacrificial first-tier liner 148L and a respective sacrificial first-tier fill material portion 148F, which is a remaining portion of the sacrificial first-tier fill material.

The various sacrificial first-tier opening fill structures (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill structures (148, 128) may be coplanar with the top surface of the inter-tier dielectric layer 180. Each of the sacrificial first-tier opening fill structures (148, 128) may, or may not, include cavities therein.

Figure 6:
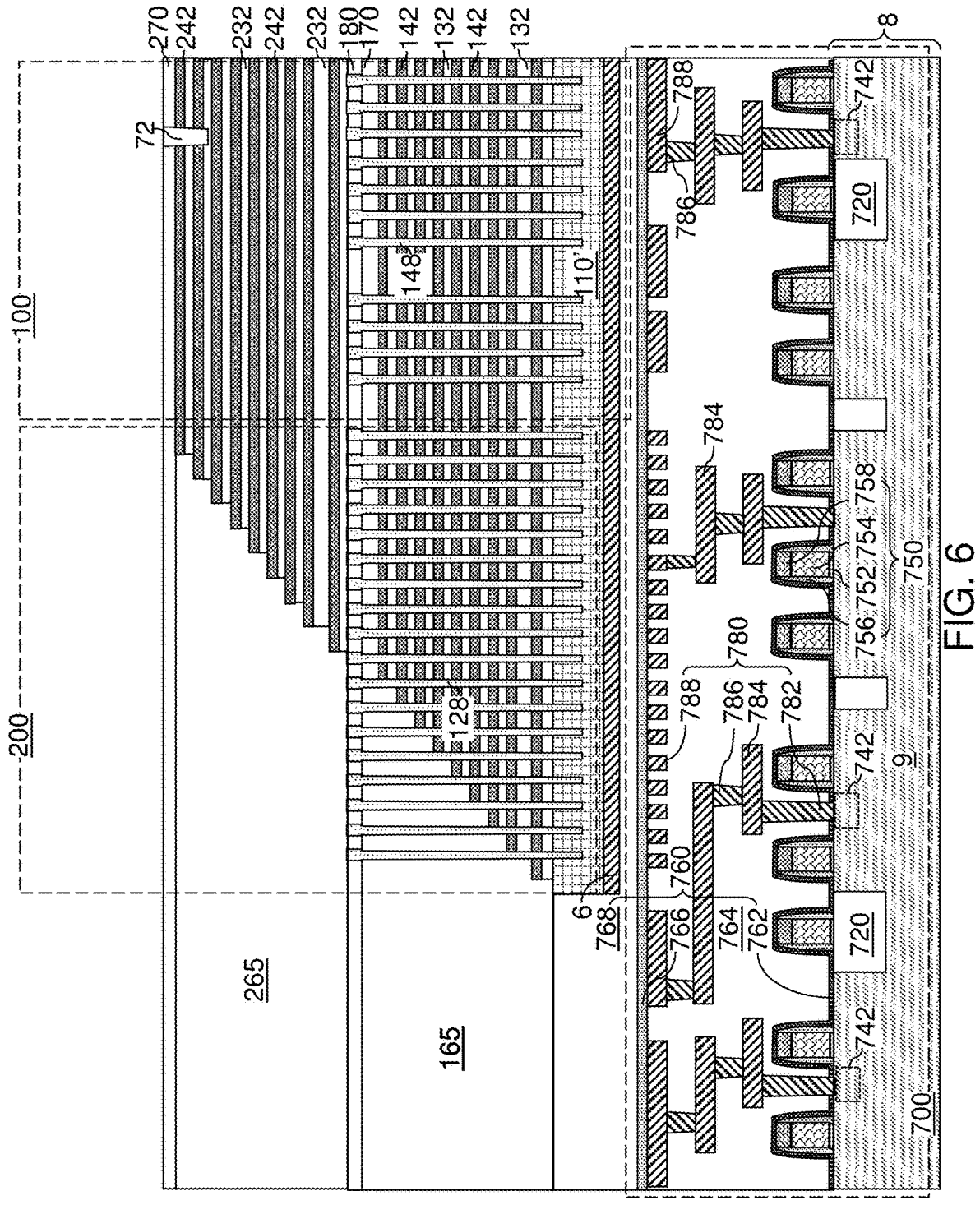
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
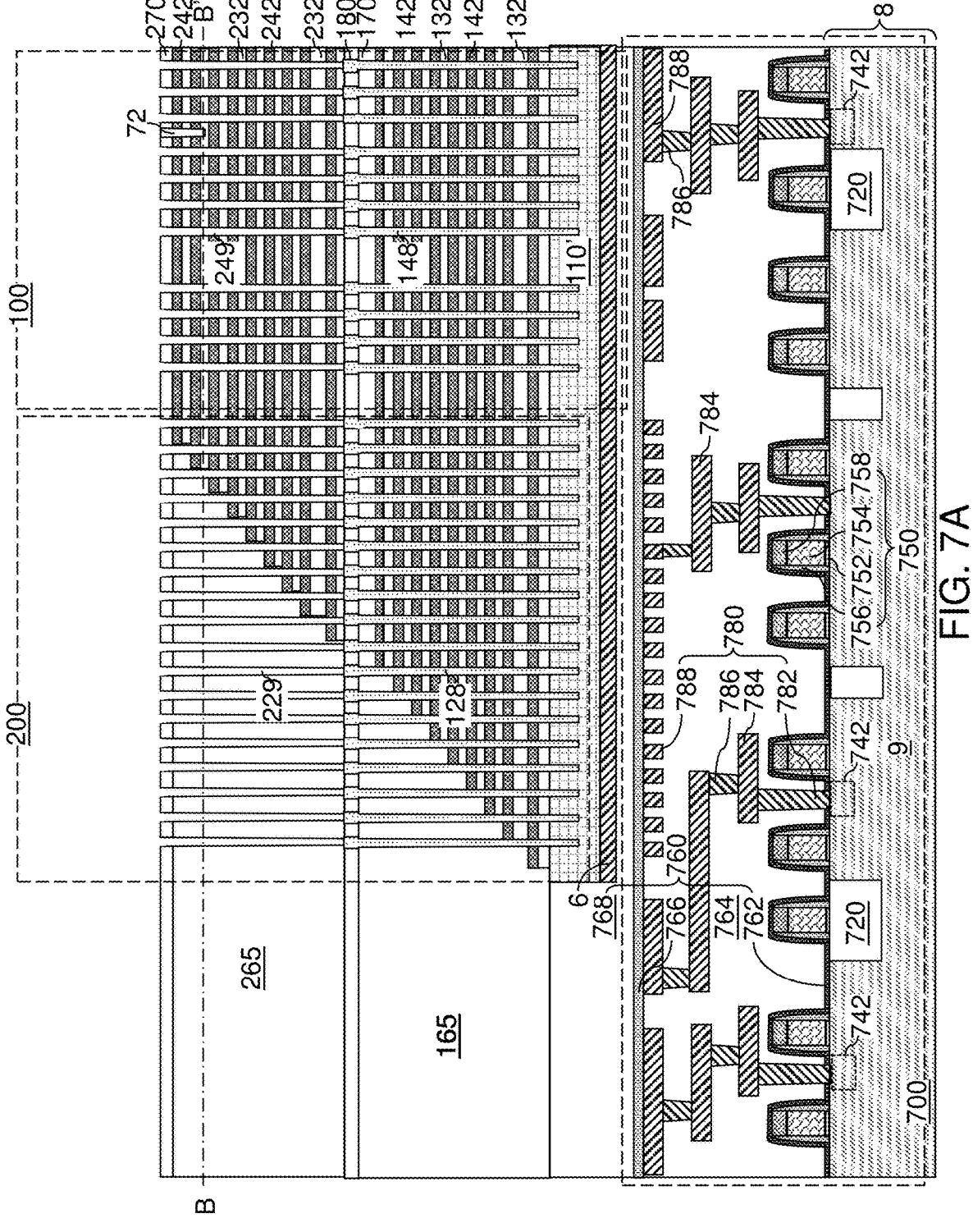
FIG. 7A is a vertical cross-sectional view of the exemplary structure after formation of second-tier memory openings and second-tier support openings according to an embodiment of the present disclosure.
Figure 7B:
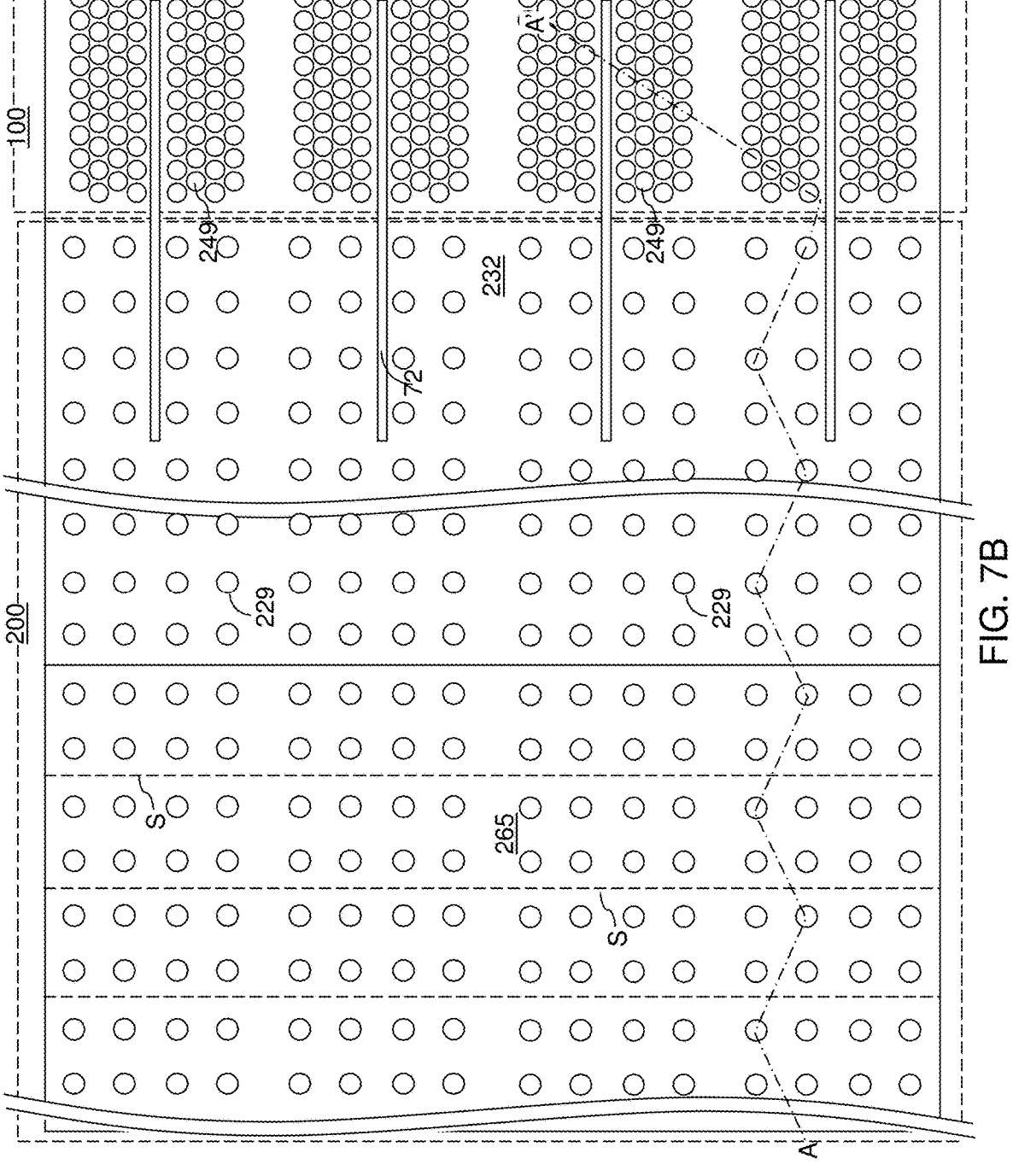
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill structures (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4$/O2/Ar etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill structure (148, 128). The photoresist layer may be subsequently removed, for example, by ashing.

Figure 8:
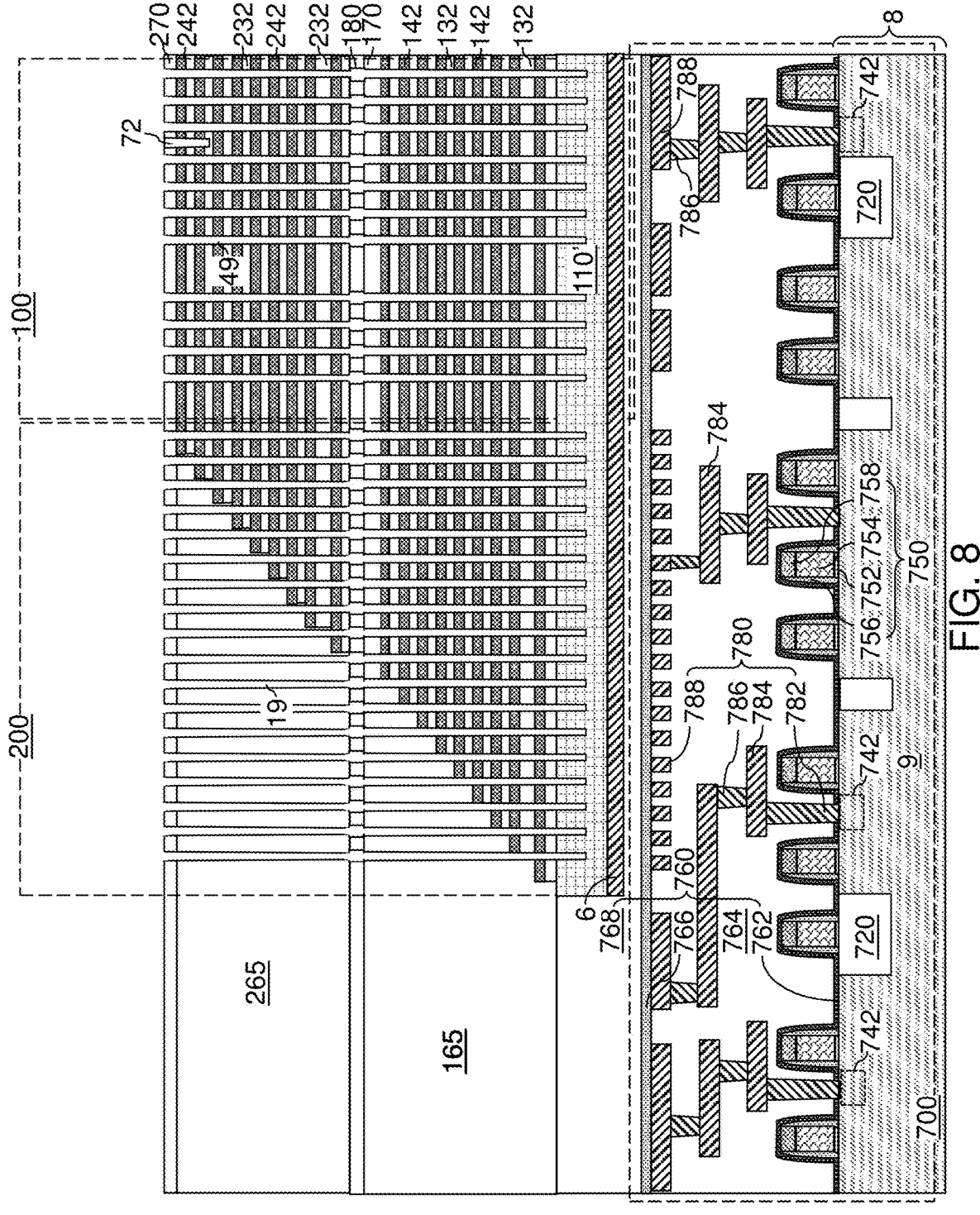
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill structures (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9F illustrate sequential vertical cross-sectional views of a memory opening 49 during formation of a memory opening fill structure 58 having a first configuration according to a first embodiment of the present disclosure.

Figure 9A:
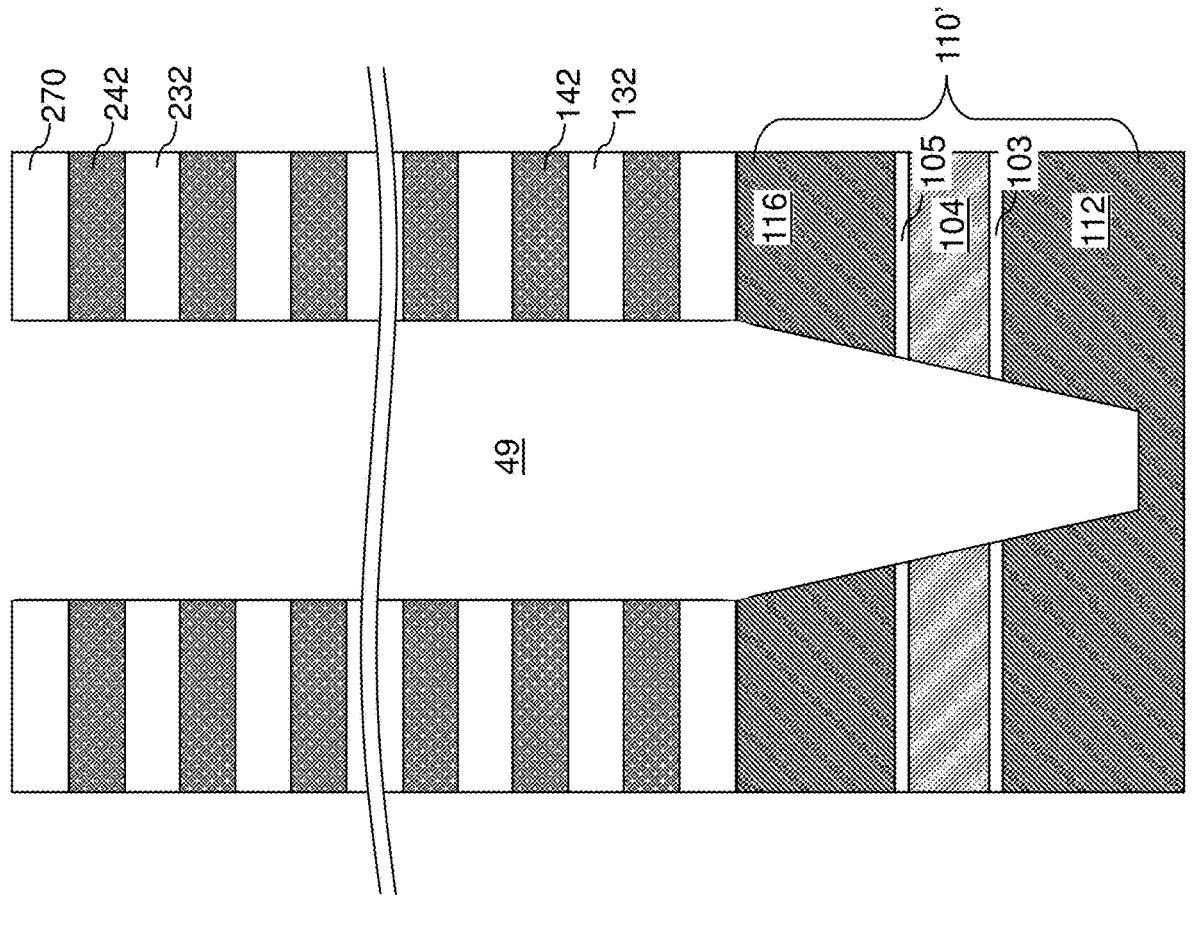
FIGS. 9A-9F illustrate sequential vertical cross-sectional views of a memory opening during formation of a memory opening fill structure having a first configuration according to an embodiment of the present disclosure.

Referring to FIG. 9A, a memory opening 49 is illustrated after the processing steps of FIG. 8.

Figure 9B:
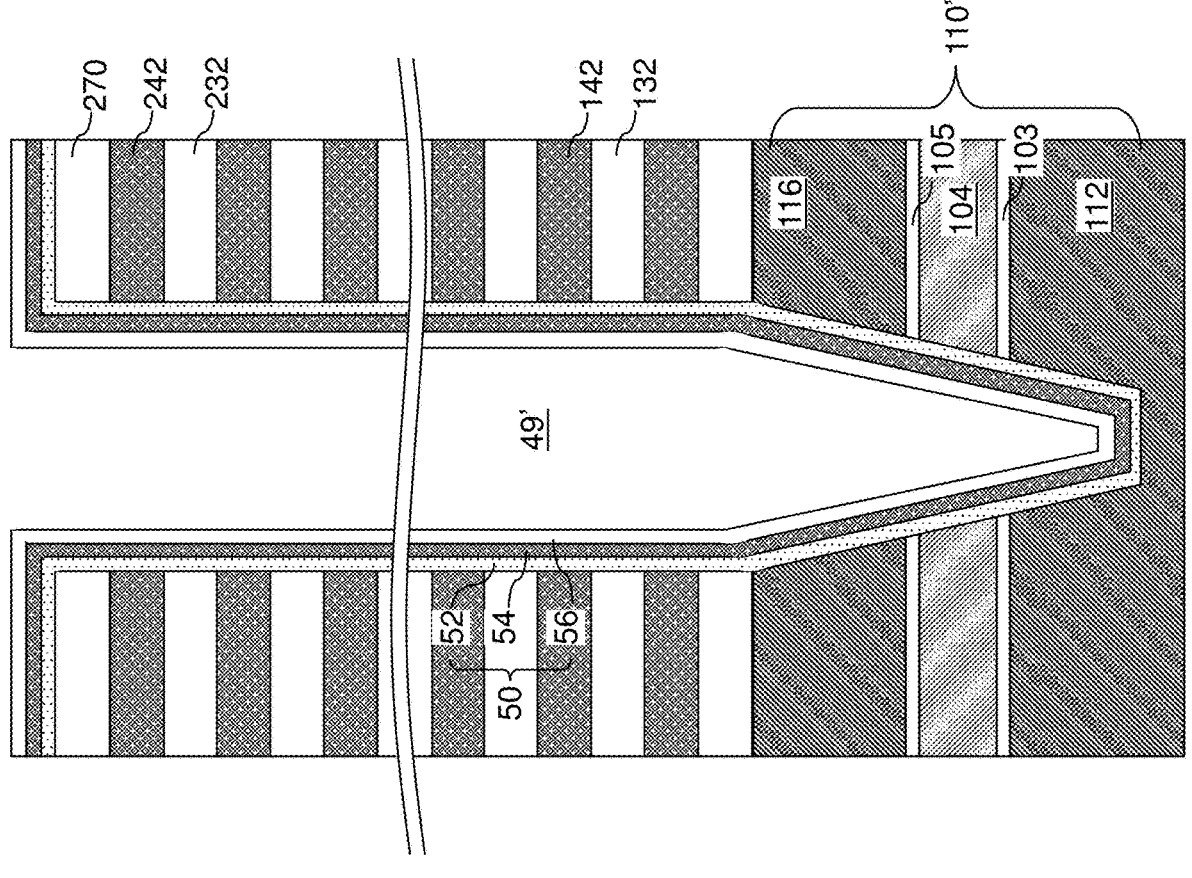

Referring to FIG. 9B, a memory film 50 can be conformally deposited on physically exposed surfaces of the memory openings 49 and the support openings 19, and over the second insulating cap layer 270. The memory film 50 comprises any material that can store data at levels of the sacrificial material layers (142, 242). For example, the memory film 50 may comprise a charge storage material, a phase change memory material that can provide at least two different levels of electrical resistively, a ferroelectric material, or any other material that can provide at least two different material states that exhibit different electrical characteristics. Generally, the memory film 50 comprises a material that can provide a vertical stack of memory elements within each memory opening 49 at levels of the sacrificial material layers (142, 242). A memory cavity 49' is present within the unfilled volume of each memory opening 49.

In a non-limiting illustrative example, the memory film 50 comprises a stack of layers including a blocking dielectric layer 52, a charge storage layer 54, and a tunneling dielectric layer 56. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

The charge storage layer 54 may be a continuous layer or patterned discrete portions of a charge trapping material, such as a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

Figure 9C:
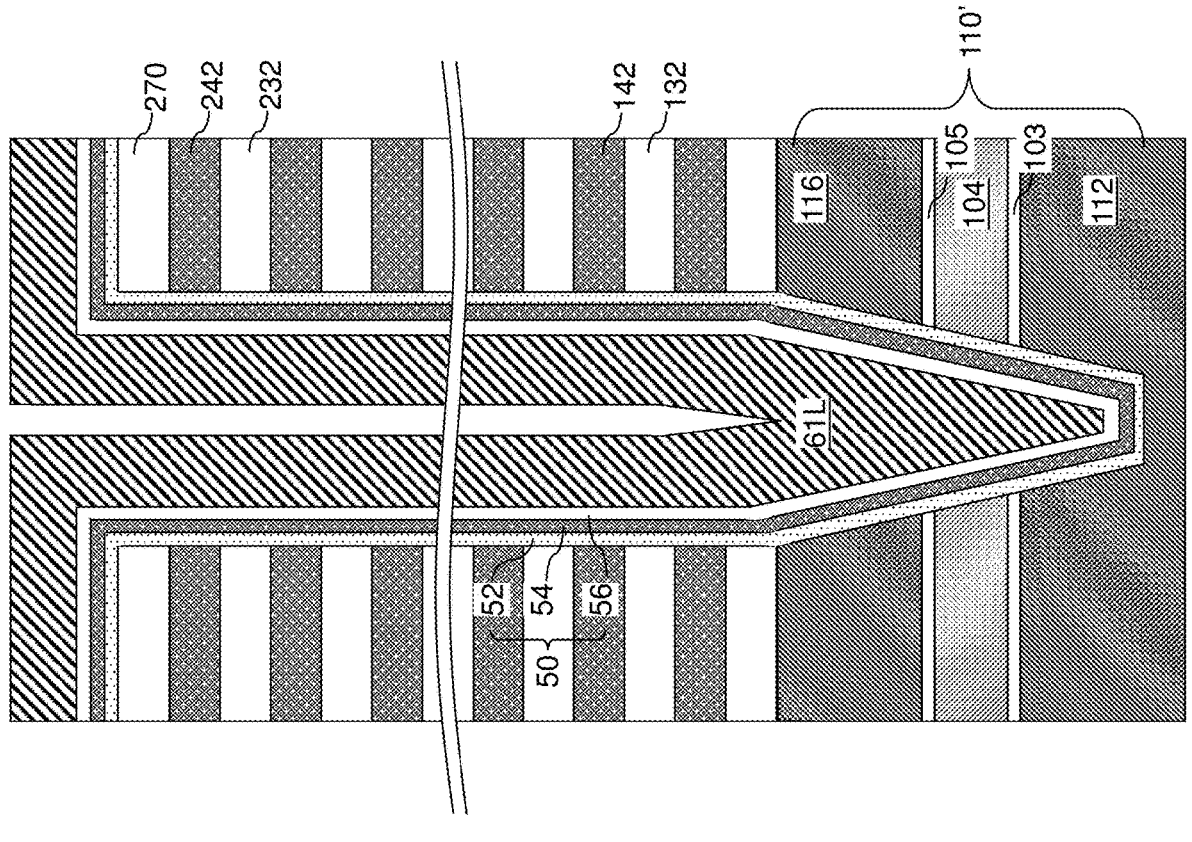

Referring to FIG. 9C, a second-conductivity-type semiconductor material layer 61L comprising a third semiconductor material can be deposited on an inner sidewall of the memory film 50 within each memory opening 49 and within each support opening 19. The third semiconductor material has a doping of the second conductivity type. The second-conductivity-type semiconductor material layer 61L comprises a doped semiconductor material having a doping of the second conductivity type. The atomic concentration of dopants of the second conductivity type in the second-conductivity-type semiconductor material layer 61L may be in a range from $1.0\times10^{18}$/cm$^3$ to $2.0\times10^{21}$/cm$^3$, such as from $5.0\times10^{18}$/cm$^3$ to $5.0\times10^{20}$/cm$^3$, although lesser and greater atomic concentrations may also be employed.

Generally, the second conductivity type may be n-type or p-type. In an illustrative example, the second conductivity type may be n-type, and the dopants of the second conductivity type may comprise phosphorus atoms and/or arsenic atoms. In one embodiment, the dopants of the second conductivity type may comprise phosphorus atoms.

The second-conductivity-type semiconductor material layer 61L may comprise silicon (e.g., amorphous silicon), a silicon-germanium alloy, or a compound semiconductor material. The second-conductivity-type semiconductor material layer 61L is a semiconductor material layer having a doping of the second conductivity type, which is the opposite of the conductivity type of the semiconductor channels to be subsequently formed. The second-conductivity-type semiconductor material layer 61L may be formed by a conformal deposition process such that second-conductivity-type semiconductor material layer 61L has a uniform lateral thickness on the inner sidewalls of the memory film 50. A bottom portion of the memory film 50 at the bottom of each memory opening 49 that is laterally surrounded by the in-process source-level material layers 110' may have a tapered inner surface. As a consequence, a bottom portion the interface between the second-conductivity-type semiconductor material layer 61L and the memory film 50 at the bottom of each memory opening 49 can be tapered. In one embodiment, the interface can comprise a conical surface segment.

According to an aspect of the present disclosure, the thickness of the second-conductivity-type semiconductor material layer 61L can be selected such that sidewalls of the growth surface of the second-conductivity-type semiconductor material layer 61L merge at the bottom of each memory cavity 49'. A solid (i.e., not hollow) conical tip can be formed at the bottom of each memory cavity 49' as the growth surfaces of the second-conductivity-type semiconductor material layer 61L merge at the bottom of each memory opening 49. In one embodiment, the duration of the deposition process that forms the second-conductivity-type semiconductor material layer 61L can be selected such that the top of the solid conical tip at the bottom of each memory cavity 49' is formed at or near the height of the horizontal plane including the bottommost surface of the first-tier alternating stack (132, 142), which may be the horizontal plane including the topmost surface of the in-process source-level material layers 110'. In one embodiment, the conical tip at the bottom of each memory cavity 49' may be formed above the horizontal plane including the bottommost surface of the first-tier alternating stack (132, 142). In one embodiment, the conical tip at the bottom of each memory cavity 49' may be formed below the horizontal plane including the bottommost surface of the first-tier alternating stack (132, 142). In one embodiment, the conical tip at the bottom of each memory cavity 49' may be formed at the horizontal plane including the bottommost surface of the first-tier alternating stack (132, 142). Generally, the top of the solid conical tip at the bottom of each memory cavity 49' may be formed above the horizontal plane including the bottom surface of the upper source-level semiconductor layer 116.

Figure 9D:
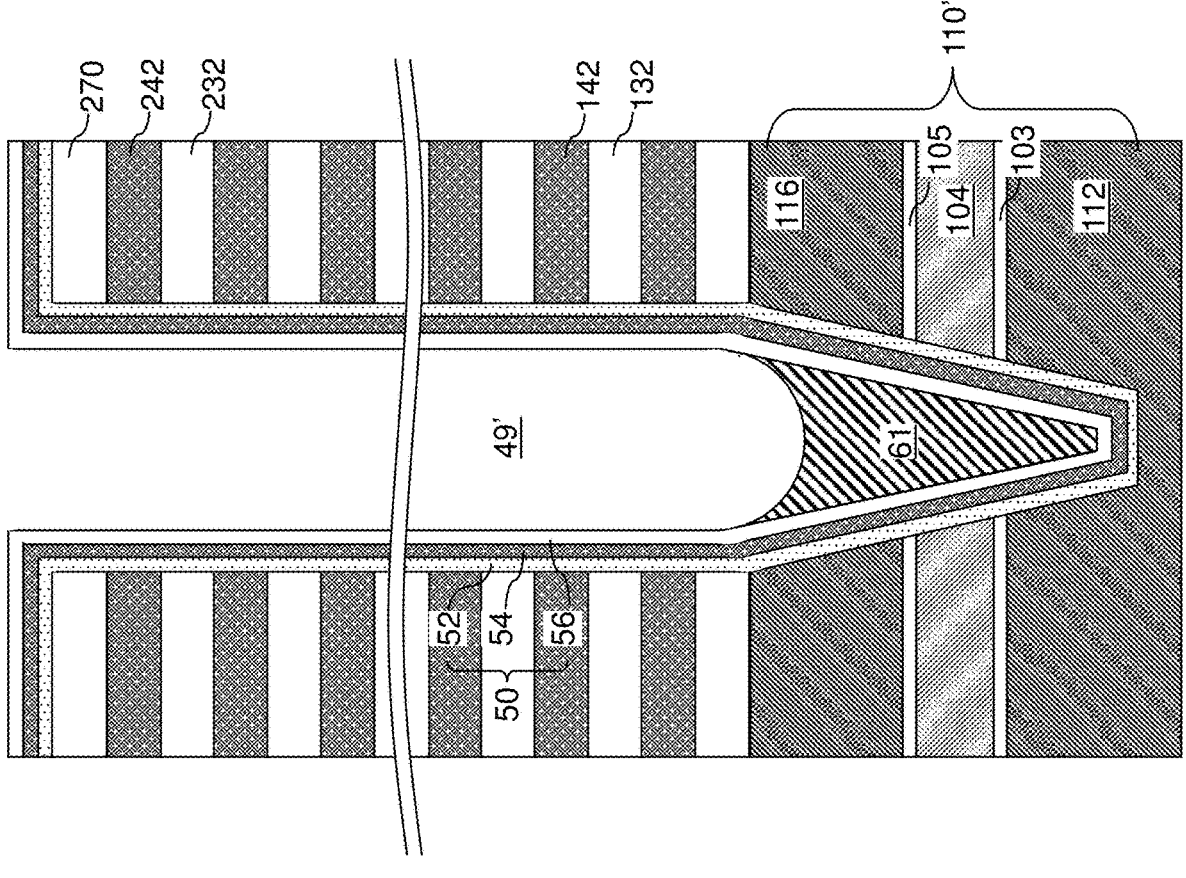

Referring to FIG. 9D, an isotropic recess etch process can be performed to isotropically recess the second-conductivity-type semiconductor material layer 61L. For example, a timed wet etch process a using hot trimethyl-2 hydroxyethyl ammonium hydroxide ("hot TMY") or tetramethyl ammonium hydroxide (TMAH) may be employed as the isotropic recess etch process for amorphous silicon layer 61L. The duration of the isotropic recess etch process can be selected such that the recess distance is the same as or greater than the lateral thickness of the vertically-extending portions of the second-conductivity-type semiconductor material layer 61L that are located on sidewalls of the alternating stack {(132, 142), (232, 242)}. An upper portion of the inner sidewall of the memory film 50 is physically exposed above the horizontal plane including the bottommost surface of the alternating stack {(132, 142), (232, 242)}. A remaining portion of the semiconductor material layer located at a bottom portion of each memory opening 49 and contacting a lower portion of the inner sidewall of the memory film 50 comprises a conical source pedestal 61, which comprises a semiconductor material having a doping of the second conductivity type. In other words, the isotropic recess etch process is continued to remove the portions of layer 61L located at levels of the alternating stack {(132, 142), (232, 242)} while leaving the solid conical source pedestal 61 located at a level below the alternating stack {(132, 142), (232, 242)}.

Figure 9E:
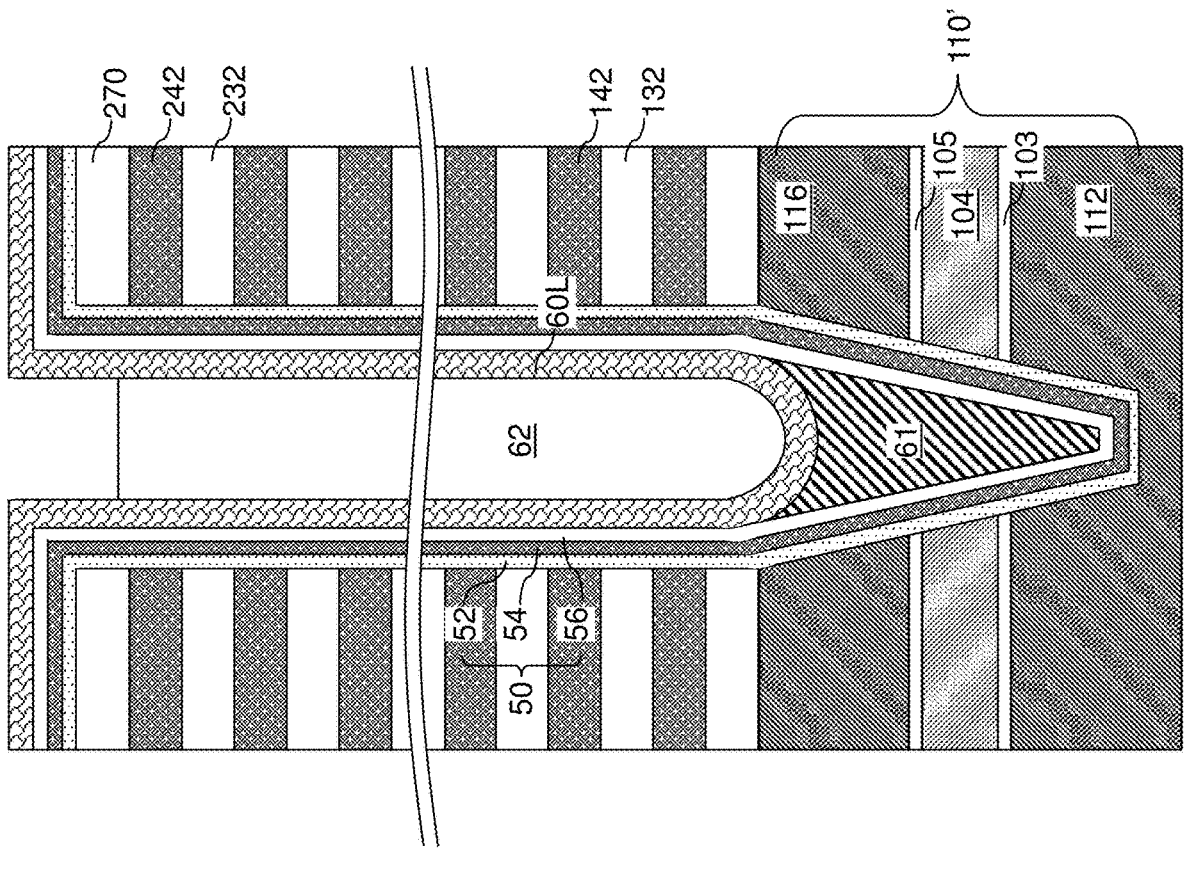

Referring to FIG. 9E, a semiconductor channel material layer 60L can be conformally deposited on the physically exposed concave surfaces of the and on the physically exposed inner sidewall surfaces of the memory film 50. The semiconductor channel material layer 60L includes a fourth semiconductor material which is either intrinsic or has a doping a first conductivity type, which may be p-type or n-type. The first conductivity type is the opposite of the second conductivity type. The third semiconductor material may comprise at least one elemental semiconductor material, at least one III-V compound semiconductor material, at least one II-VI compound semiconductor material, at least one organic semiconductor material, and/or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{13}/cm^3$ to $1.0 \times 10^{18}/cm^3$, such as from $1.0 \times 10^{14}/cm'$ to $1.0 \times 10^{17}/cm^3$. Generally, the fourth semiconductor material is electrically semiconducting. In an illustrative example, the first conductivity type may be p-type, and the semiconductor channel material layer 60L includes and/or consists essentially of boron-doped amorphous silicon or boron-doped polysilicon. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49.

A dielectric core layer may be deposited in the cavity 49' to fill any remaining portion of the cavity 49' within each memory opening 49. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 9F:
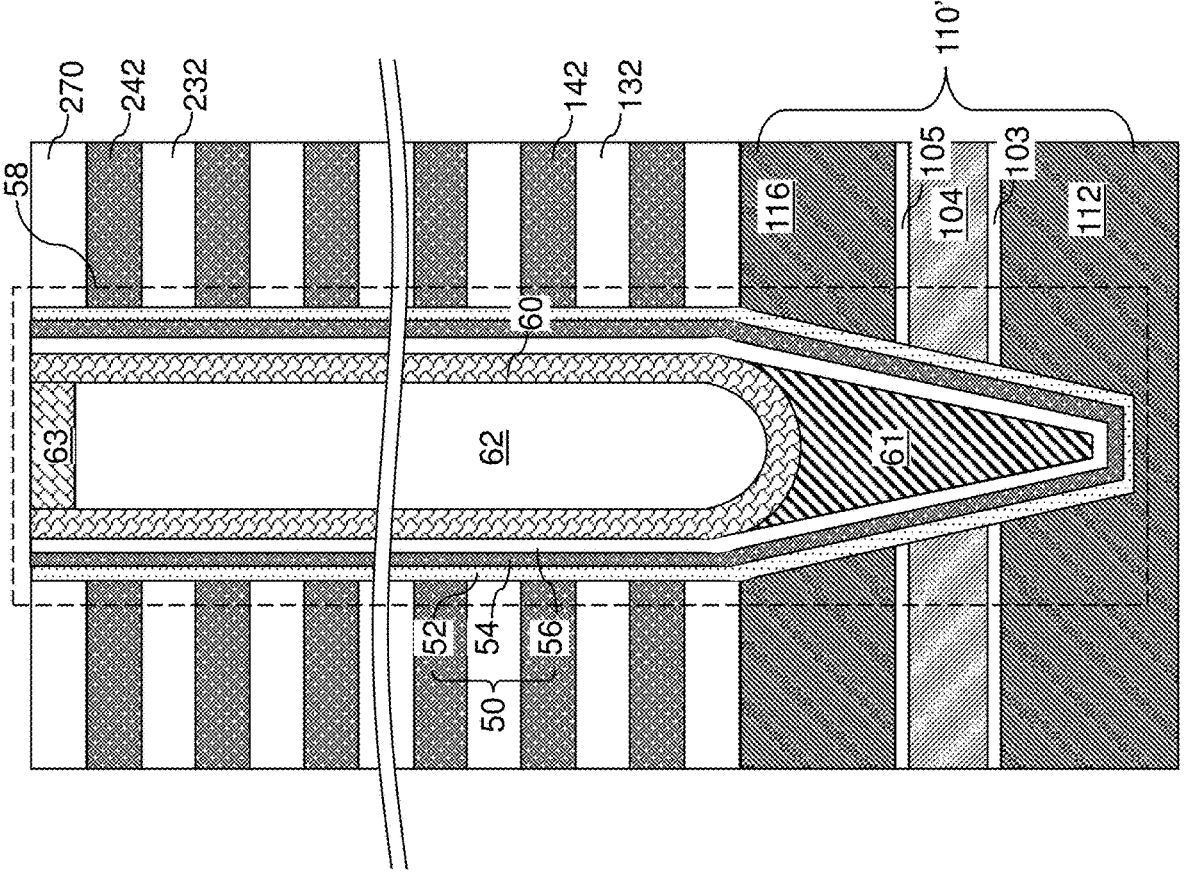

Referring to FIG. 9F, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L and the memory film 50 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{18}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. The memory film 50 as formed at the processing steps of FIG. 9B is divided into a plurality of memory films 50 located within a respective one of the memory openings 49 and the support openings 19. Each memory film 50 laterally surrounds a respective vertical semiconductor channel 60.

Each combination of a memory film 50 and a vertical semiconductor channel 60 within a memory opening 49 constitutes a memory stack structure (50, 60). Each memory stack structure (50, 60) is a contiguous combination of a vertical semiconductor channel 60 and a memory film 50. Each combination of the memory stack structure (50, 60), the solid conical source pedestal 61, the dielectric core 62, and the drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Figure 10:
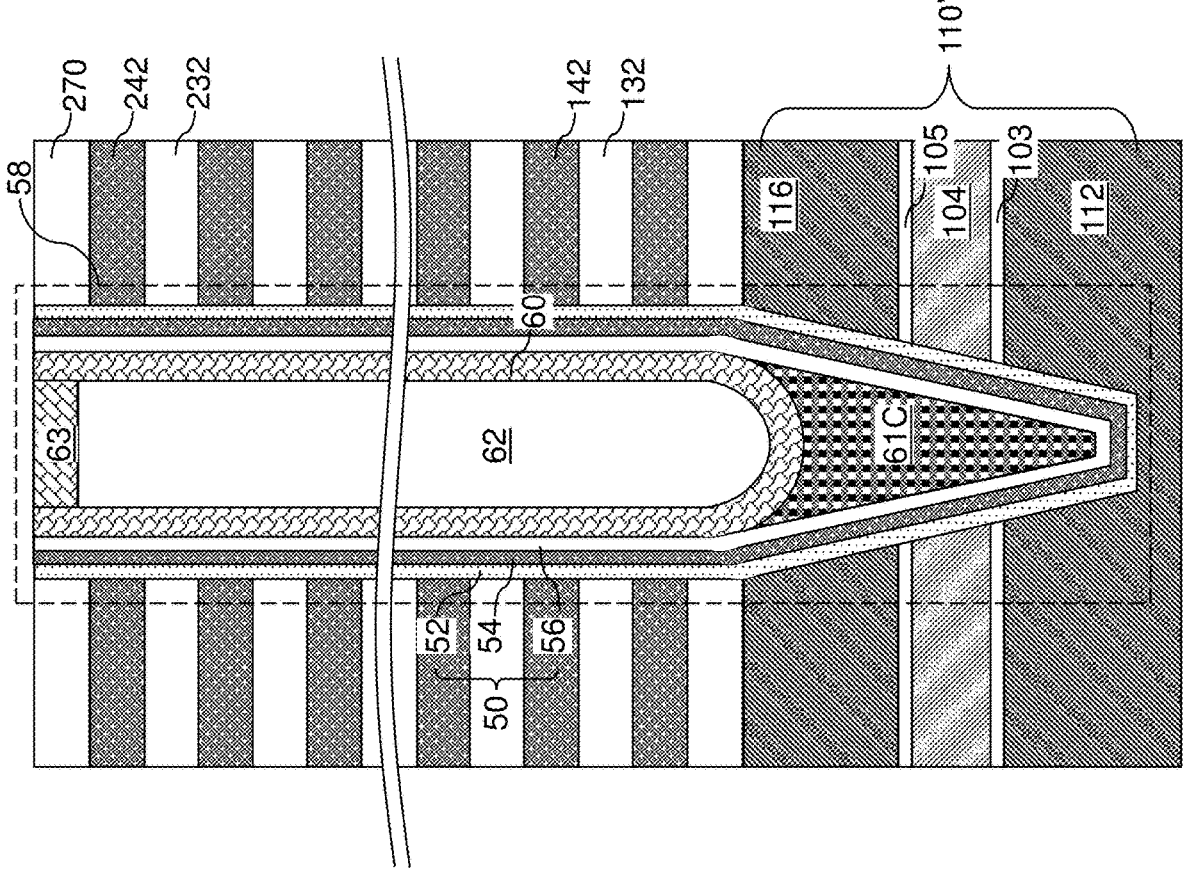
FIG. 10 is a vertical cross-sectional view of a memory opening fill structure having a second configuration according to an embodiment of the present disclosure.

FIG. 10 is a vertical cross-sectional view of a memory opening fill structure 58 having a second configuration according to a second embodiment of the present disclosure.

Referring to FIG. 10, the second configuration of the memory opening fill structure 58 can be derived from the first configuration of the memory opening fill structure by employing a third semiconductor material having combination of the second conductivity type doping and carbon doping as the conical source pedestal 61C. Generally, the solid conical source pedestal 61C in the second configuration of the memory opening fill structure 58 can differ from the conical source pedestal 61 in the first configuration of the memory opening fill structure 58 by the presence of carbon atoms in the conical source pedestal 61C. In this case, the conical source pedestal 61C may comprise carbon at an atomic concentration in a range from $1.0 \times 10^{16}/cm^3$ to $1.0 \times 10^{21}/cm^3$. In one embodiment, the carbon atoms may be introduced into the third semiconductor material of the second-conductivity-type semiconductor material layer 61L at the processing steps of FIG. 9C by in-situ carbon doping during the deposition process that forms the second-conductivity-type semiconductor material layer 61L. Alternatively, the carbon atoms may be introduced into the conical source pedestal 61 illustrated in FIG. 9D by ion implantation of carbon atoms into the conical source pedestal 61, thereby converting the conical source pedestal 61 illustrated in FIG. 9D into the conical source pedestal 61C having a carbon doping. The carbon atoms may be subsequently advantageously employed to reduce diffusion of the dopants of the second conductivity type in the conical source pedestal 61C into the vertical semiconductor channel 60. In one embodiment, the conical source pedestal 61C comprises a solid phosphorus and carbon doped amorphous silicon.

Figure 11A:
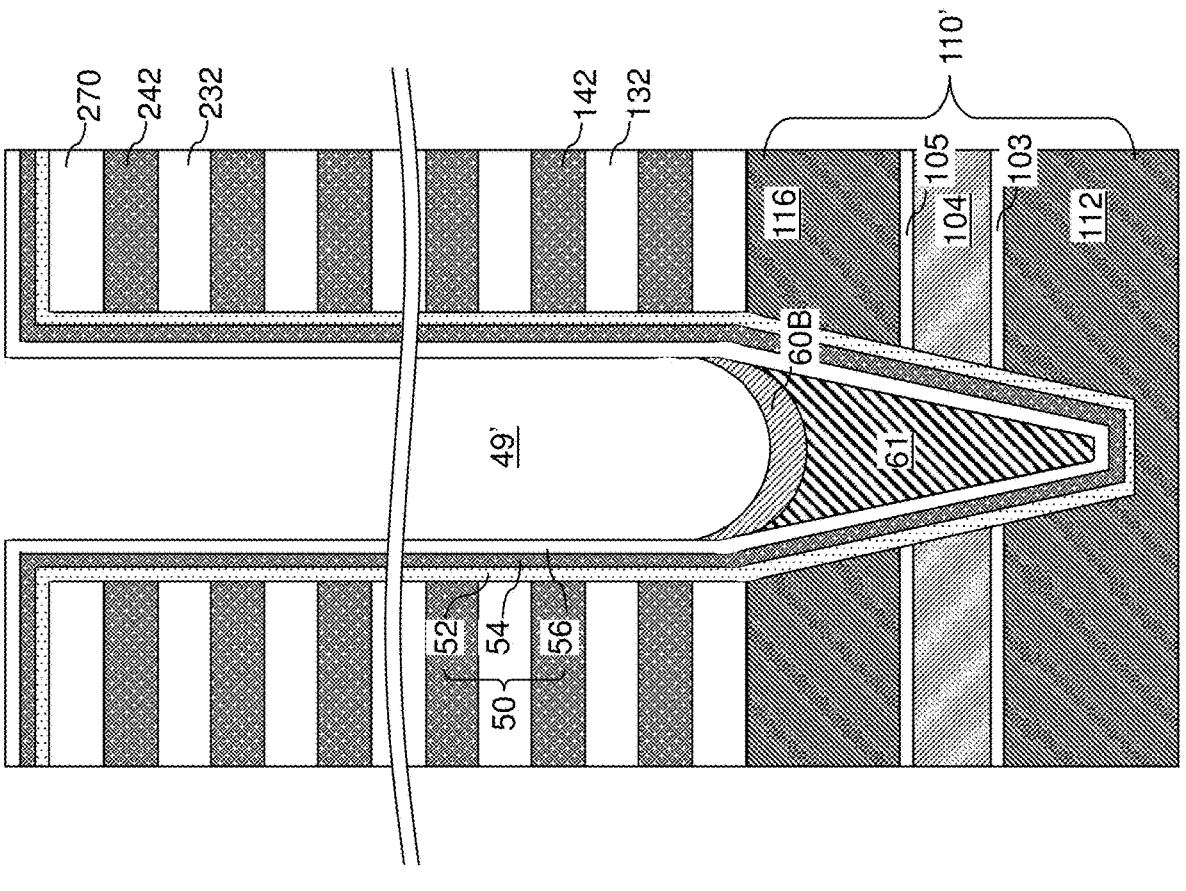
FIGS. 11A-11C illustrate sequential vertical cross-sectional views of a memory opening during formation of a memory opening fill structure having a third configuration according to an embodiment of the present disclosure.
Figure 11B:
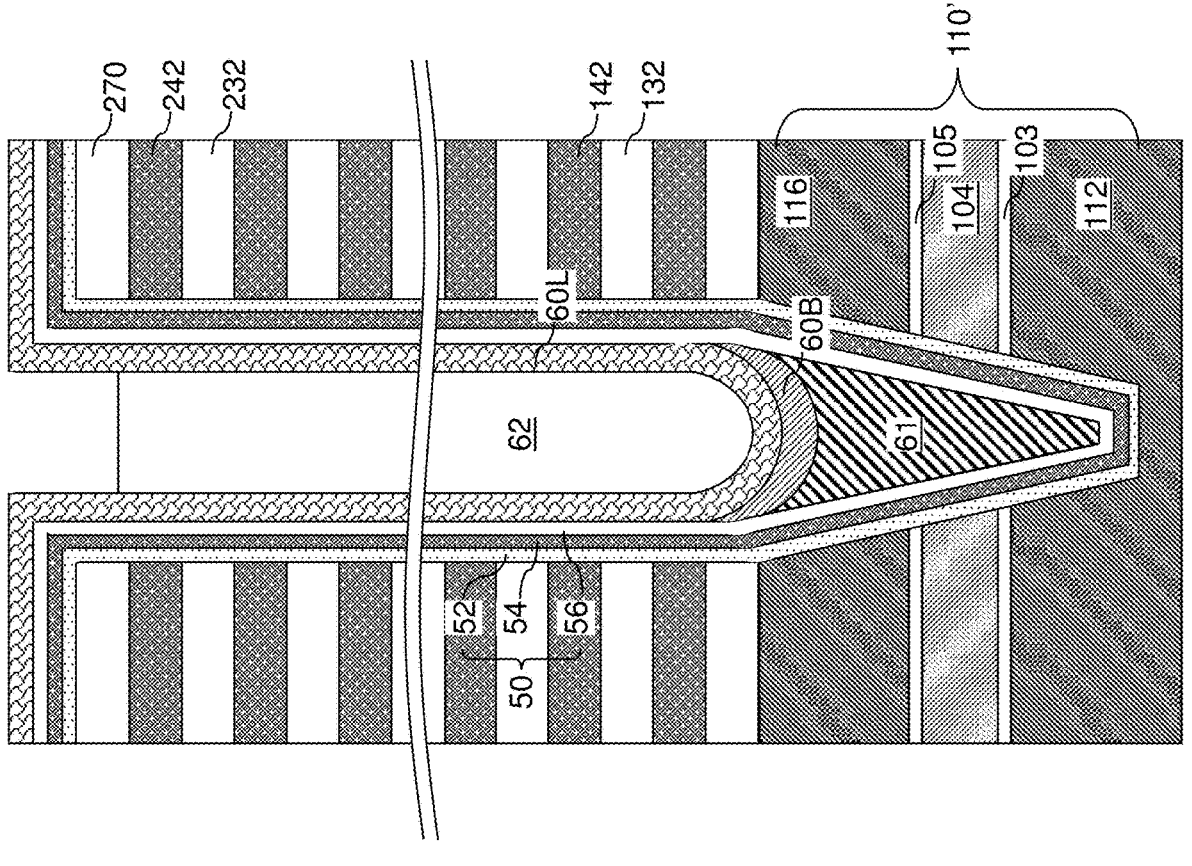
Figure 11C:
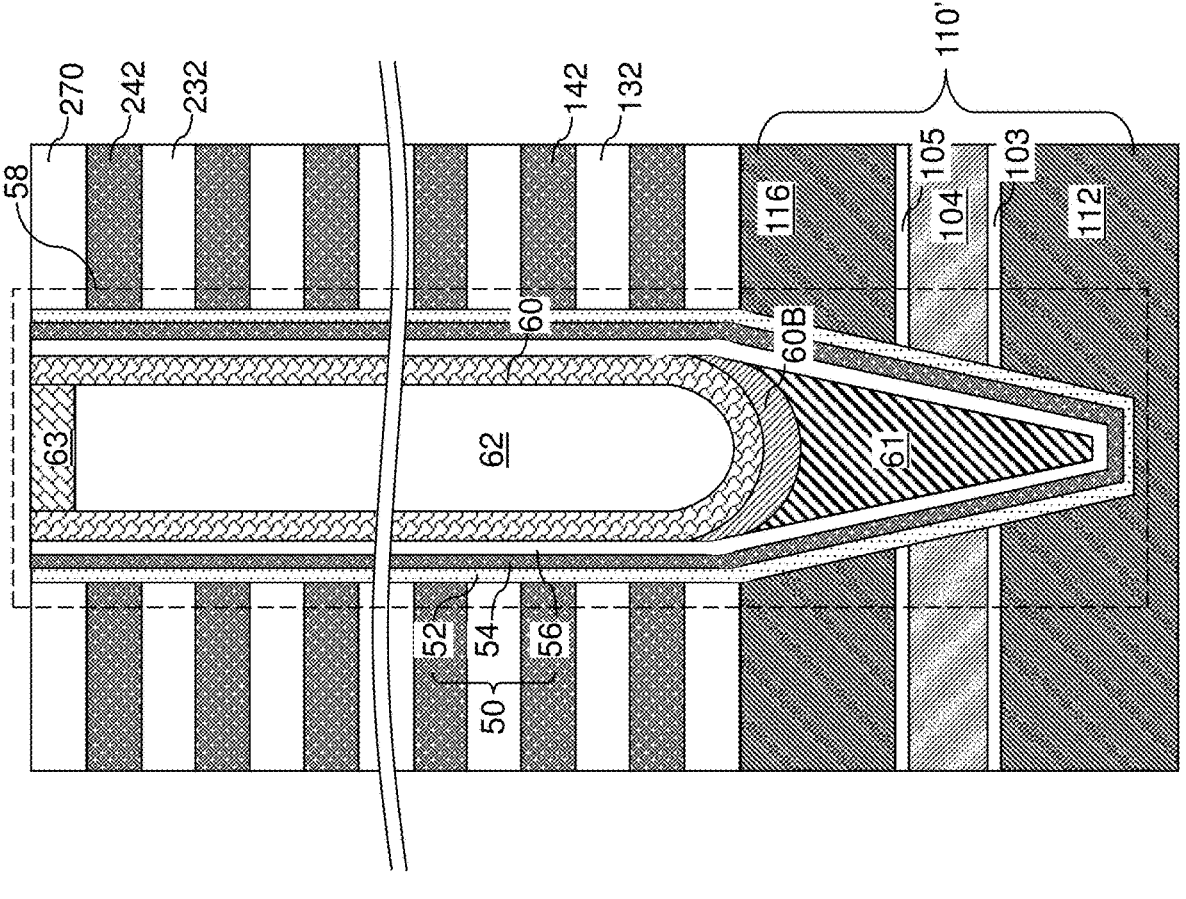

FIGS. 11A-11C illustrate sequential vertical cross-sectional views of a memory opening during formation of a memory opening fill structure 58 having a third configuration according to a third embodiment of the present disclosure.

Referring to FIG. 11A, the third configuration of the memory opening fill structure 58 can be derived from the first configuration of the exemplary structure illustrated in FIG. 9D by forming a first-conductivity-type doped semiconductor material portion 60B on the physically exposed upper concave surface of the conical source pedestal 61. The first-conductivity-type doped semiconductor material portion 60B is a doped semiconductor material portion having a doping of the first conductivity type. As such, a p-n junction can be formed at the interface between the conical source pedestal 61 and the first-conductivity-type doped semiconductor material portion 60B. In an illustrative example, if the conical source pedestal 61 has n-type doping, the first-conductivity-type doped semiconductor material portion 60B can have a p-type doping (e.g., boron doped silicon).

According to an aspect of the present disclosure, the first-conductivity-type doped semiconductor material portion 60B can be formed by performing a selective semiconductor deposition process that grows a semiconductor material from the physically exposed convex surface of the conical source pedestal 61 while suppressing growth of the semiconductor material from physically exposed surfaces of the memory film 50. Generally, the nucleation rate and the growth rate of a semiconductor material is greater on semiconductor surfaces than on dielectric surfaces. A selective growth of a semiconductor material from a semiconductor surface can be achieved by flowing an etchant gas concurrently or alternately with the flow of a reactant gas at an etch gas flow rate that provides an etch rate that is greater than the growth rate of the semiconductor material on the dielectric surfaces and is less than the growth rate of the semiconductor material on the semiconductor surface. Alternatively, the first-conductivity-type doped semiconductor material portion 60B may be formed by conformally depositing a first-conductivity-type doped semiconductor material layer in the memory opening 49 followed by an isotropic etch back step to leave only the first-conductivity-type doped semiconductor material portion 60B on the conical source pedestal 61.

The first-conductivity-type doped semiconductor material portion 60B may be formed with in-situ doping of dopants of the first conductivity type, and/or may be subsequently doped with dopants of the first conductivity type by implanting dopants of the first conductivity type into a deposited semiconductor material portion that is formed by the selective semiconductor deposition process. The atomic concentration of dopants of the first conductivity type in the first-conductivity-type doped semiconductor material portion 60B may be in a range from $1.0 \times 10^{16}/\text{cm}^3$ to $1.0 \times 10^{19}/\text{cm}^3$, such as from $1.0 \times 10^{17}/\text{cm}^3$ to $1.0 \times 10^{18}/\text{cm}^3$. In one embodiment, the atomic concentration of dopants of the first conductivity type in the first-conductivity-type doped semiconductor material portion 60B can be greater than the atomic concentration of dopants of the first conductivity type in the vertical semiconductor channel 60 to be subsequently formed. The thickness of the first-conductivity-type doped semiconductor material portion 60B may be in a range from 3 nm to 100 nm, such as from 10 nm to 30 nm, although lesser and greater thicknesses may also be employed.

Referring to FIG. 11B, the processing steps described with reference to FIG. 9E can be performed to form a semiconductor channel material layer 60L and a dielectric core 62 in each memory opening 49.

Referring to FIG. 11C, the processing steps described with reference to FIG. 9F can be performed to form a drain region 63 and a memory stack structure (50, 60) within each memory opening 49.

Figure 12A:
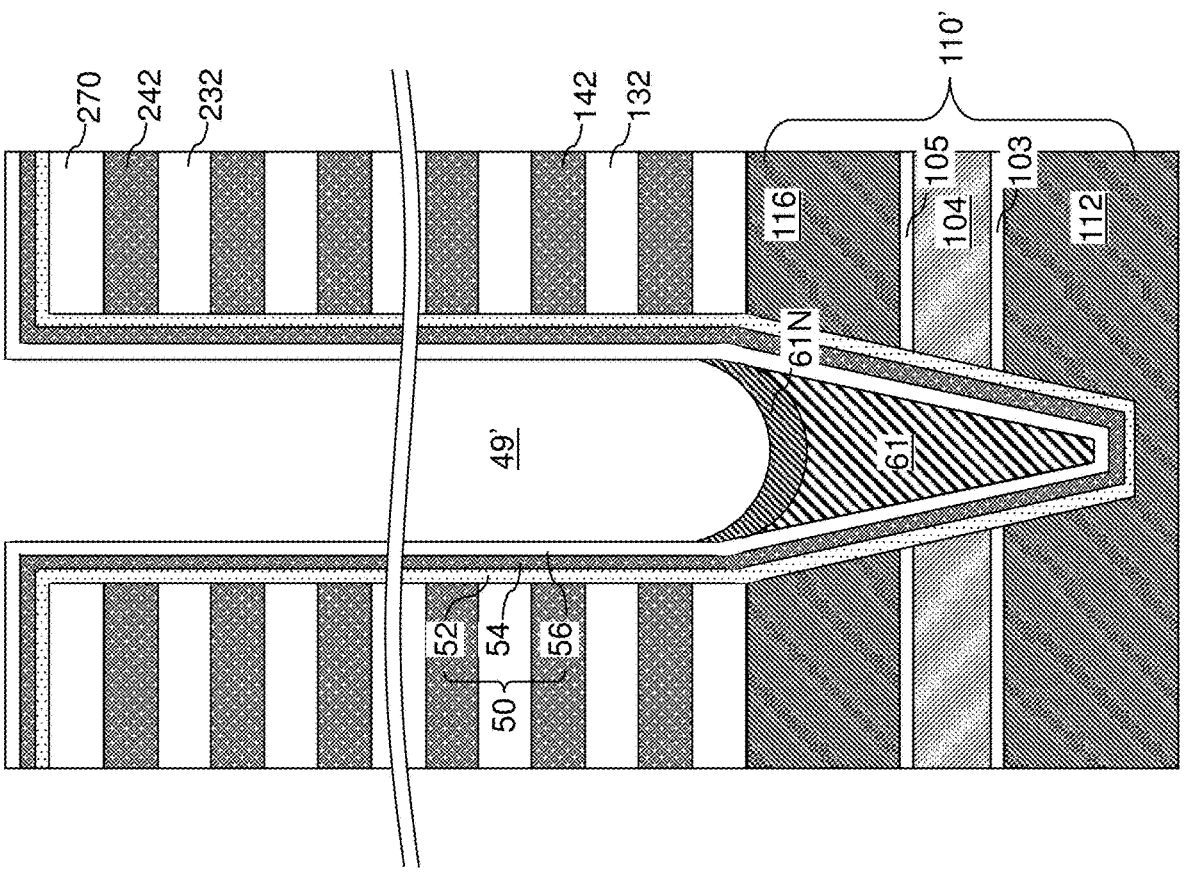
FIGS. 12A-12C illustrate sequential vertical cross-sectional views of a memory opening during formation of a memory opening fill structure having a fourth configuration according to an embodiment of the present disclosure.
Figure 12B:
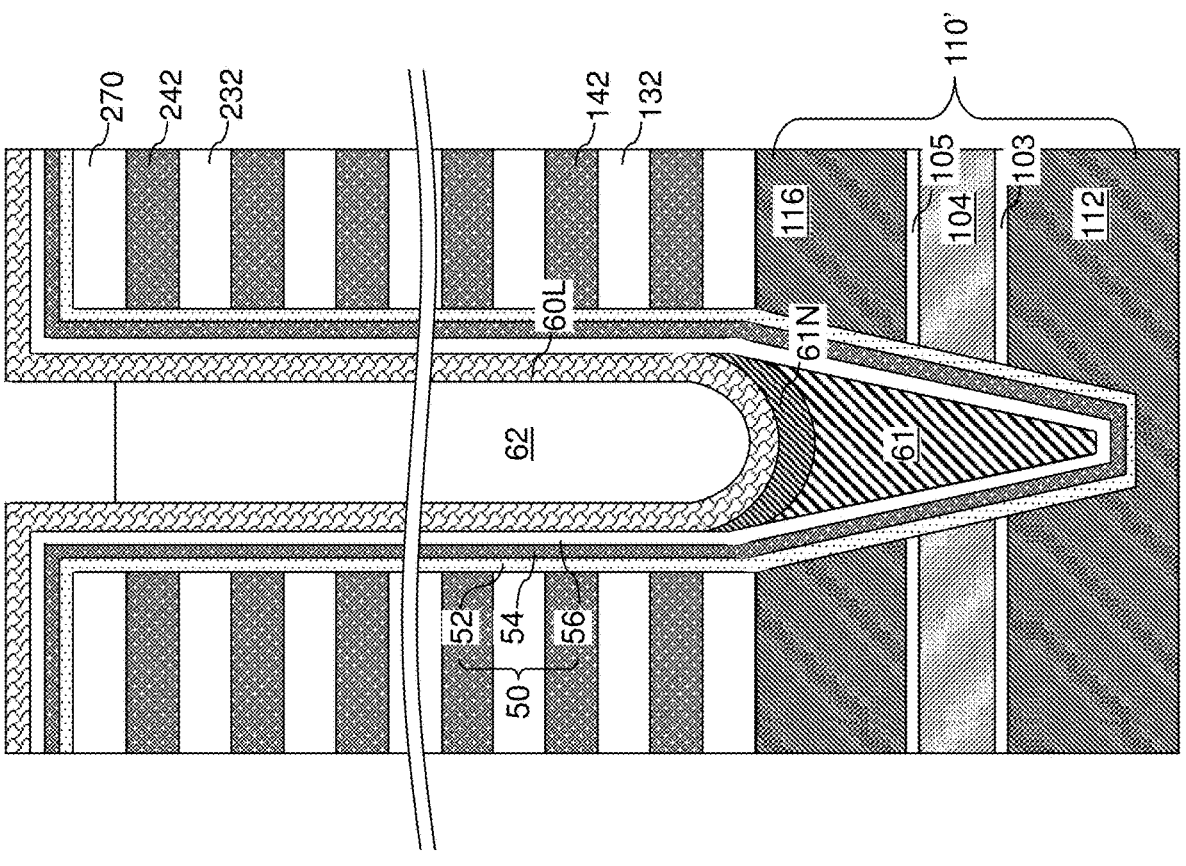
Figure 12C:
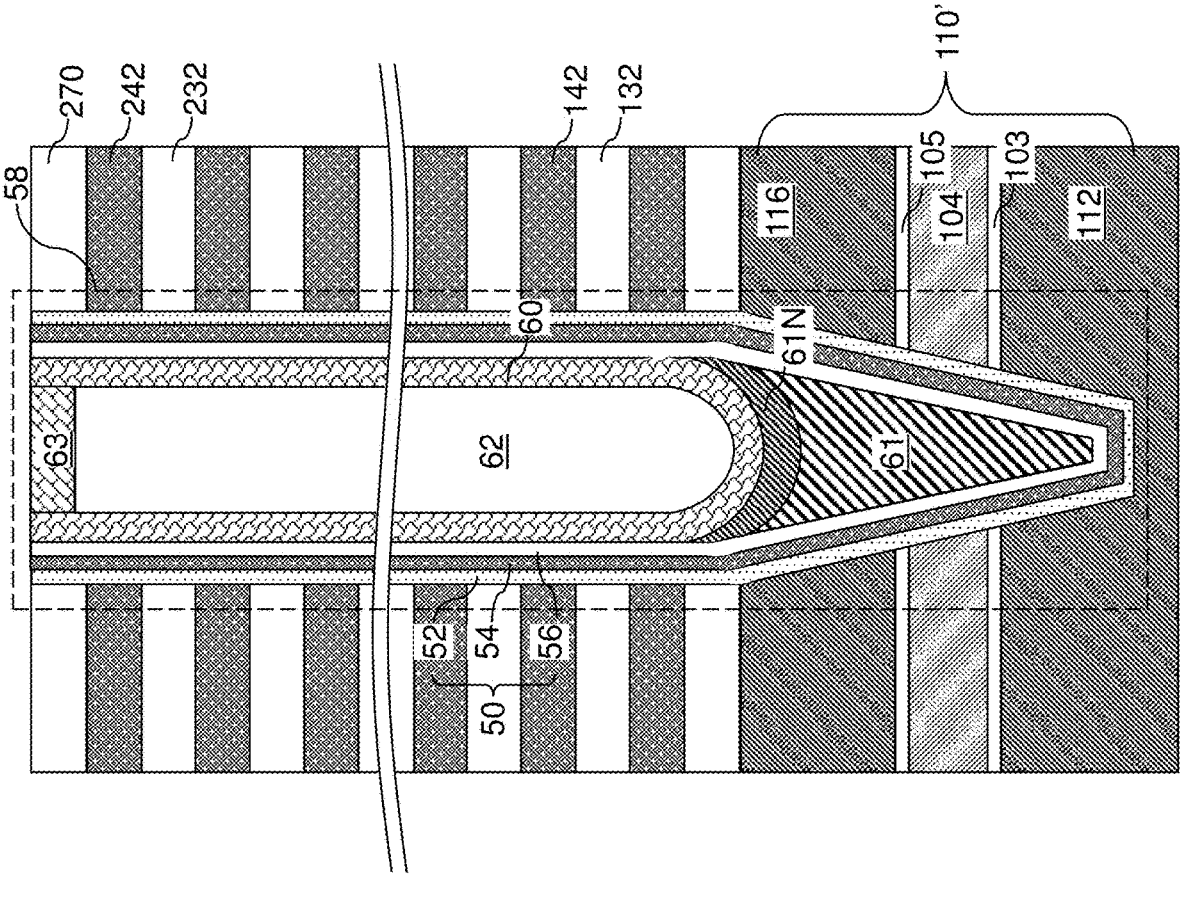

FIGS. 12A-12C illustrate sequential vertical cross-sectional views of a memory opening during formation of a memory opening fill structure having a fourth configuration according to a fourth embodiment of the present disclosure.

Referring to FIG. 12A, the fourth configuration of the memory opening fill structure 58 can be derived from the first configuration of the exemplary structure illustrated in FIG. 9D by forming a second-conductivity-type doped semiconductor material portion 61N on the physically exposed concave surface of the conical source pedestal 61. The second-conductivity-type doped semiconductor material portion 61N is a doped semiconductor material portion having a doping of the second conductivity type. In an illustrative example, if the conical source pedestal 61 has n-type doping, the second-conductivity-type doped semiconductor material portion 61N can have n-type doping.

According to an aspect of the present disclosure, the second-conductivity-type doped semiconductor material portion 61N can be formed by performing a selective semiconductor deposition process that grows a semiconductor material from the physically exposed convex surface of the conical source pedestal 61 while suppressing growth of the semiconductor material from physically exposed surfaces of the memory film 50. Alternatively, the second-conductivity-type doped semiconductor material portion 61N may be formed by conformally depositing a second-conductivity-type doped semiconductor material layer in the memory opening 49 on the conical source pedestal 61, followed by an isotropic etch back step to leave only the second-conductivity-type doped semiconductor material portion 61N on the conical source pedestal 61.

The second-conductivity-type doped semiconductor material portion 61N may be formed with in-situ doping of dopants of the second conductivity type, and/or may be subsequently doped with dopants of the second conductivity type by implanting dopants of the second conductivity type into a deposited semiconductor material portion that is formed by the selective semiconductor deposition process. In the fourth embodiment, second-conductivity-type doped semiconductor material portion 61N may have a higher n-type doping concentration then the conical source pedestal 61. For example, the atomic concentration of dopants of the second conductivity type in the second-conductivity-type doped semiconductor material portion 61N may be in a range from $1.0 \times 10^{18}/\text{cm}^3$ to $2.0 \times 10^{21}/\text{cm}^3$, such as from $5.0 \times 10^{18}/\text{cm}^3$ to $5.0 \times 10^{20}/\text{cm}^3$. The atomic concentration of dopants of the second conductivity type in the conical source pedestal 61 may be in a range from $1.0 \times 10^{16}/\text{cm}^3$ to $1.0 \times 10^{21}/\text{cm}^3$, such as from $1.0 \times 10^{17}/\text{cm}^3$ to $1.0 \times 10^{20}/\text{cm}^3$. In one embodiment, the second-conductivity-type doped semiconductor material portion 61N may comprise heavily phosphorus doped amorphous silicon, and the conical source pedestal 61 may comprise a lightly phosphorus doped amorphous silicon. The thickness of the second-conductivity-type doped semiconductor material portion 61N may be in a range from 3 nm to 100 nm, such as from 10 nm to 30 nm, although lesser and greater thicknesses may also be employed.

Referring to FIG. 12B, the processing steps described with reference to FIG. 9E can be performed to form a semiconductor channel material layer 60L and a dielectric core 62 in each memory opening 49.

Referring to FIG. 12C, the processing steps described with reference to FIG. 9F can be performed to form a drain region 63 and a memory stack structure (50, 60) within each memory opening 49.

Figure 13:
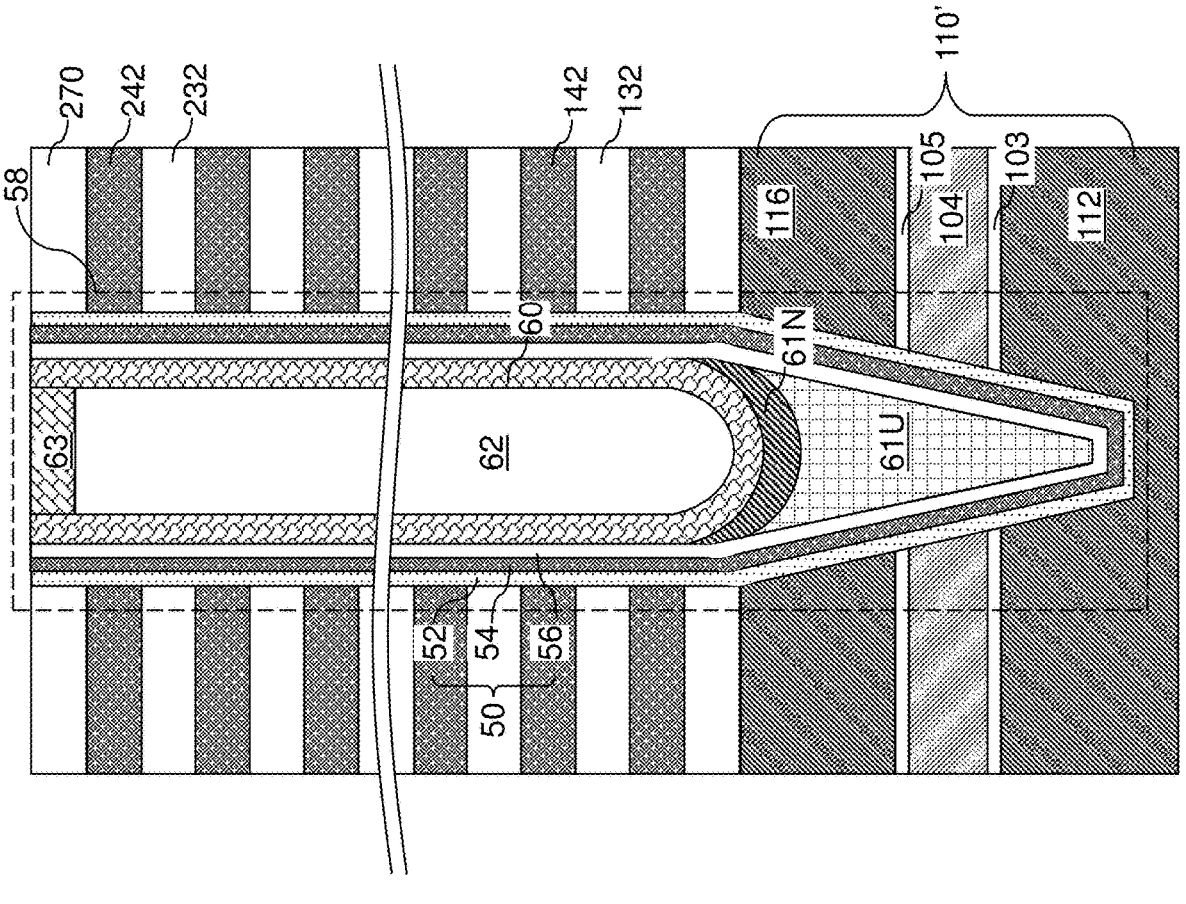
FIG. 13 is a vertical cross-sectional view of a memory opening fill structure having a fifth configuration according to an embodiment of the present disclosure.

FIG. 13 is a vertical cross-sectional view of a memory opening fill structure 58 having a fifth configuration according to a fifth embodiment of the present disclosure. The fifth configuration of the memory opening fill structure 58 can be derived from the fourth configuration of the memory opening fill structure 58 illustrated in FIG. 12C by forming an undoped conical source pedestal 61U (e.g., a pedestal comprising an intrinsic semiconductor material, such as undoped amorphous silicon) instead of the second conductivity type conical source pedestal 61. The net atomic concentration of dopants in the undoped conical source pedestal 61U may be less than $1.0 \times 10^{16}/\text{cm}^3$, and/or less than $1.0 \times 10^{15}/\text{cm}^3$, and/or less than $1.0 \times 10^{14}/\text{cm}^3$, and/or less than $1.0 \times 10^{13}/\text{cm}^3$. The undoped conical source pedestal 61U may be formed using the same step(s) as the doped conical source pedestal 61, but using an undoped semiconductor material instead of a second-conductivity type doped semiconductor material. Subsequently, the processing steps described with reference to FIGS. 12B and 12C can be performed to provide the fifth configuration of the memory opening fill structure illustrated in FIG. 13.

Figure 14:
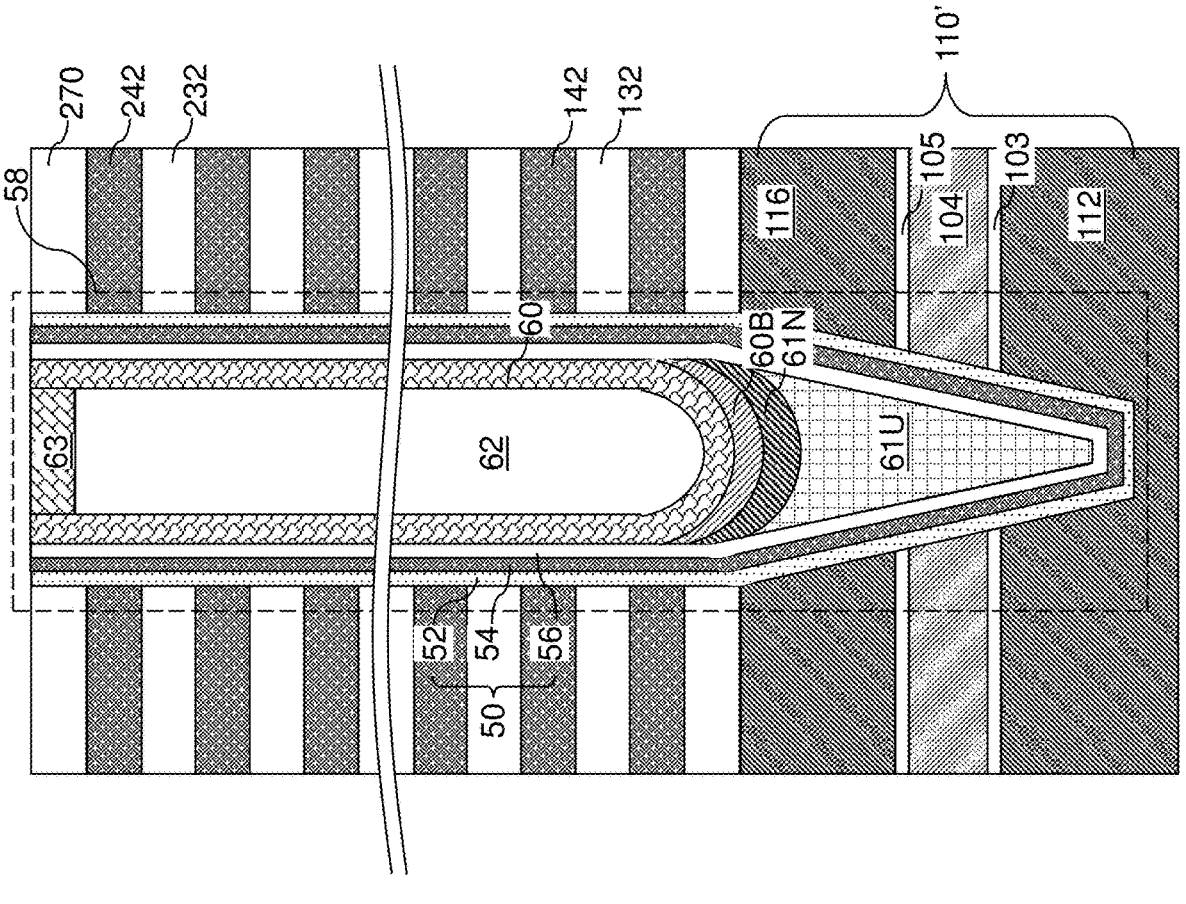
FIG. 14 is a vertical cross-sectional view of a memory opening fill structure having a sixth configuration according to an embodiment of the present disclosure.

FIG. 14 is a vertical cross-sectional view of a memory opening fill structure 58 having a sixth configuration according to a sixth embodiment of the present disclosure. The sixth configuration of the memory opening fill structure 58 can be derived from the fifth configuration of the memory opening fill structure 58 illustrated in FIG. 13 by forming a first-conductivity-type doped semiconductor material portion 60B directly on the second-conductivity-type doped semiconductor material portion 61N. The first-conductivity-type doped semiconductor material portion 60P may be formed by selective or non-selective deposition and etch back, as described with reference to FIG. 11A.

Figure 15:
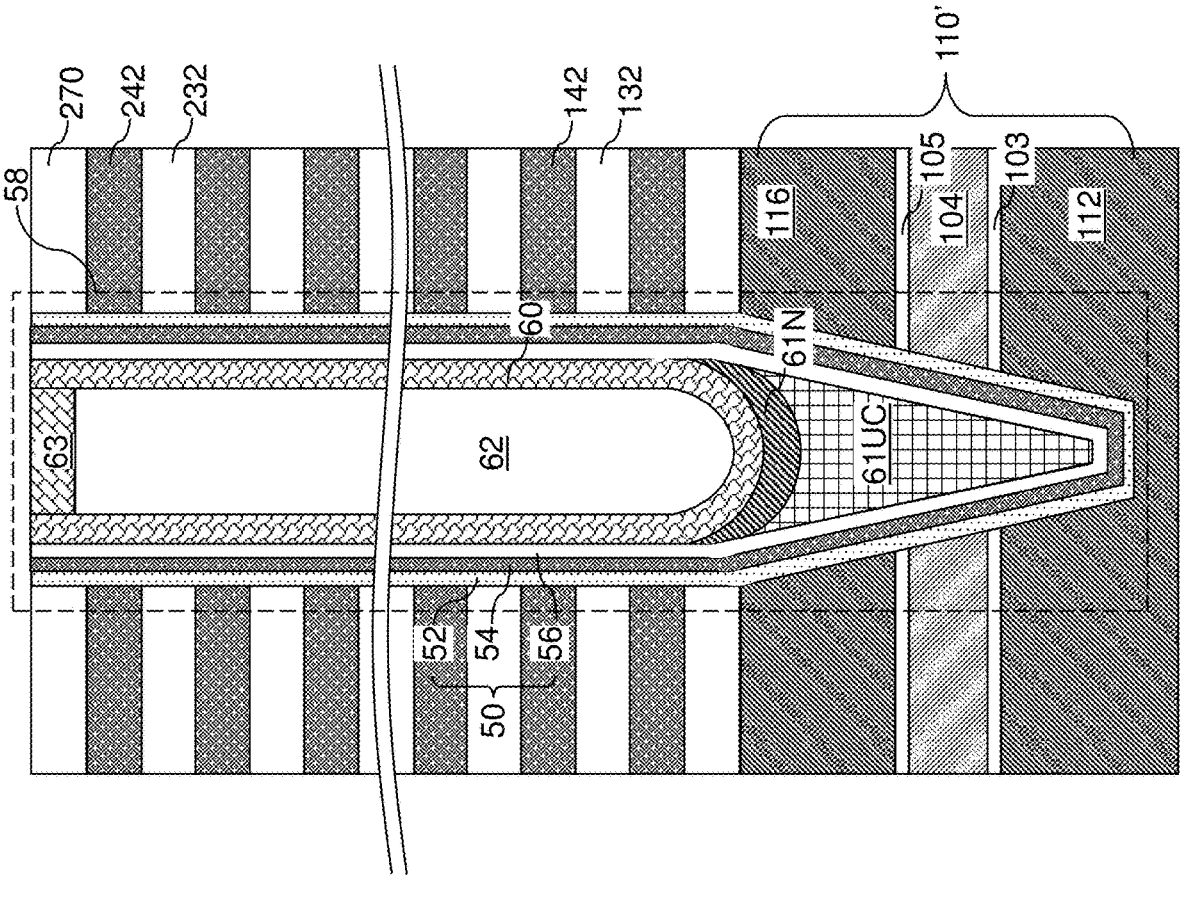
FIG. 15 is a vertical cross-sectional view of a memory opening fill structure having a seventh configuration according to an embodiment of the present disclosure.

FIG. 15 is a vertical cross-sectional view of a memory opening fill structure 58 having a seventh configuration according to a seventh embodiment of the present disclosure. The seventh configuration of the memory opening fill structure 58 can be derived from the fifth configuration of the memory opening fill structure of FIG. 13 by adding carbon doping to the undoped conical source pedestal to form a carbon doped conical source pedestal 61UC that is not intentionally doped with first or second conductivity dopants. In this case, the carbon doped conical source pedestal 61UC may comprise carbon at an atomic concentration in a range from $1.0 \times 10^{16}/\text{cm}^3$ to $1.0 \times 10^{21}/\text{cm}^3$. For example, the carbon doped conical source pedestal 61UC may comprise carbon doped amorphous silicon which contains less than $1.0 \times 10^{16}/\text{cm}^3$ of boron, phosphorus, arsenic or antimony.

Referring collectively to FIGS. 9F, 10, 11C, 12C, 13, 14 and 15, a memory opening fill structure 58 comprising a conical source pedestal (61, 61C, 61U, 61UC) is formed. Each memory opening fill structure 58 can be located in a respective memory opening 49, and comprises a memory film 50, a conical source pedestal (61, 61C, 61U, 61UC) comprising a third semiconductor material, and a vertical semiconductor channel 60 overlying the conical source pedestal (61, 61C, 61U, 61UC), comprising a fourth semiconductor material that is different from the third semiconductor material, and contacting an inner sidewall of the memory film 50.

In one embodiment, the memory film 50 contacts the upper source-level semiconductor layer 116 at a tapered annular interface having a variable lateral extent that increases with a vertical distance from the substrate 8. In one embodiment, the conical source pedestal (61, 61C, 61U, 61UC) comprises a concave top surface having a periphery that adjoined an inner sidewall of the memory film 50.

In one embodiment, a bottommost portion of the concave top surface of the conical source pedestal (61, 61C, 61U, 61UC) is located between a first horizontal plane including a bottom surface of the upper source-level semiconductor layer 116 and a second horizontal plane including a top surface of the upper source-level semiconductor layer 116.

In one embodiment, the conical source pedestal (61, 61C, 61U, 61UC) has a tapered sidewall surface having a variable lateral width that increases with a vertical distance from the substrate 8, and an upper portion of the tapered sidewall surface contacts a bottom portion of an inner sidewall of the memory film 50.

In the first embodiments the conical source pedestal 61 is in direct contact with a bottom surface of the vertical semiconductor channel 60. In the second and seventh embodiments, the conical source pedestal (61C, 61UC) is doped with carbon at an atomic concentration in a range from $1.0 \times 10^{16}/\text{cm}^3$ to $1.0 \times 10^{21}/\text{cm}^3$.

In the third and sixth embodiments, the memory opening fill structure 58 comprises a doped semiconductor material portion 60B interposed between the conical source pedestal (61, 61U) and the vertical semiconductor channel 60, having a doping of a same conductivity type as the vertical semiconductor channel 60, and including dopants of a first conductivity type at an atomic concentration that is greater than an atomic concentration of dopants of the first conductivity type in the vertical semiconductor channel 60.

In the fourth, fifth, sixth and seventh embodiments, the vertical semiconductor channel 60 has a doping of a first conductivity type; and the memory opening fill structure 58 comprises a doped semiconductor material portion 61N interposed between the conical source pedestal (61, 61U, 61UC) and the vertical semiconductor channel 60, having a doping of a second conductivity type that is an opposite of the first conductivity type, and including dopants of the second conductivity type at an atomic concentration greater than an average atomic concentration of dopants of the second conductivity type in the conical source pedestal (61, 61U, 61UC).

Figure 16A:
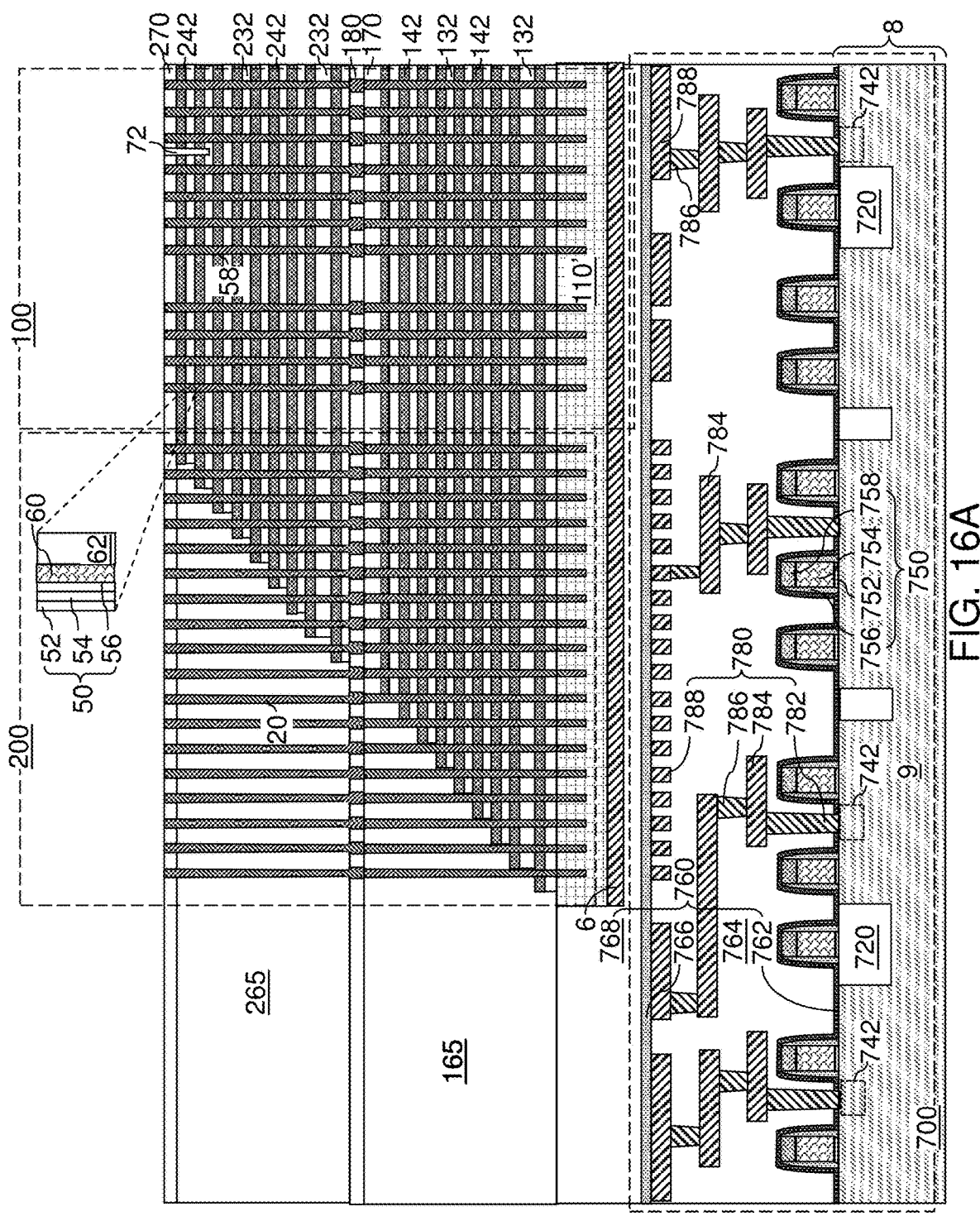
FIG. 16A is a vertical cross-sectional view of the exemplary structure after formation of memory opening fill structures and support pillar structures according to an embodiment of the present disclosure.
Figure 16B:
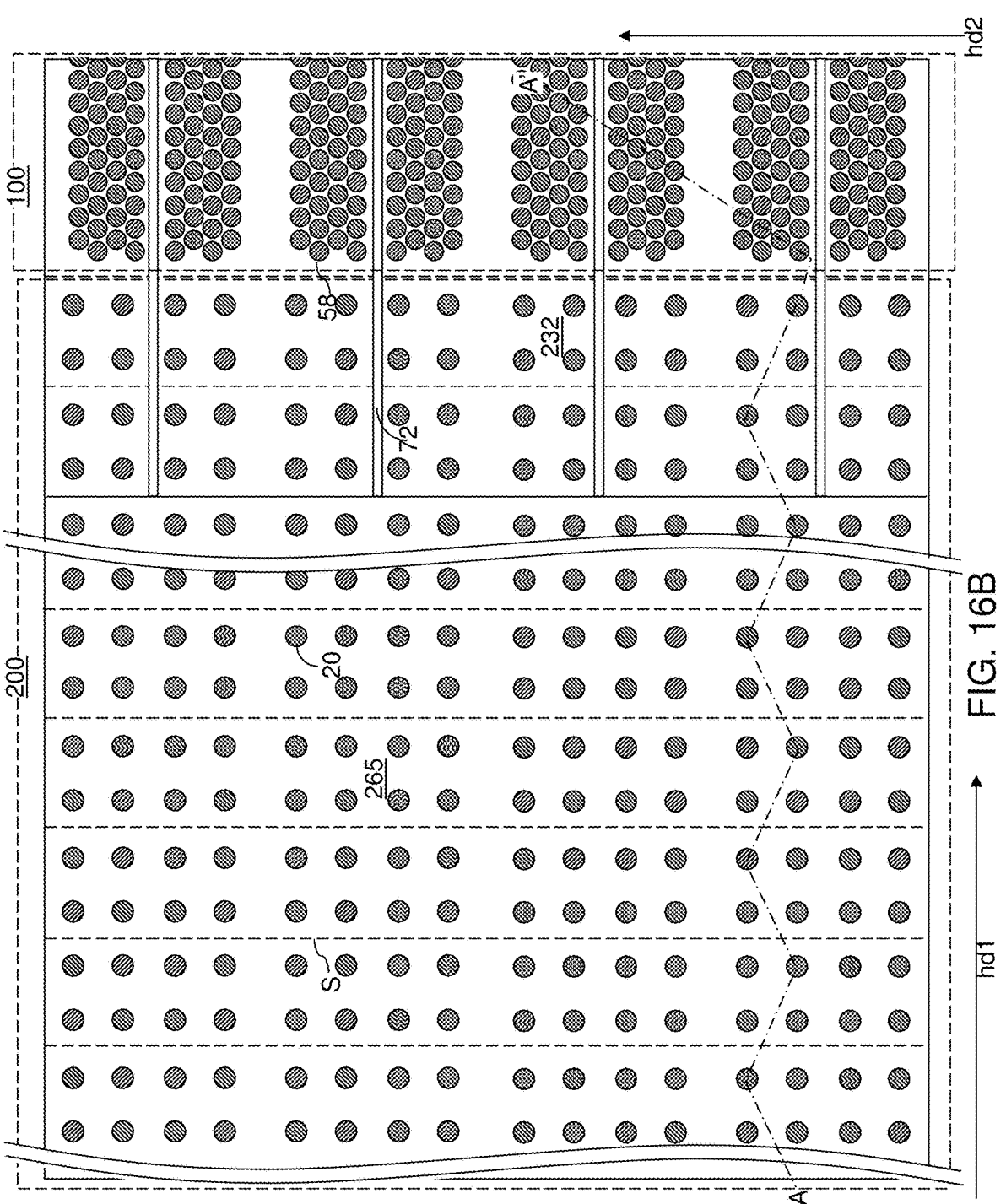
FIG. 16B is a horizontal cross-sectional view of the exemplary structure along the horizontal plane B-B' of FIG. 16A. The hinged vertical plane A-A' corresponds to the plane of the vertical cross-sectional view of FIG. 16A.

Referring to FIGS. 16A and 16B, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 17A:
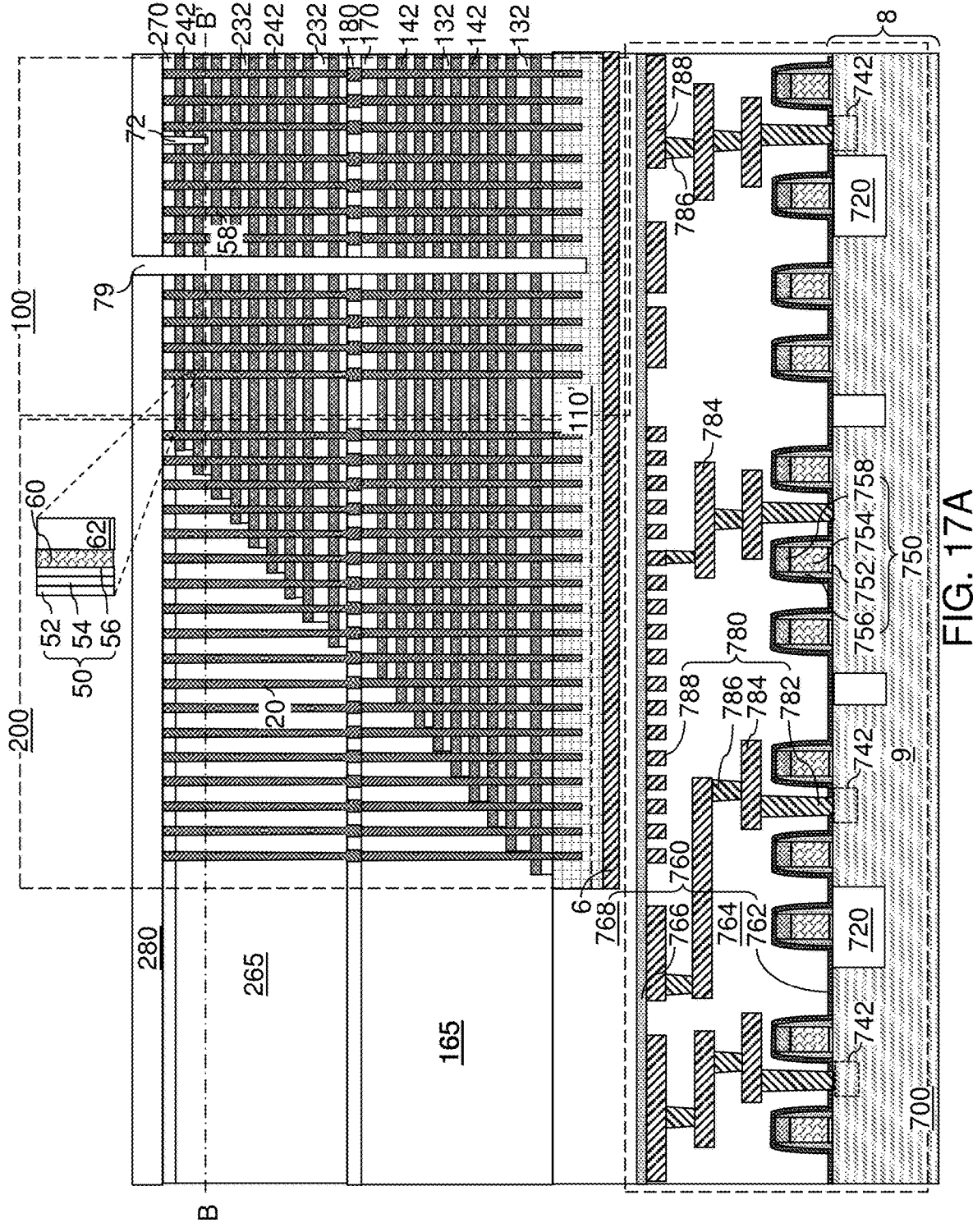
FIG. 17A is a vertical cross-sectional view of the exemplary structure after formation of a first contact-level dielectric layer and backside trenches according to an embodiment of the present disclosure.
Figure 17B:
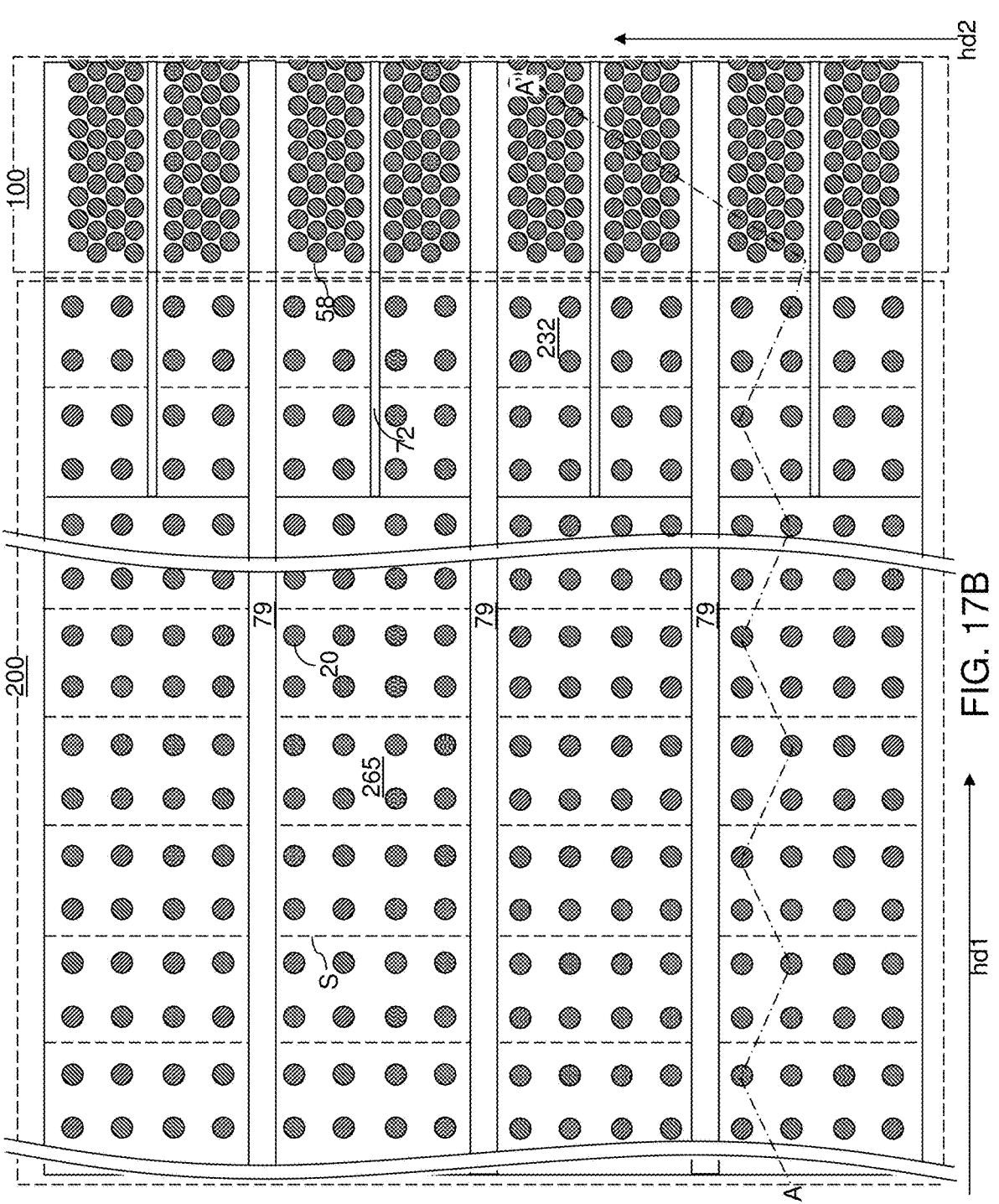
FIG. 17B is a horizontal cross-sectional view of the exemplary structure along the horizontal plane B-B' of FIG. 17A. The hinged vertical plane A-A' corresponds to the plane of the vertical cross-sectional view of FIG. 17A.

Referring to FIGS. 17A and 17B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures (50, 60). The clusters of the memory stack structures (50, 60) may be laterally spaced apart along the second horizontal direction hd2 by the backside trenches 79.

FIGS. 18A-18E illustrate sequential vertical cross-sectional views of memory opening fill structures 58 and a backside trench 79 during formation of source-level material layers 110 according to an embodiment of the present disclosure.

Figure 18A:
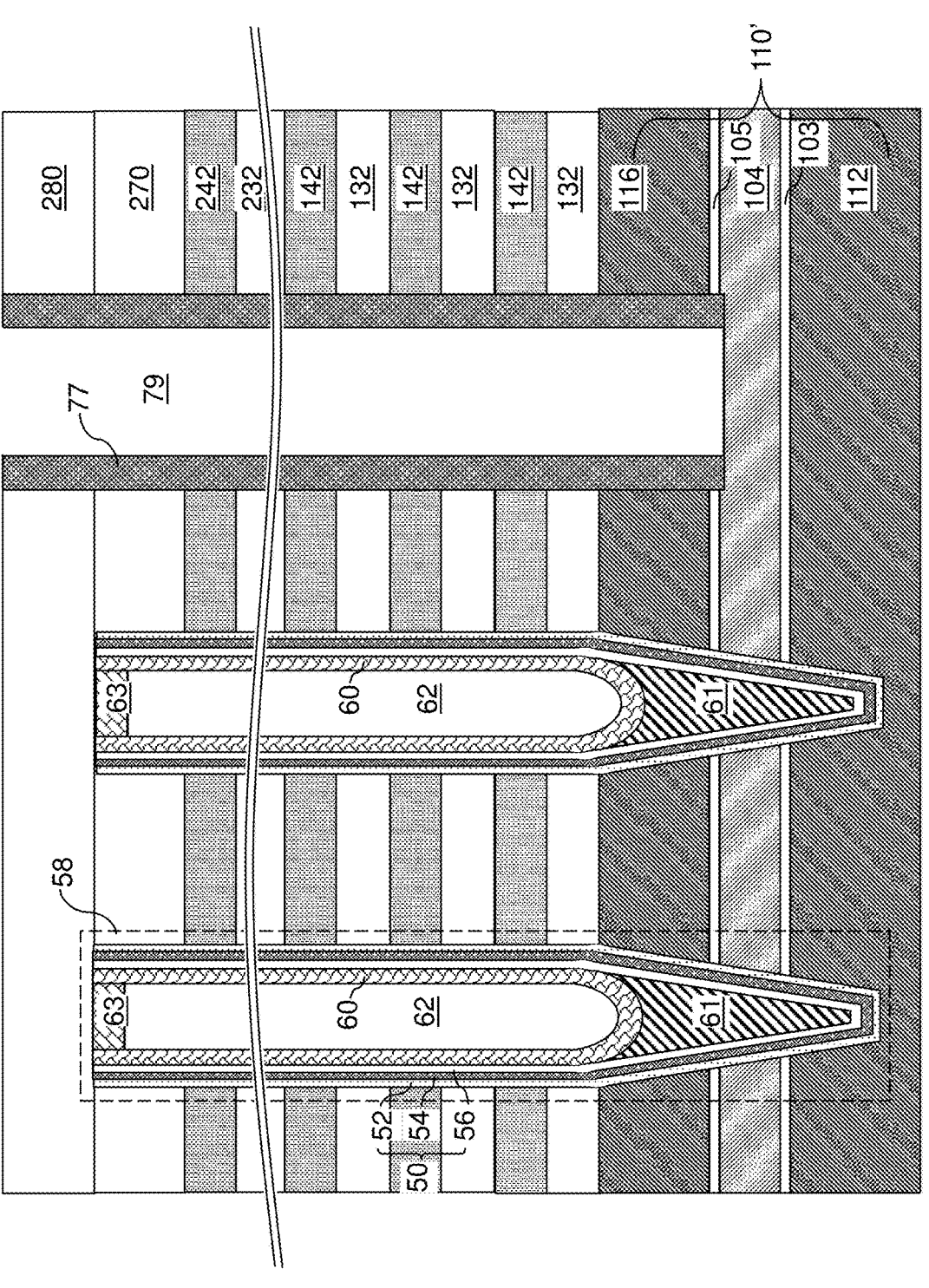
FIGS. 18A-18E illustrate sequential vertical cross-sectional views of memory opening fill structures and a backside trench during formation of source-level material layers according to an embodiment of the present disclosure.

Referring to FIG. 18A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 18B:
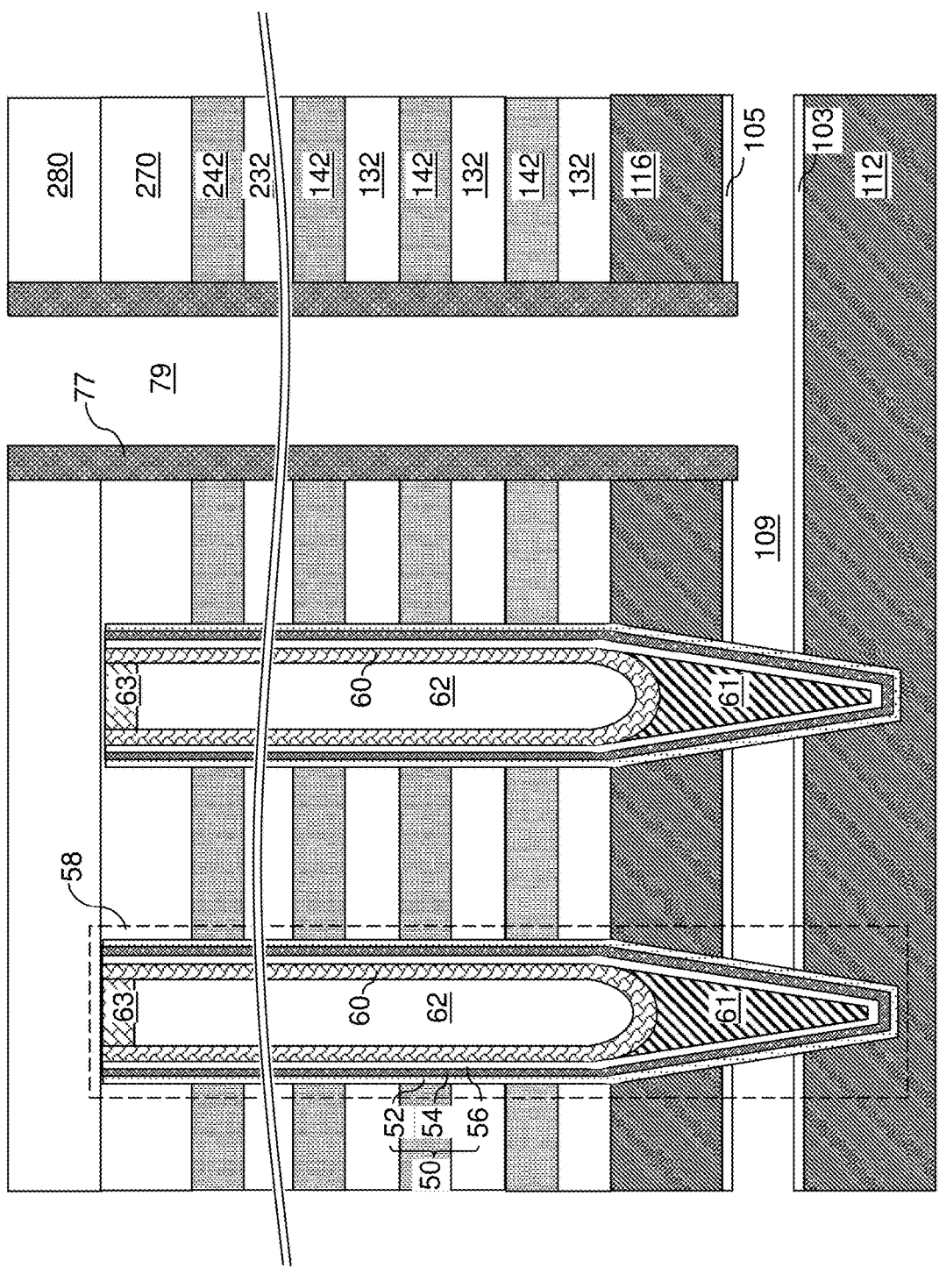

Referring to FIG. 18B, an etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 18C:
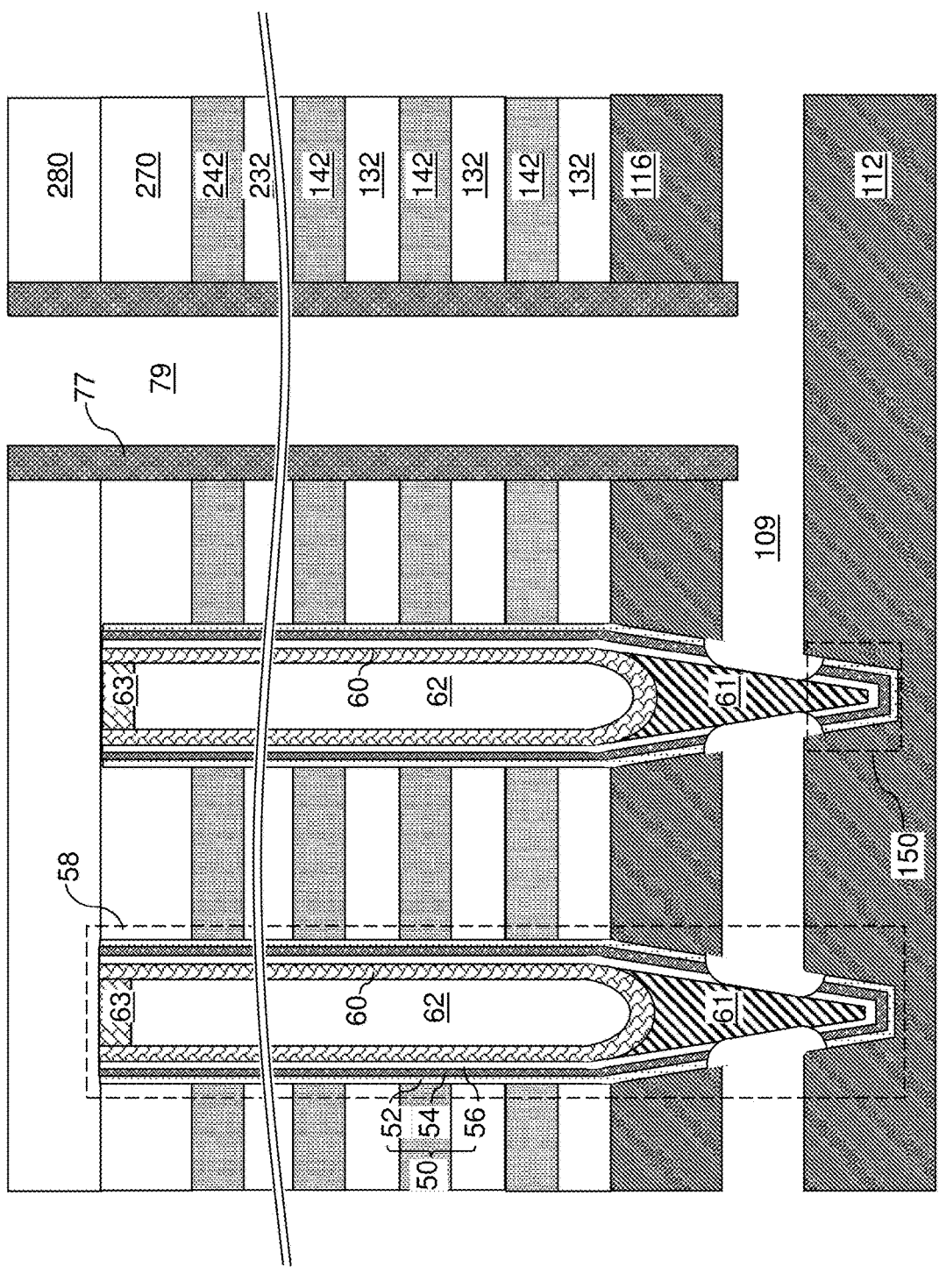

Referring to FIG. 18C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. A remaining portion of each memory film 50 laterally surrounds a respective vertical semiconductor channel 60, and may have an annular concave tapered bottom surface that is physically exposed to the source cavity 109. Another remaining portion of each memory film 50 that is embedded in the lower source-level semiconductor layer 112 is hereafter referred to as a bottom capping structure 150. The bottom capping structure 150 includes a layer stack containing a same set of component material layers as the memory film 50, and is vertically spaced from the memory film 50 by the source cavity 109.

The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 18D:
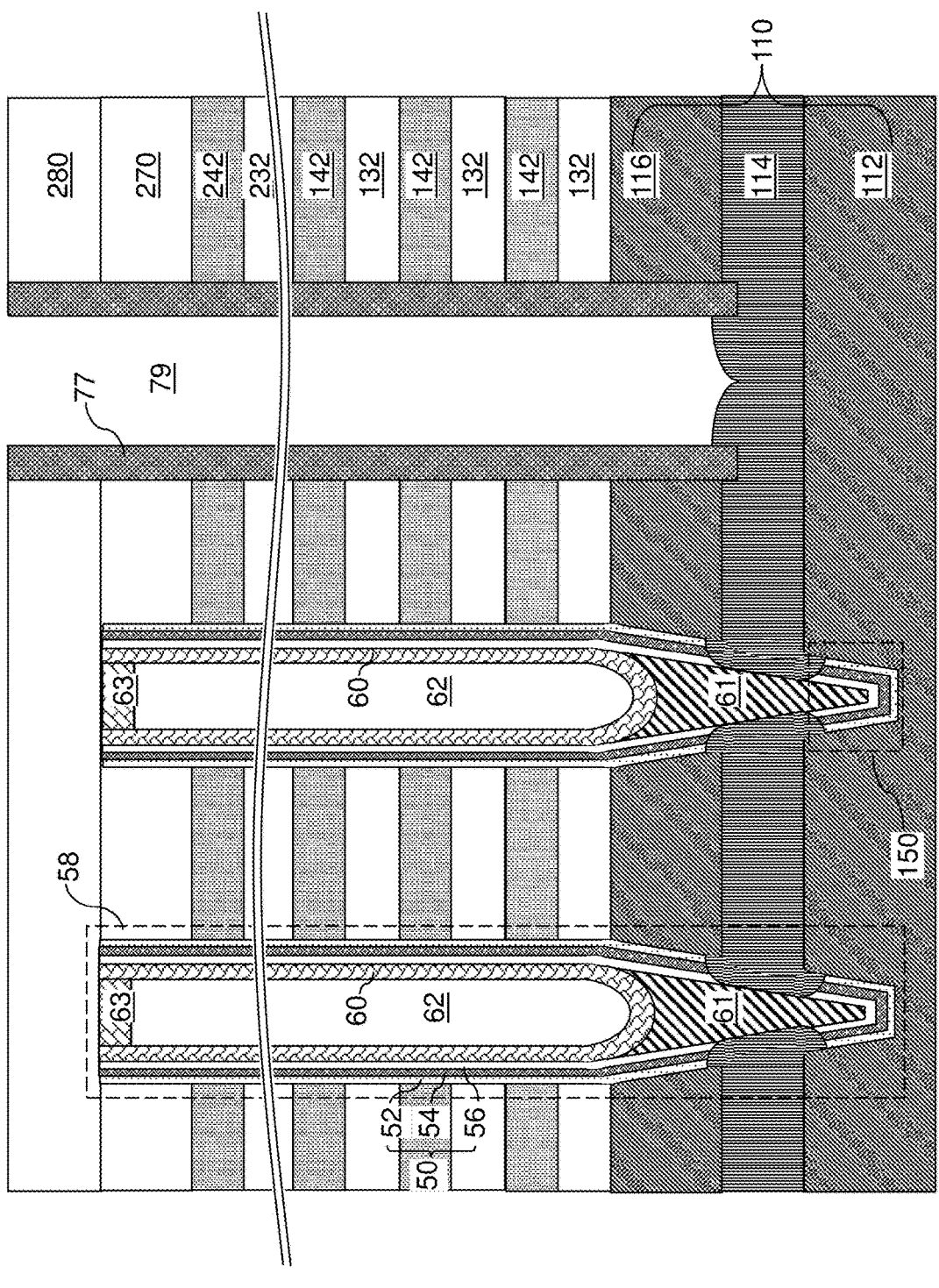

Referring to FIG. 18D, a fifth semiconductor material having a doping of the second conductivity type may be deposited on the physically exposed semiconductor surfaces around the source cavity 109. The physically exposed semiconductor surfaces include bottom portions of tapered (i.e., conical) outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, m such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114. In one embodiment, each memory film 50 comprises an annular concave tapered bottom surface that contacts a respective annular convex surface segment of the source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 18E:
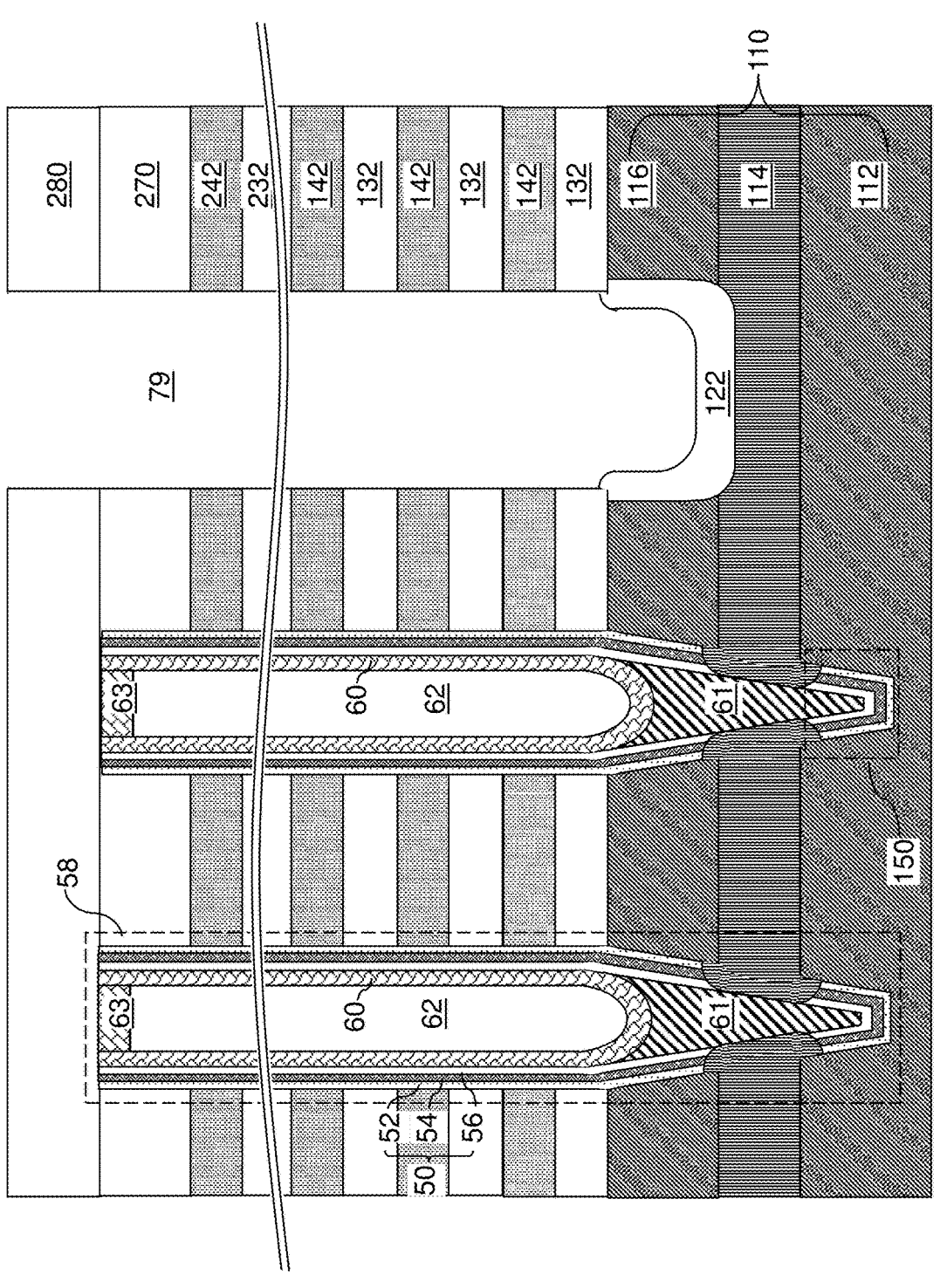
Figure 19:
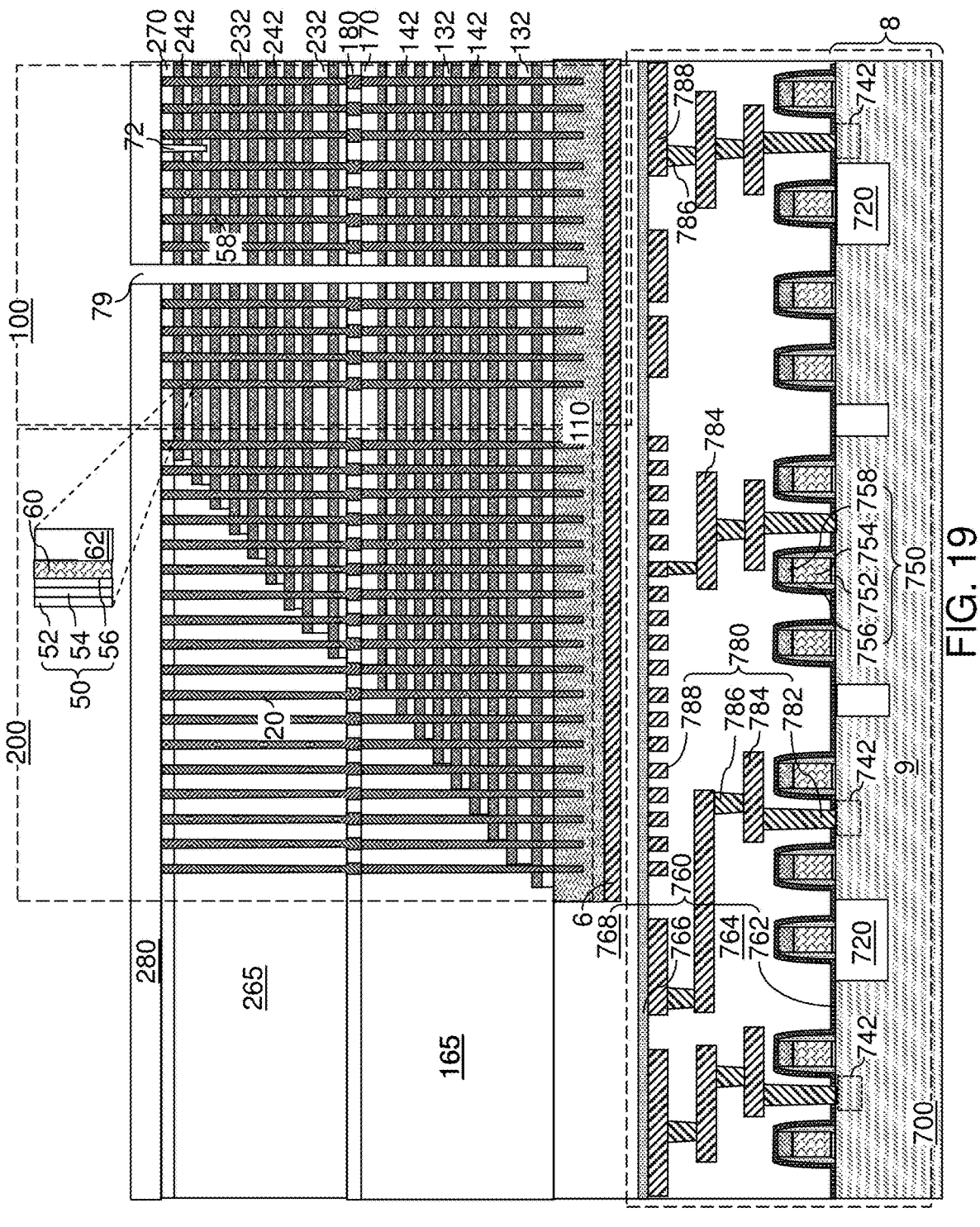
FIG. 19 is a vertical cross-sectional view of the exemplary structure after formation of source-level material layers according to an embodiment of the present disclosure.

Referring to FIGS. 18E and 19, the backside trench spacers 77 may be removed selective to the insulating layers (132, 232), the first and second insulating cap layers (170, 270), the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the first and second insulating cap layers (170, 270), the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 20:
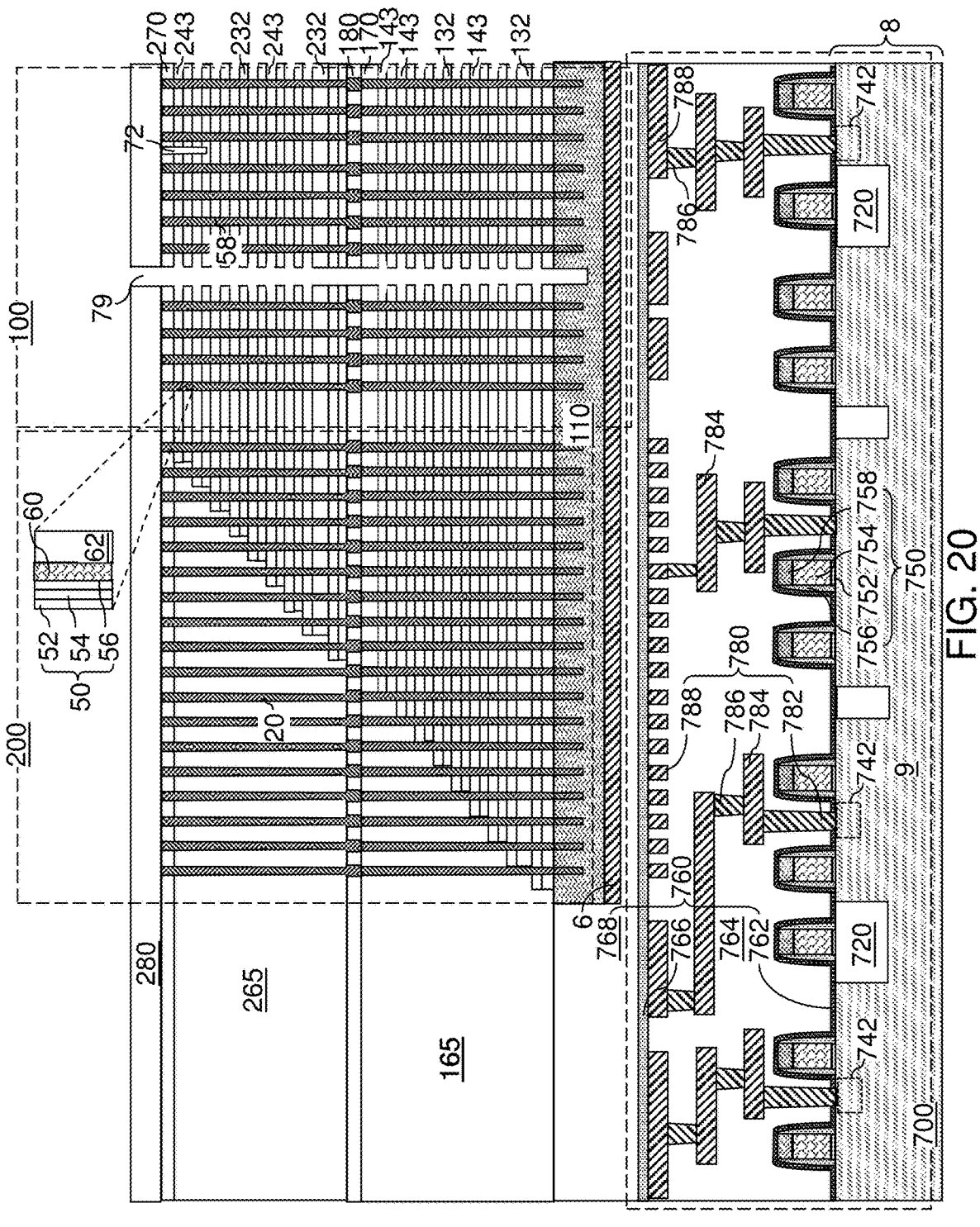
FIG. 20 is a vertical cross-sectional view of the exemplary structure after formation of backside recesses according to an embodiment of the present disclosure.

Referring to FIG. 20, the sacrificial material layers (142, 242) are removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. In one embodiment, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 21A:
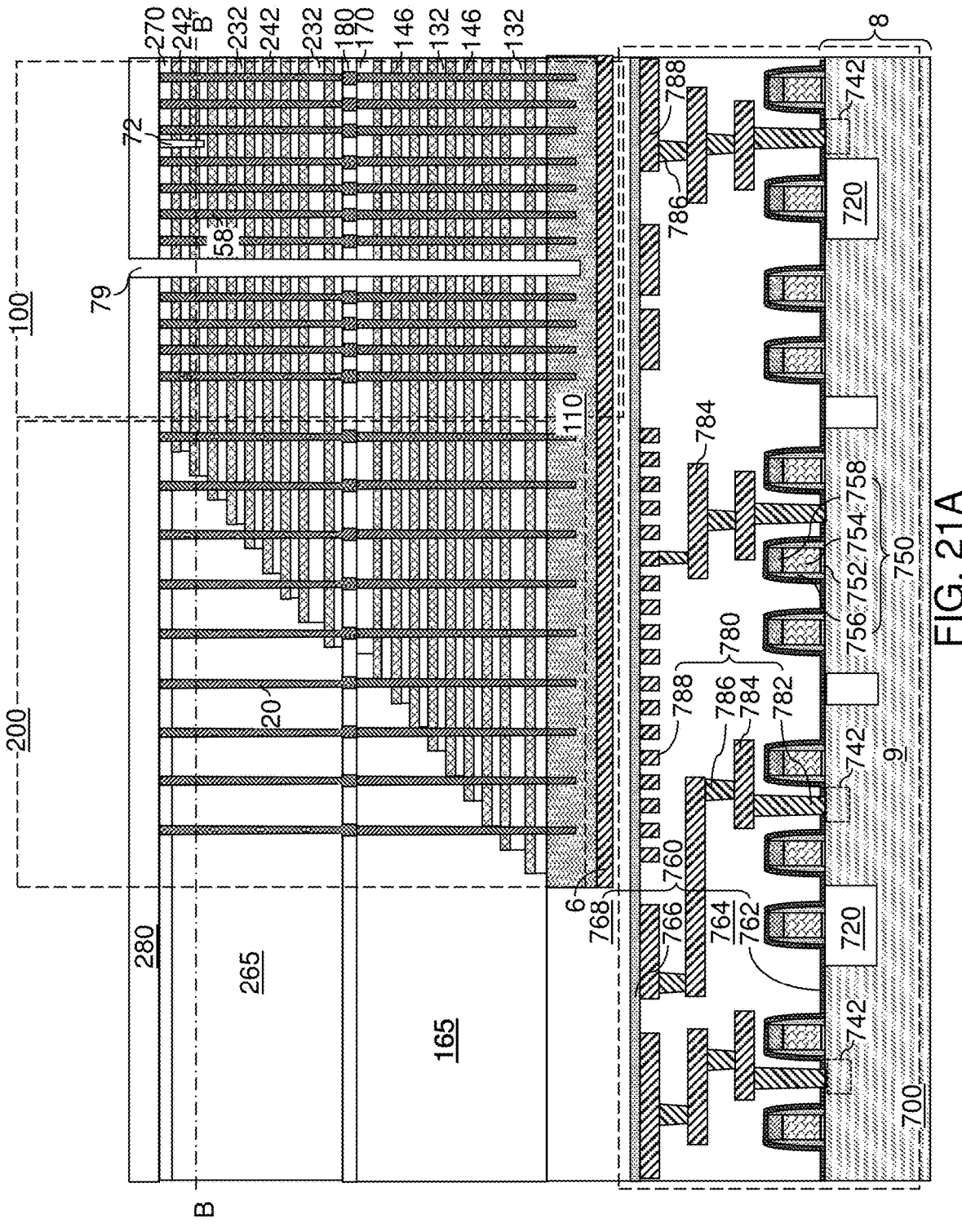
FIG. 21A is a vertical cross-sectional view of the exemplary structure after formation of electrically conductive layers according to an embodiment of the present disclosure.
Figure 21B:
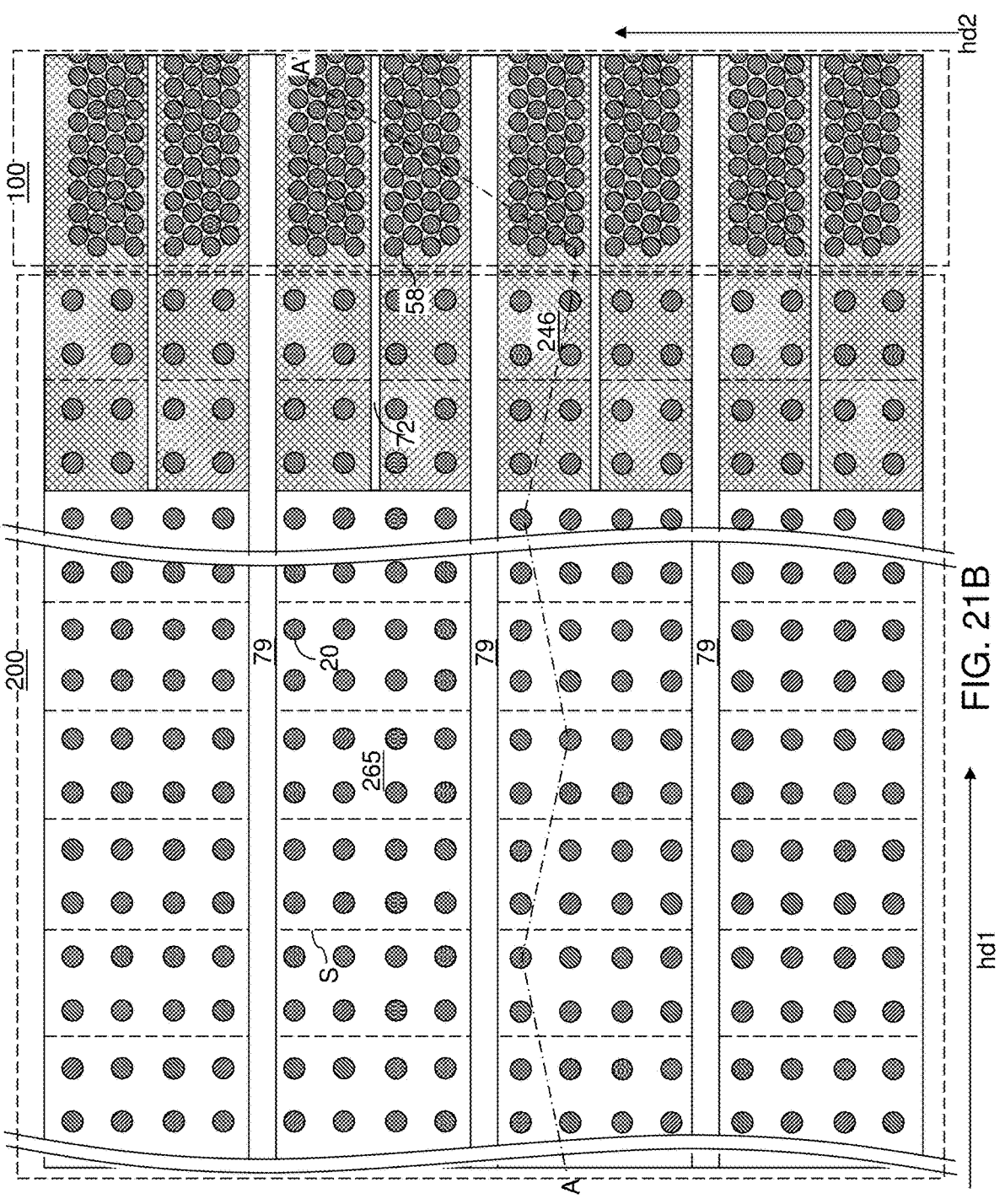
FIG. 21B is a horizontal cross-sectional view of the exemplary structure along the horizontal plane B-B' of FIG. 21A. The hinged vertical plane A-A' corresponds to the plane of the vertical cross-sectional view of FIG. 21A.

Referring to FIGS. 21A and 21B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure (50, 60).

Each of the memory stack structures (50, 60) comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures (50, 60) vertically extending through the at least one alternating stack (132, 146, 232, 246).

Figure 22A:
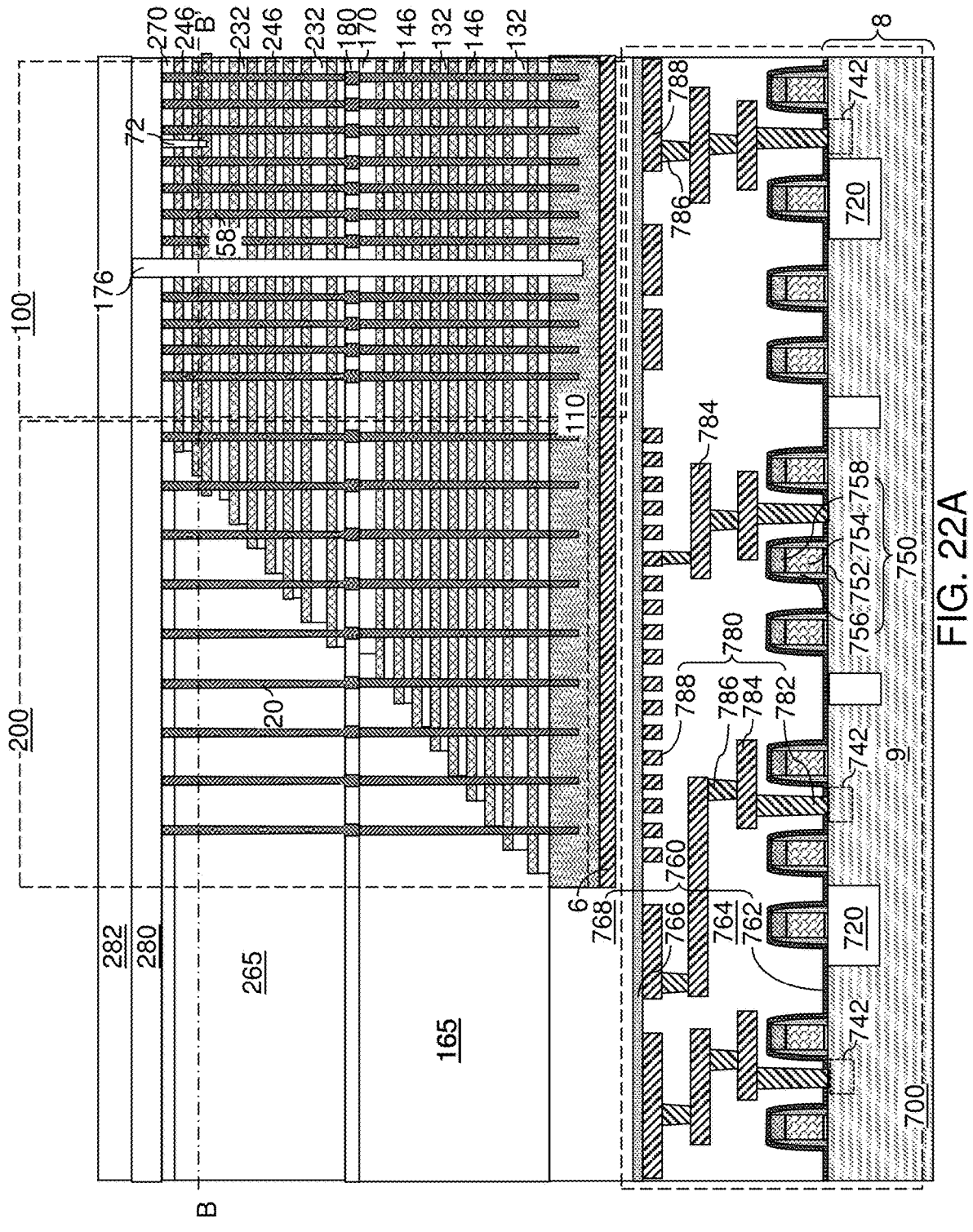
FIG. 22A is a vertical cross-sectional view of the exemplary structure after formation of backside trench fill structures in the backside trenches according to an embodiment of the present disclosure.
Figure 22B:
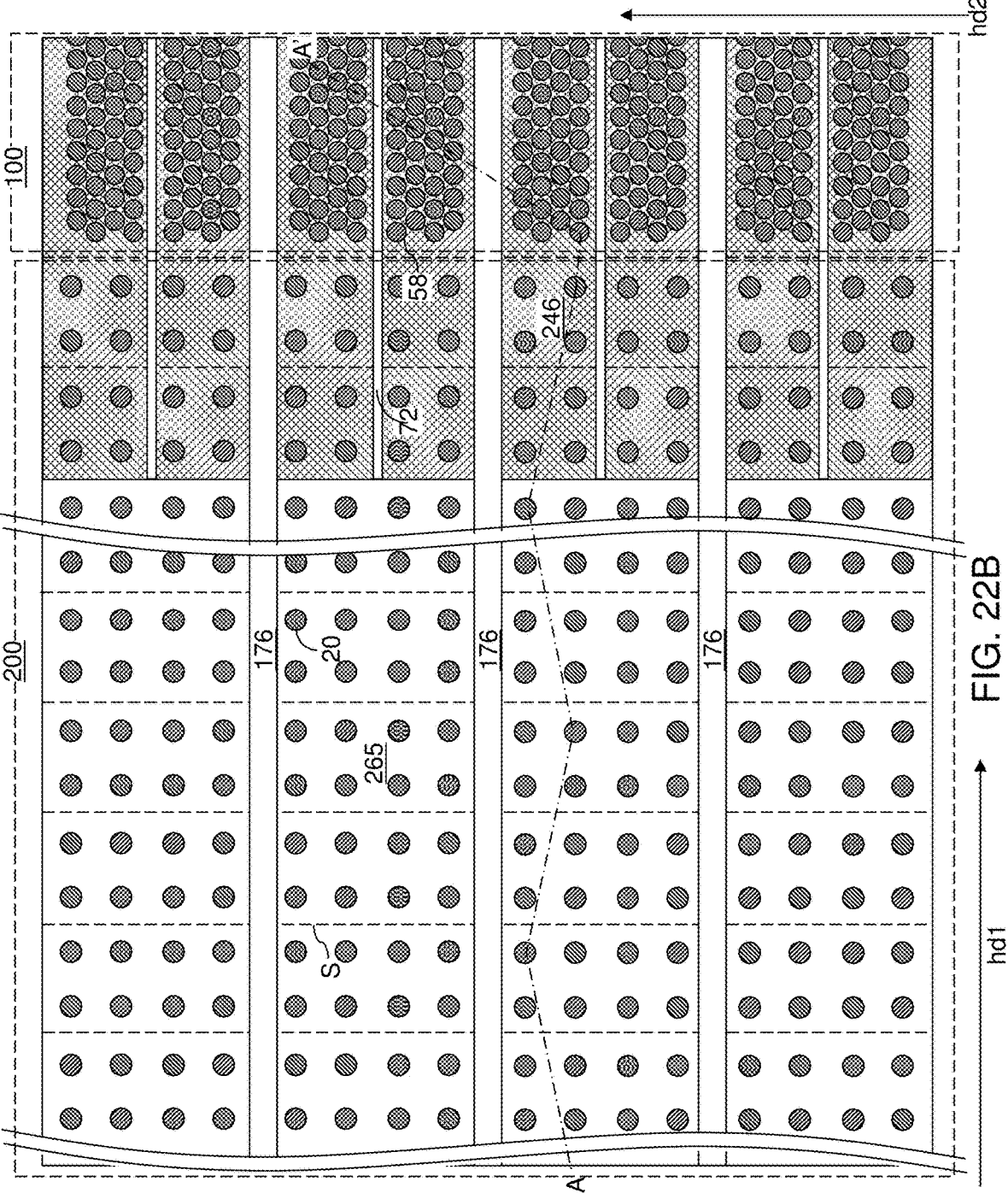
FIG. 22B is a horizontal cross-sectional view of the exemplary structure along the horizontal plane B-B' of FIG.

Referring to FIGS. 22A and 22B, a dielectric fill material may be conformally deposited in the backside trenches 79 and over the first contact-level dielectric layer 280 by a conformal deposition process. The dielectric fill material may include, for example, silicon oxide. Vertically-extending portions of the dielectric fill material that fill the backside trenches 79 constitute backside trench fill structures 176. A horizontally-extending portion of the dielectric fill material that overlies the first contact-level dielectric layer 280 comprises a second contact-level dielectric layer 282. The second contact-level dielectric layer 282 includes a dielectric material such as silicon oxide, and may have a thickness in a range from 100 nm to 600 nm, although lesser and greater thicknesses may also be used.

Referring to FIGS. 23A and 23B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures (50, 60).

Referring to FIG. 24, peripheral-region via cavities may be formed through the second and first contact-level dielectric layers (282, 280), the second and first retro-stepped dielectric material portions (265, 165), and the at least one second dielectric layer 768 to top surfaces of a first subset of the lower-level metal interconnect structure 780 in a connection region 400. At least one conductive material may be deposited in the peripheral-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

FIGS. 25A-25G are vertical cross-sectional views of various configuration of the memory opening fill structure 58 at the processing steps of FIG. 24.

Figure 25A:
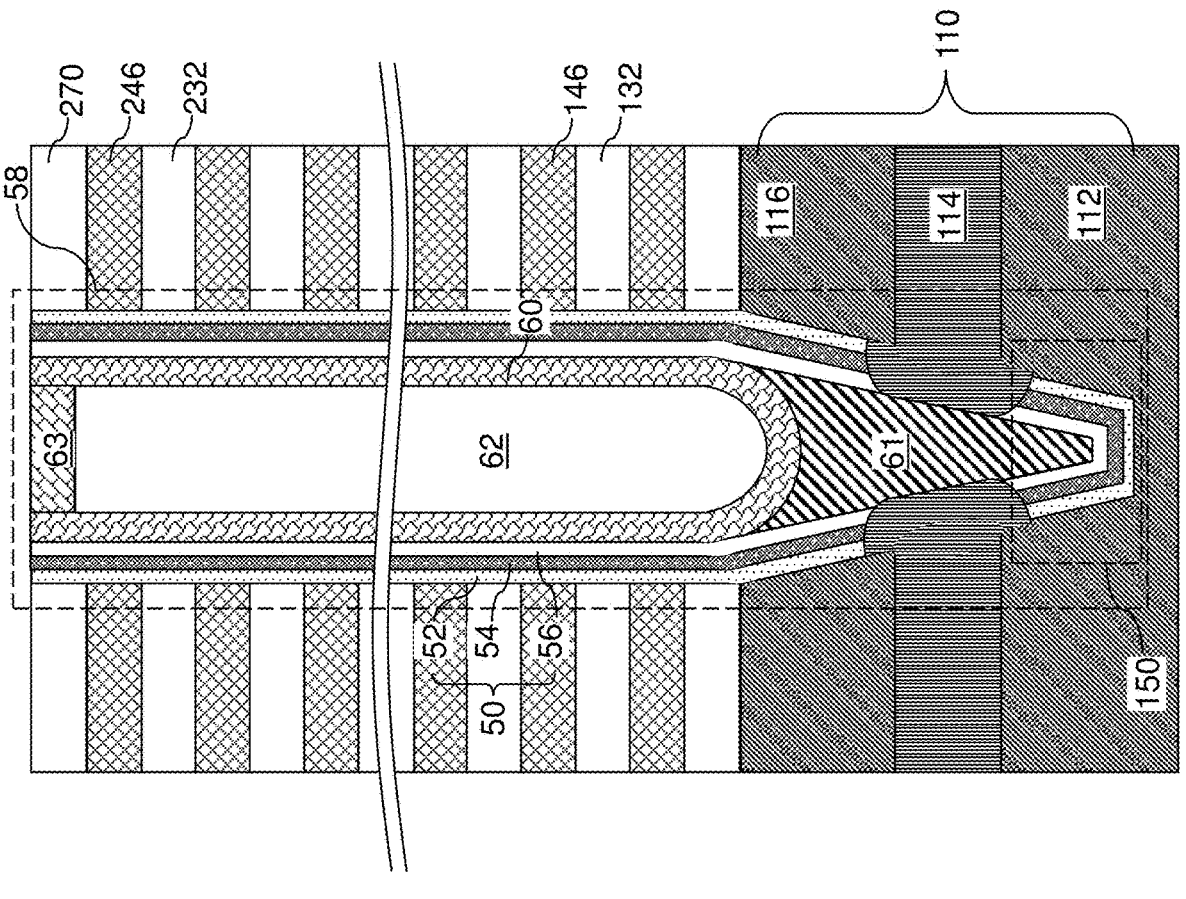
Figure 25B:
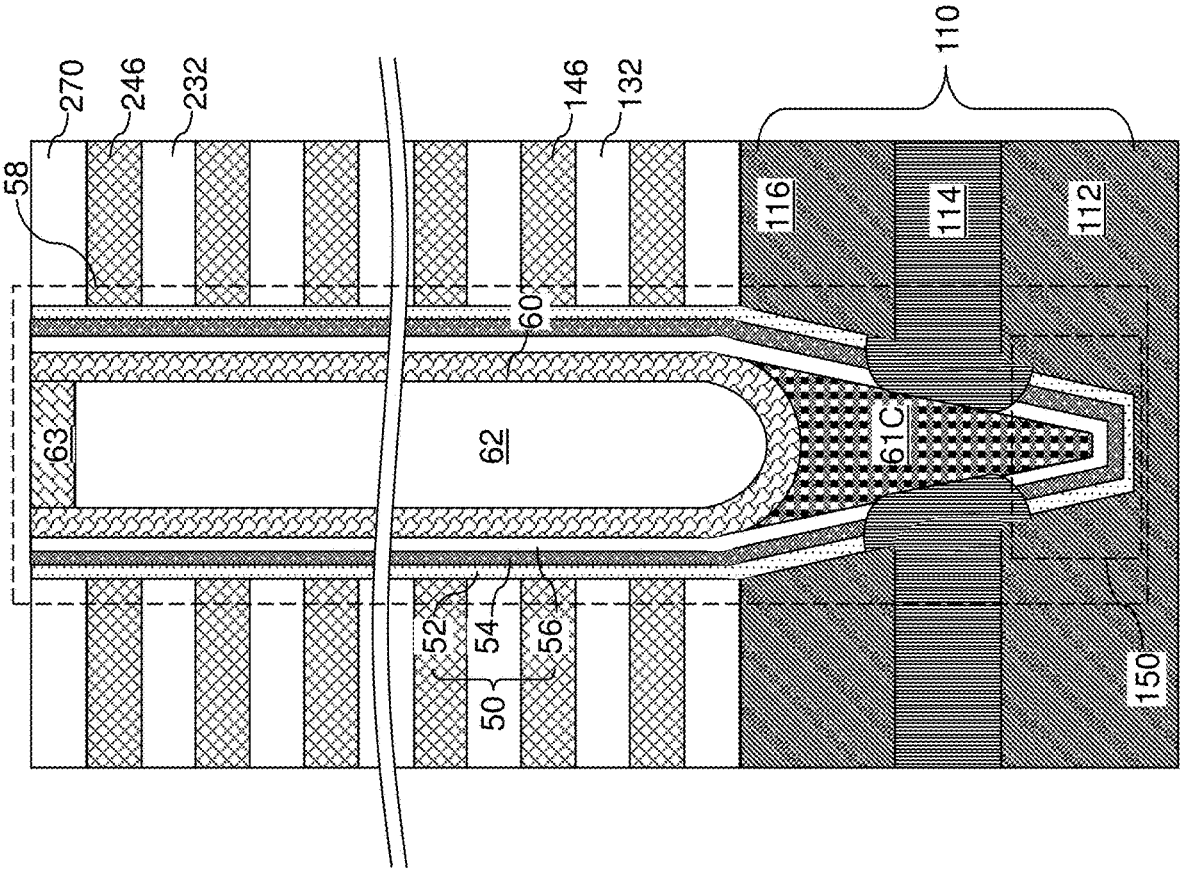
Figure 25C:
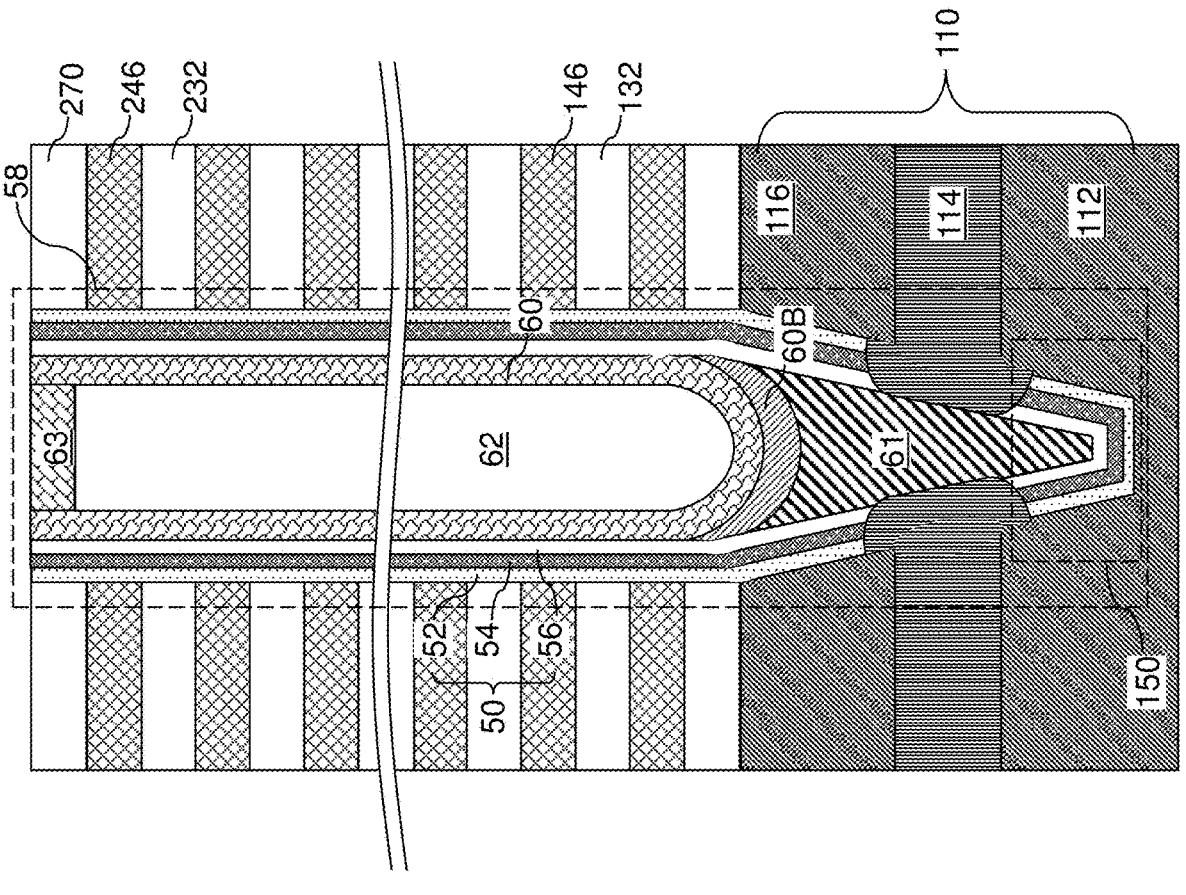
Figure 25D:
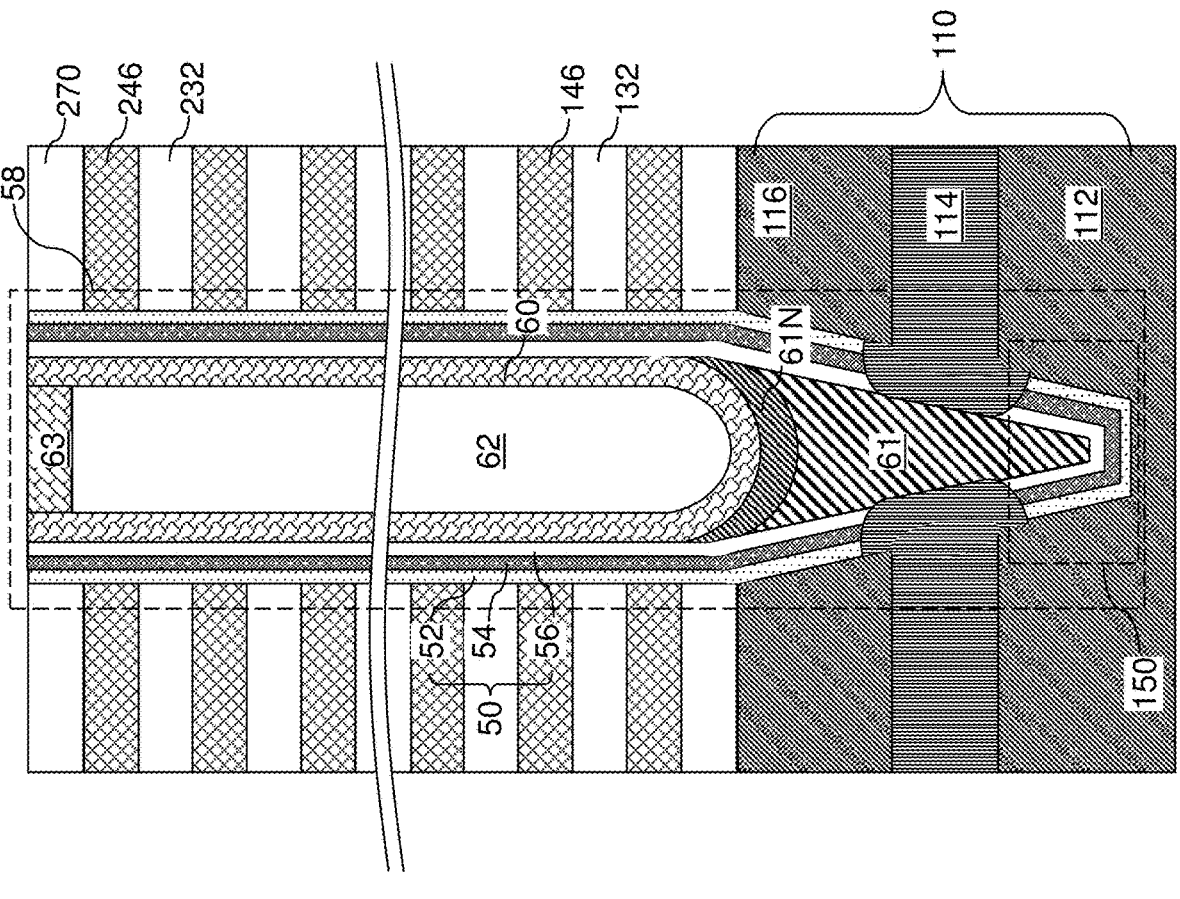
Figure 25E:
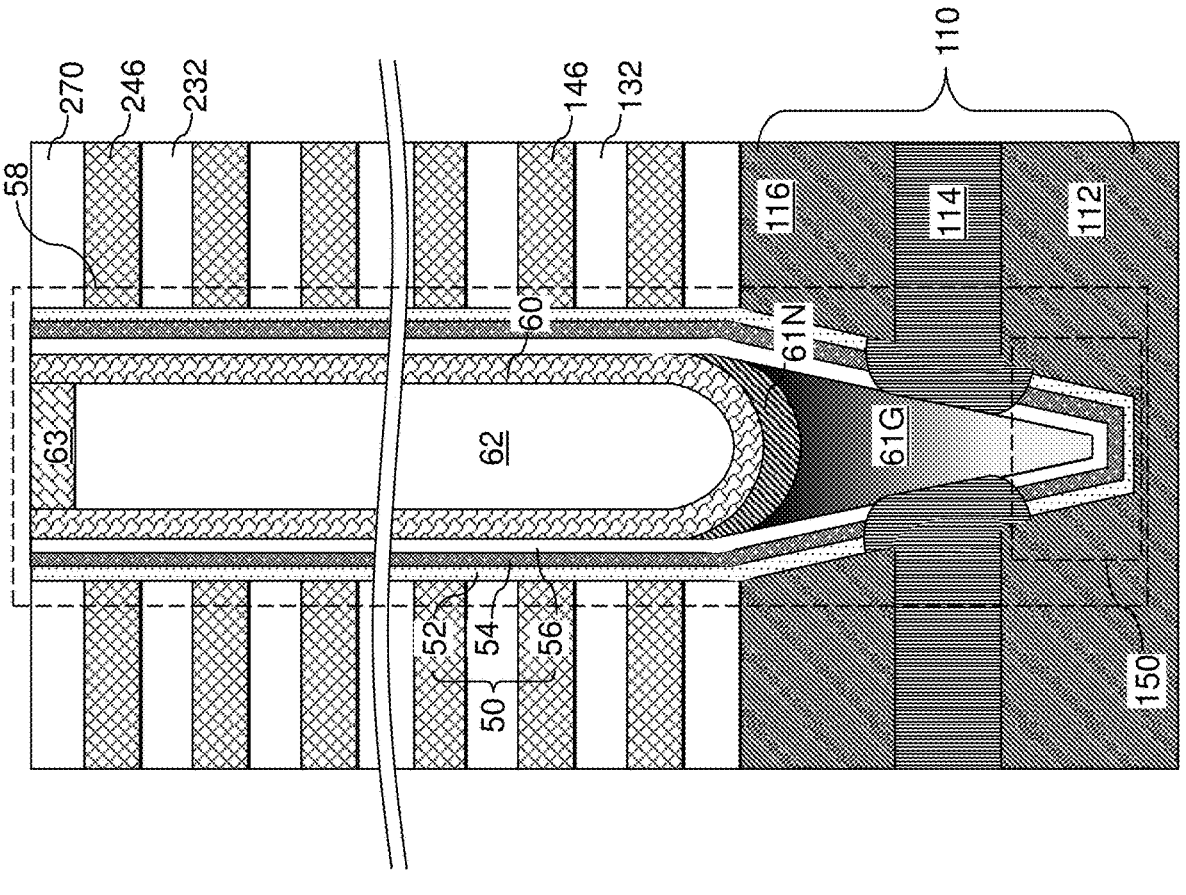
Figure 25F:
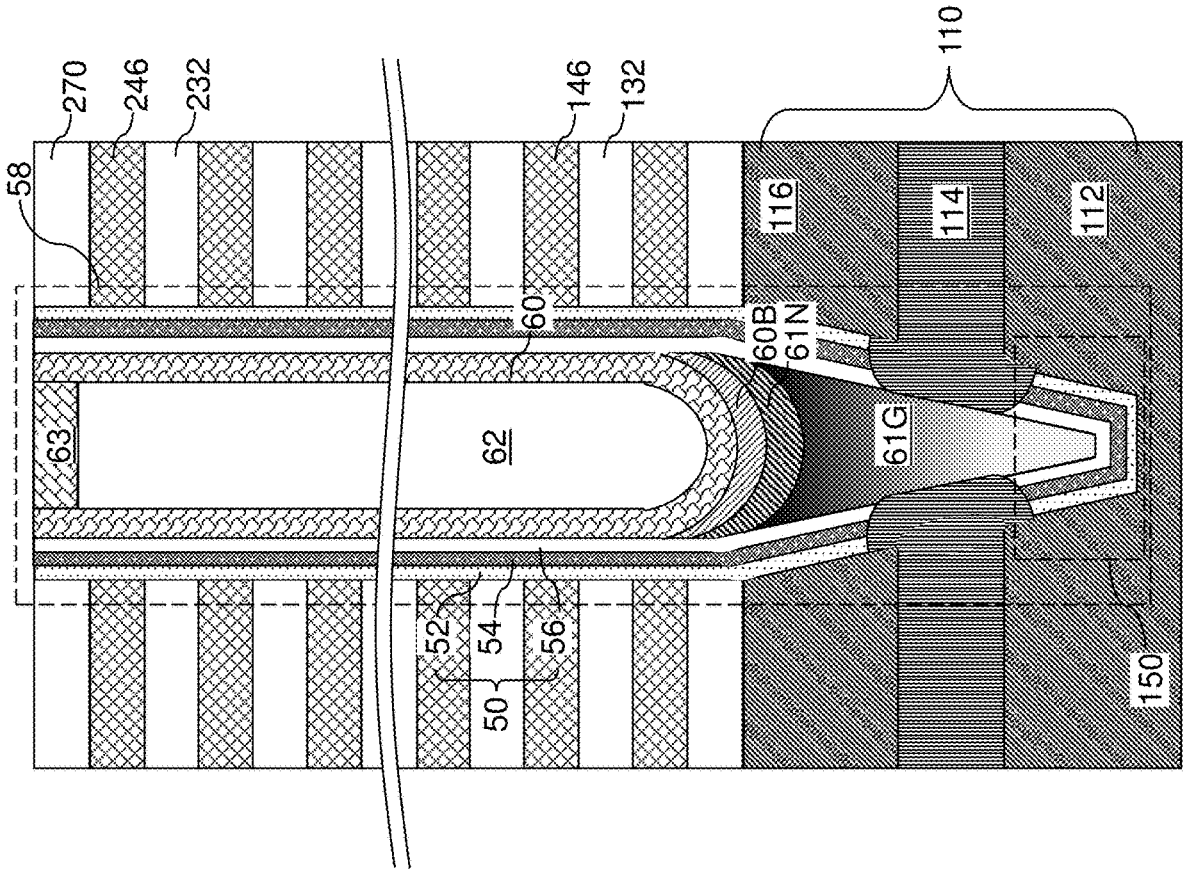
Figure 25G:
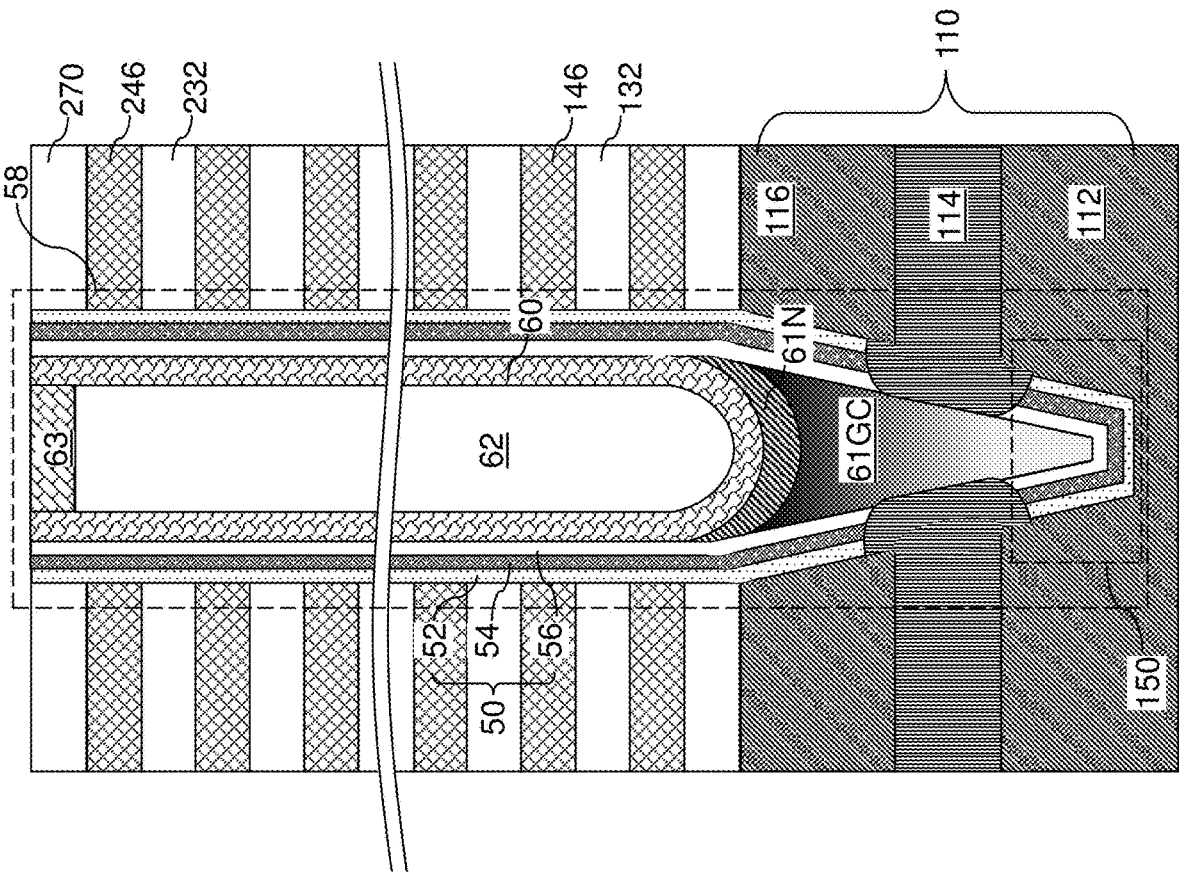

Specifically, FIG. 25A illustrates a memory opening fill structure 58 in the first configuration. FIG. 25B illustrates a memory opening fill structure 58 in the second configuration. FIG. 25C illustrates a memory opening fill structure 58 in the third configuration. FIG. 25D illustrates a memory opening fill structure 58 in the fourth configuration. FIG. 25E illustrates a memory opening fill structure 58 in the fifth configuration. FIG. 25F illustrates a memory opening fill structure 58 in the sixth configuration. FIG. 25G illustrates a memory opening fill structure 58 in the seventh configuration.

In the fifth, sixth, and the seventh exemplary structure in which the conical source pedestal (61U or 61UC) is formed as an undoped or only carbon doped structure, a doped semiconductor material portion having a doping of the second conductivity type (such as the second-conductivity-type doped semiconductor material portion 61N) can be formed directly on the top surface of the conical source pedestal (61U or 61UC). A fraction of dopants of the second conductivity type in the doped semiconductor material portion (such as the second-conductivity-type doped semiconductor material portion 61N) can be outdiffused into the conical source pedestal (61U or 61UC) during any of thermal processing steps having a peak temperature greater than 600 degrees Celsius (such as from 700 degrees Celsius to 1,050 degrees Celsius) between the processing steps of FIGS. 16A and 16B and the processing steps of FIG. 24. In this case, conical source pedestal (61U or 61UC) can be converted into a graded-doping conical source pedestal (61G or 61GC) in which dopants of the second conductivity type diffuse downward out of the second-conductivity-type doped semiconductor material portion 61N toward the lower source-level semiconductor layer 112. At least an upper portion of the graded-doping conical source pedestal (61G or 61GC) comprises a region in which the atomic concentration of dopants of the second conductivity type has a vertical gradient such that the atomic concentration of dopants of the second conductivity type decreases with a vertical distance from the second-conductivity-type doped semiconductor material portion 61N. The average atomic concentration of dopants of the second conductivity type in the graded-doping conical source pedestal (61G or 61GC) can be lower than the atomic concentration of dopants of the second conductivity type in the second-conductivity-type doped semiconductor material portion 61N.

Thus, in the embodiments shown in FIGS. 25D-25G, the second-conductivity-type doped semiconductor material portion 61N is integrated into the conical source pedestal and becomes the upper or middle portions of the conical source pedestal depending on the absence or presence of first-conductivity-type doped semiconductor material portion 60B. Likewise, in the embodiments shown in FIGS. 25C and 25F, the first-conductivity-type doped semiconductor material portion 60B is also is integrated into the conical source pedestal and becomes the upper portion of the conical source pedestal. Thus, the conical source pedestal with or without the portions 60B and/or 61A forms a doped interface structure located between the vertical semiconductor channel 60 and the source contact layer 114. The vertical semiconductor channel 60 comprises a vertical portion located over the sidewall(s) of the memory opening 49 and a bottom portion having a horizontal or convex bottom surface which contacts the conical source pedestal.

The doped interface structures (61N, 61, 61C, 61G, 61GC) comprise at least a portion comprising a doped semiconductor material of the second conductivity type which has the same conductivity type as the source contact layer 114 and opposite conductivity type than the vertical semiconductor channel 60. The doped interface structures provide a controlled doping of the dopants of the second conductivity type, such as phosphorus dopants in silicon. Thus, the height of the region doped with dopants of the second conductivity type can be more precisely controlled in the region between the source contact layer 114 and the vertical semiconductor channel 60. This improves the memory device reliability by avoiding or reducing the chance of cut-off failure and may provide an increased gate-induced-drain-leakage current to the memory device during an erase operation. In contrast, in prior art devices, the dopants of the second conductivity type diffuse from the source contact layer 114 upwards into the vertical semiconductor channel 60. This causes undesired variability in the height of the region doped with dopants of the second conductivity type below different vertical semiconductor channels, which leads to reduced device reliability.

Referring to all drawings and according to various embodiments of the present disclosure, a memory device is provided, which comprises: source-level material layers 110 located over a substrate 8 and comprising a lower source-level semiconductor layer 112 comprising a second conductivity type semiconductor material, an upper source-level semiconductor layer 116 comprising the second conductivity type semiconductor material, and a source contact layer 114 located between the upper and lower source-level semiconductor layers (112, 116) and comprising the second conductivity type semiconductor material; an alternating stack of insulating layers (132, 232) and electrically conductive layers (146, 246) located over the source-level material layers 110; a memory opening 49 vertically extending through the alternating stack, the upper source-level semiconductor layer 116, and the source contact layer 114 and into an upper portion of the lower source-level semiconductor layer 112; and a memory opening fill structure 58 located in the memory opening 49 and comprising a vertical semiconductor channel 60 comprising an intrinsic or first conductivity type semiconductor material; a memory film 50 surrounding the vertical semiconductor channel; and a conical source pedestal (61, 61C, 61G, 61GC) in contact with the source contact layer 114 and in contact with a bottom surface of the vertical semiconductor channel 60, wherein at least portion of the conical source pedestal comprises the second conductivity type semiconductor material.

In one embodiment, the conical source pedestal contacts an inner sidewall of the memory film 50, and the source contact layer 114 contacts the conical source pedestal through an opening in the memory film 50.

In one embodiment, the memory film 50 contacts the upper source-level semiconductor layer 116 at a tapered annular interface having a variable lateral extent that increases with a vertical distance from the substrate 8.

In one embodiment, the conical source pedestal (61, 61C, 61G, 61GC) comprises a concave top surface having a periphery that adjoined an inner sidewall of the memory film 50.

In one embodiment, a bottommost portion of the concave top surface of the conical source pedestal (61, 61C, 61G, 61GC) is located between a first horizontal plane including a bottom surface of the upper source-level semiconductor layer 116 and a second horizontal plane including a top surface of the upper source-level semiconductor layer 116.

In one embodiment, the memory opening fill structure 58 further comprises a bottom capping structure 150 including a layer stack containing a same set of component material layers as the memory film 50, and vertically spaced from the memory film 50 by the source contact layer 114.

In one embodiment, the memory film 50 comprises an annular concave tapered bottom surface that contacts an annular convex surface segment of the source contact layer 114.

In one embodiment, the conical source pedestal (61, 61C, 61G, 61GC) has a tapered sidewall surface having a variable lateral width that increases with a vertical distance from the substrate 8; an upper portion of the tapered sidewall surface contacts a bottom portion of an inner sidewall of the memory film 50; and a middle portion of the tapered sidewall surface contacts the source contact layer 114.

In some embodiments shown in FIGS. 25A and 25B, the conical source pedestal (61, 61C) consists essentially of the semiconductor material of the second conductivity type having a uniform doping concentration of dopants of the second conductivity type and is in direct contact with the bottom surface of the vertical semiconductor channel 60.

In some embodiments shown in FIGS. 25B and 25G, the conical source pedestal (61C, 61GC) is doped with carbon at an atomic concentration in a range from $1.0 \times 10^{16}/cm^3$ to $1.0 \times 10^{21}/cm^3$.

In one embodiment shown in FIG. 25E, an upper portion of the conical source pedestal which contacts the bottom surface of the vertical semiconductor channel 60 comprises the semiconductor material of the first conductivity type 60B; a middle portion of the conical source pedestal located below the upper portion of the source pedestal comprises the semiconductor material of the second conductivity type 61N; and a lower portion of the conical source pedestal 61G located below the middle portion of the source pedestal comprises the semiconductor material of the second conductivity type which has a lower concentration of dopants of the second conductivity type than the middle portion of the conical source pedestal.

In some embodiments shown in FIGS. 25D-25G, an upper portion of the conical source pedestal which contacts the bottom surface of the vertical semiconductor channel 60 comprises the semiconductor material of the second conductivity type 61N; and lower portion of the conical source pedestal (61, 61G) located below the upper portion of the source pedestal comprises the semiconductor material of the second conductivity type which has a lower concentration of dopants of the second conductivity type than the upper portion of the conical source pedestal.

In some embodiments, shown in FIGS. 25E-25G, an atomic concentration of the dopants of the second conductivity type in a lower portion of the conical source pedestal (61G, 61GC) increases with a vertical distance from the substrate 8.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   source-level material layers located over a substrate and comprising a lower source-level semiconductor layer comprising a second conductivity type semiconductor material, an upper source-level semiconductor layer comprising the second conductivity type semiconductor material, and a source contact layer located between the upper and lower source-level semiconductor layers and comprising the second conductivity type semiconductor material;
   an alternating stack of insulating layers and electrically conductive layers located over the source-level material layers;
   a memory opening vertically extending through the alternating stack, the upper source-level semiconductor layer, and the source contact layer and into an upper portion of the lower source-level semiconductor layer; and
   a memory opening fill structure located in the memory opening and comprising:
      a vertical semiconductor channel comprising an intrinsic or first conductivity type semiconductor material;
      a memory film surrounding the vertical semiconductor channel; and
      a conical source pedestal in contact with the source contact layer and in contact with a bottom surface of the vertical semiconductor channel, wherein at least portion of the conical source pedestal comprises the second conductivity type semiconductor material.

2. The memory device of claim 1, wherein the conical source pedestal contacts an inner sidewall of the memory film, and the source contact layer contacts the conical source pedestal through an opening in the memory film.

3. The memory device of claim 1, wherein the memory film contacts the upper source-level semiconductor layer at a tapered annular interface having a variable lateral extent that increases with a vertical distance from the substrate.

4. The memory device of claim 1, wherein the conical source pedestal comprises a concave top surface having a periphery that adjoined an inner sidewall of the memory film.

5. The memory device of claim 4, wherein a bottommost portion of the concave top surface of the conical source pedestal is located between a first horizontal plane including a bottom surface of the upper source-level semiconductor layer and a second horizontal plane including a top surface of the upper source-level semiconductor layer.

6. The memory device of claim 1, wherein the memory opening fill structure further comprises a bottom capping structure including a layer stack containing a same set of component material layers as the memory film, and vertically spaced from the memory film by the source contact layer.

7. The memory device of claim 1, wherein the memory film comprises an annular concave tapered bottom surface that contacts an annular convex surface segment of the source contact layer.

8. The memory device of claim 1, wherein:
   the conical source pedestal has a tapered sidewall surface having a variable lateral width that increases with a vertical distance from the substrate;
   an upper portion of the tapered sidewall surface contacts a bottom portion of an inner sidewall of the memory film; and
   a middle portion of the tapered sidewall surface contacts the source contact layer.

9. The memory device of claim 1, wherein the conical source pedestal consists essentially of the semiconductor material of the second conductivity type having a uniform doping concentration of dopants of the second conductivity type in direct contact with the bottom surface of the vertical semiconductor channel.

10. The memory device of claim 1, wherein the conical source pedestal is doped with carbon at an atomic concentration in a range from $1.0 \times 10^{16}/cm^3$ to $1.0 \times 10^{21}/cm^3$.

11. The memory device of claim 1, wherein:
   an upper portion of the conical source pedestal which contacts the bottom surface of the vertical semiconductor channel comprises the semiconductor material of the first conductivity type;
   a middle portion of the conical source pedestal located below the upper portion of the source pedestal comprises the semiconductor material of the second conductivity type; and
   a lower portion of the conical source pedestal located below the middle portion of the source pedestal comprises the semiconductor material of the second conductivity type which has a lower concentration of dopants of the second conductivity type than the middle portion of the conical source pedestal.

12. The memory device of claim 1, wherein:
   an upper portion of the conical source pedestal which contacts the bottom surface of the vertical semiconductor channel comprises the semiconductor material of the second conductivity type; and
   lower portion of the conical source pedestal located below the upper portion of the source pedestal comprises the semiconductor material of the second conductivity type which has a lower concentration of dopants of the second conductivity type than the upper portion of the conical source pedestal.

13. The memory device of claim 12, wherein an atomic concentration of the dopants of the second conductivity type in the lower portion of the conical source pedestal increases with a vertical distance from the substrate.

14. A method of forming a memory device, comprising:

forming in-process source-level material layers located over a substrate, the in-process source-level material layers comprising a lower source-level semiconductor layer comprising a second conductivity type semiconductor material, an upper source-level semiconductor layer comprising the second conductivity type semiconductor material, and a source-level sacrificial layer;

forming an alternating stack of insulating layers and spacer material layers over the in-process source-level material layers, wherein the spacer material layers are formed as, or are subsequently replaced with, electrically conductive layers;

forming a memory opening vertically extending through the alternating stack, the upper source-level semiconductor layer, and the source-level sacrificial layer and into an upper portion of the lower source-level semiconductor layer;

forming a memory opening fill structure in the memory opening, wherein the memory opening fill structure comprises a vertical semiconductor channel comprising an intrinsic or first conductivity type semiconductor material, a memory film surrounding the vertical semiconductor channel, and a conical source pedestal in contact with the source-level sacrificial layer and in contact with a bottom surface of the vertical semiconductor channel, wherein at least portion of the conical source pedestal comprises the second conductivity type semiconductor material; and replacing the source-level sacrificial layer and a portion of the memory film with a source contact layer comprising the second conductivity type semiconductor material such that the source contact layer contacts the conical source pedestal.

15. The method of claim 14, wherein:

the memory opening comprises a tapered bottom portion having a variable lateral extent that increases with a vertical distance from the substrate; and the conical source pedestal is formed by:

conformally depositing a semiconductor material layer on an inner sidewall of the memory film; and isotropically recessing the semiconductor material layer such that an upper portion of the inner sidewall of the memory film is physically exposed, wherein a remaining portion of the semiconductor material layer located at a bottom portion of the memory opening and contacting a lower portion of the inner sidewall of the memory film comprises the conical source pedestal.

16. The method of claim 15, wherein the semiconductor material layer has the second conductivity type, and the entire conical source pedestal comprises the second conductivity type semiconductor material upon formation of the conical source pedestal.

17. The method of claim 16, further comprising conformally depositing a second conductivity semiconductor material layer on the recessed semiconductor material layer.

18. The method of claim 17, wherein:

the semiconductor material layer is undoped; and the dopants of the second conductivity type diffuse out of the second conductivity semiconductor material layer into the recessed semiconductor material layer.

19. The method of claim 14, further comprising conformally depositing a first conductivity semiconductor material layer on the recessed semiconductor material layer.

20. The method of claim 14, wherein the conical source pedestal is doped with carbon at an atomic concentration in a range from $1.0 \times 10^{16}/cm^3$ to $1.0 \times 10^{21}/cm^3$.

* * * * *